(12) United States Patent
Hanada

(10) Patent No.: US 12,322,683 B2
(45) Date of Patent: Jun. 3, 2025

(54) POWER MODULE SEMICONDUCTOR DEVICE AND INVERTER EQUIPMENT, AND FABRICATION METHOD OF THE POWER MODULE SEMICONDUCTOR DEVICE, AND METALLIC MOLD

(71) Applicant: ROHM CO., LTD., Kyoto (JP)

(72) Inventor: Toshio Hanada, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 18/622,153

(22) Filed: Mar. 29, 2024

(65) Prior Publication Data
US 2024/0282675 A1 Aug. 22, 2024

Related U.S. Application Data

(63) Continuation of application No. 18/491,223, filed on Oct. 20, 2023, now Pat. No. 11,973,007, which is a
(Continued)

(30) Foreign Application Priority Data

Sep. 20, 2012 (JP) .................. 2012-206947
Sep. 20, 2012 (JP) .................. 2012-207194

(51) Int. Cl.
*H01L 23/482* (2006.01)
*H01L 21/50* (2006.01)
(Continued)

(52) U.S. Cl.
CPC ............ *H01L 23/482* (2013.01); *H01L 21/50* (2013.01); *H01L 21/565* (2013.01);
(Continued)

(58) Field of Classification Search
CPC ............... H01L 23/482; H01L 23/3735; H01L 23/49811; H01L 23/49844; H01L 23/538;
(Continued)

(56) References Cited

U.S. PATENT DOCUMENTS 4,885,629 A 12/1989 Takagi
5,408,141 A 4/1995 Devore et al.
(Continued)

FOREIGN PATENT DOCUMENTS

EP 1 028 520 A1 8/2000
JP H10116962 5/1998
(Continued)

OTHER PUBLICATIONS

Supplementary Partial European Search Report, Mar. 17, 2016, European Patent Application 13839748.4 (6 pages).
(Continued)

*Primary Examiner* — Peniel M Gumedzoe
(74) *Attorney, Agent, or Firm* — HSML P.C.

(57) ABSTRACT

The power module semiconductor device (2) includes: an insulating substrate (10); a first pattern (10a) (D) disposed on the insulating substrate (10); a semiconductor chip (Q) disposed on the first pattern; a power terminal (ST, DT) and a signal terminal (CS, G, SS) electrically connected to the semiconductor chip; and a resin layer (12) configured to cover the semiconductor chip and the insulating substrate. The signal terminal is disposed so as to be extended in a vertical direction with respect to a main surface of the insulating substrate.

20 Claims, 75 Drawing Sheets

Related U.S. Application Data continuation of application No. 18/052,456, filed on Nov. 3, 2022, now Pat. No. 11,967,543, which is a continuation of application No. 17/119,243, filed on Dec. 11, 2020, now Pat. No. 11,532,537, which is a continuation of application No. 16/256,744, filed on Jan. 24, 2019, now Pat. No. 10,896,866, which is a continuation of application No. 15/903,665, filed on Feb. 23, 2018, now abandoned, which is a continuation of application No. 14/663,135, filed on Mar. 19, 2015, now Pat. No. 9,960,103, which is a continuation of application No. PCT/JP2013/074895, filed on Sep. 13, 2013.

(51) Int. Cl.

| | | |
|---|---|---|
| *H01L 21/56* | (2006.01) | |
| *H01L 23/00* | (2006.01) | |
| *H01L 23/31* | (2006.01) | |
| *H01L 23/373* | (2006.01) | |
| *H01L 23/498* | (2006.01) | |
| *H01L 23/538* | (2006.01) | |
| *H01L 25/07* | (2006.01) | |
| *H01L 25/11* | (2006.01) | |
| *H01L 25/18* | (2023.01) | |
| *H02M 7/00* | (2006.01) | |

(52) U.S. Cl.
CPC .... *H01L 23/3735* (2013.01); *H01L 23/49811* (2013.01); *H01L 23/49844* (2013.01); *H01L 23/538* (2013.01); *H01L 25/07* (2013.01); *H01L 25/072* (2013.01); *H01L 25/115* (2013.01); *H01L 25/18* (2013.01); *H02M 7/003* (2013.01); *H01L 23/3107* (2013.01); *H01L 24/32* (2013.01); *H01L 24/33* (2013.01); *H01L 24/48* (2013.01); *H01L 24/49* (2013.01); *H01L 24/73* (2013.01); *H01L 2224/04042* (2013.01); *H01L 2224/32225* (2013.01); *H01L 2224/32245* (2013.01); *H01L 2224/33181* (2013.01); *H01L 2224/45015* (2013.01); *H01L 2224/48227* (2013.01); *H01L 2224/49113* (2013.01); *H01L 2224/73215* (2013.01); *H01L 2224/73265* (2013.01); *H01L 2224/92247* (2013.01); *H01L 2924/00012* (2013.01); *H01L 2924/00014* (2013.01); *H01L 2924/10272* (2013.01); *H01L 2924/12032* (2013.01); *H01L 2924/1305* (2013.01); *H01L 2924/13055* (2013.01); *H01L 2924/13091* (2013.01); *H01L 2924/181* (2013.01); *H01L 2924/19105* (2013.01); *H01L 2924/19107* (2013.01); *H01L 2924/207* (2013.01); *H01L 2924/30107* (2013.01)

(58) Field of Classification Search
CPC ... H01L 23/3107; H01L 25/07; H01L 25/072; H01L 25/18; H01L 25/115; H01L 24/32; H01L 24/33; H01L 24/48; H01L 24/49; H01L 24/73; H02M 7/003
See application file for complete search history.

(56) References Cited

U.S. PATENT DOCUMENTS

| | | | |
|---|---|---|---|
| 5,430,326 | A | 7/1995 | Miyashita |
| 5,532,512 | A | 7/1996 | Fillion et al. |
| 5,544,412 | A | 8/1996 | Romero et al. |
| 5,721,455 | A | 2/1998 | Takashita |
| 5,825,085 | A * | 10/1998 | Masumoto ............ H01L 25/072 257/723 |
| 6,201,696 | B1 | 3/2001 | Shimizu et al. |
| 6,236,110 | B1 | 5/2001 | Muto et al. |
| 6,703,703 | B2 | 3/2004 | Grant |
| 6,867,484 | B2 | 3/2005 | Nakajima et al. |
| 6,992,383 | B2 | 1/2006 | Mamitsu et al. |
| 7,148,562 | B2 | 12/2006 | Yoshida et al. |
| 7,608,917 | B2 | 10/2009 | Kajiwara et al. |
| 7,973,405 | B2 | 7/2011 | Takahashi et al. |
| 2001/0033478 | A1 | 10/2001 | Ortiz et al. |
| 2005/0051874 | A1 | 3/2005 | Ushijima |
| 2005/0236639 | A1 | 10/2005 | Abe et al. |
| 2006/0119512 | A1 | 6/2006 | Yoshimatsu et al. |
| 2006/0151874 | A1 | 7/2006 | Milich et al. |
| 2006/0220213 | A1 | 10/2006 | Kondou et al. |
| 2007/0040186 | A1 | 2/2007 | Fillion et al. |
| 2007/0145540 | A1 | 6/2007 | Mochida |
| 2007/0267739 | A1 | 11/2007 | Kajiwara et al. |
| 2007/0290311 | A1 | 12/2007 | Hauenstein |
| 2008/0251903 | A1 | 10/2008 | Otremba et al. |
| 2008/0305582 | A1 | 12/2008 | Fillion et al. |
| 2009/0057929 | A1 | 3/2009 | Sasaki et al. |
| 2009/0140369 | A1 | 6/2009 | Lee |
| 2009/0206456 | A1 | 8/2009 | Guth et al. |
| 2009/0220794 | A1 | 9/2009 | O'Neill et al. |
| 2010/0013085 | A1 | 1/2010 | Oi et al. |
| 2010/0065950 | A1 | 3/2010 | Lowry et al. |
| 2010/0133667 | A1 | 6/2010 | Oka et al. |
| 2010/0134979 | A1* | 6/2010 | Obiraki ............... H01L 23/3735 361/822 |
| 2010/0148298 | A1 | 6/2010 | Takano et al. |
| 2011/0089558 | A1 | 4/2011 | Muto et al. |
| 2011/0272797 | A1 | 11/2011 | Onishi |
| 2011/0291106 | A1 | 12/2011 | Kikuchi |
| 2012/0127668 | A1 | 5/2012 | Yamamoto et al. |
| 2012/0228741 | A1 | 9/2012 | Araki et al. |
| 2012/0298009 | A1 | 11/2012 | Endoh et al. |
| 2012/0313252 | A1 | 12/2012 | Ueda et al. |
| 2014/0159054 | A1 | 6/2014 | Otake et al. |

FOREIGN PATENT DOCUMENTS

| | | |
|---|---|---|
| JP | 2000245170 | 9/2000 |
| JP | 2000353778 | 12/2000 |
| JP | 2001-284525 | 10/2001 |
| JP | 2003007966 | 1/2003 |
| JP | 2003324971 | 11/2003 |
| JP | 2004-107728 | 4/2004 |
| JP | 2004-311685 | 11/2004 |
| JP | 2005183463 | 7/2005 |
| JP | 2005235816 | 9/2005 |
| JP | 2005-286187 | 10/2005 |
| JP | 2007053379 | 3/2007 |
| JP | 2008243970 | 10/2008 |
| JP | 2010129795 | 6/2010 |
| JP | 2011035354 | 2/2011 |
| JP | 2011086889 | 4/2011 |
| JP | 2011253862 | 12/2011 |
| WO | 2012018073 | 2/2012 |
| WO | 2012/073570 | 6/2012 |

OTHER PUBLICATIONS

Official Action, Japanese Patent Application No. 2014-536839, Sep. 19, 2017, with machine translation (19 pages).
Office Action issued for Japanese Patent Application No. 2014-536839, dated Jan. 16, 2018, 6 pages including English translation.
Japanese Office Action issued in the counterpart Japanese Patent Application No. 2018-129917, mailed on Apr. 2, 2019, 12 pages, with English translation.
The extended European search report issued for European Patent Application No. 22212270.7, Aug. 10, 2023, 12 pages.
European Search Report received in the corresponding European Patent application, Jan. 31, 2024 (10 pages).
Search Report issued in corresponding European Patent application No. 24 168 274.9, Nov. 22, 2024 (13 pages).

(56) References Cited

OTHER PUBLICATIONS

Office Action received in corresponding European Patent application No. 23 205 616.8, Jan. 21, 2025 (10 pages).

\* cited by examiner

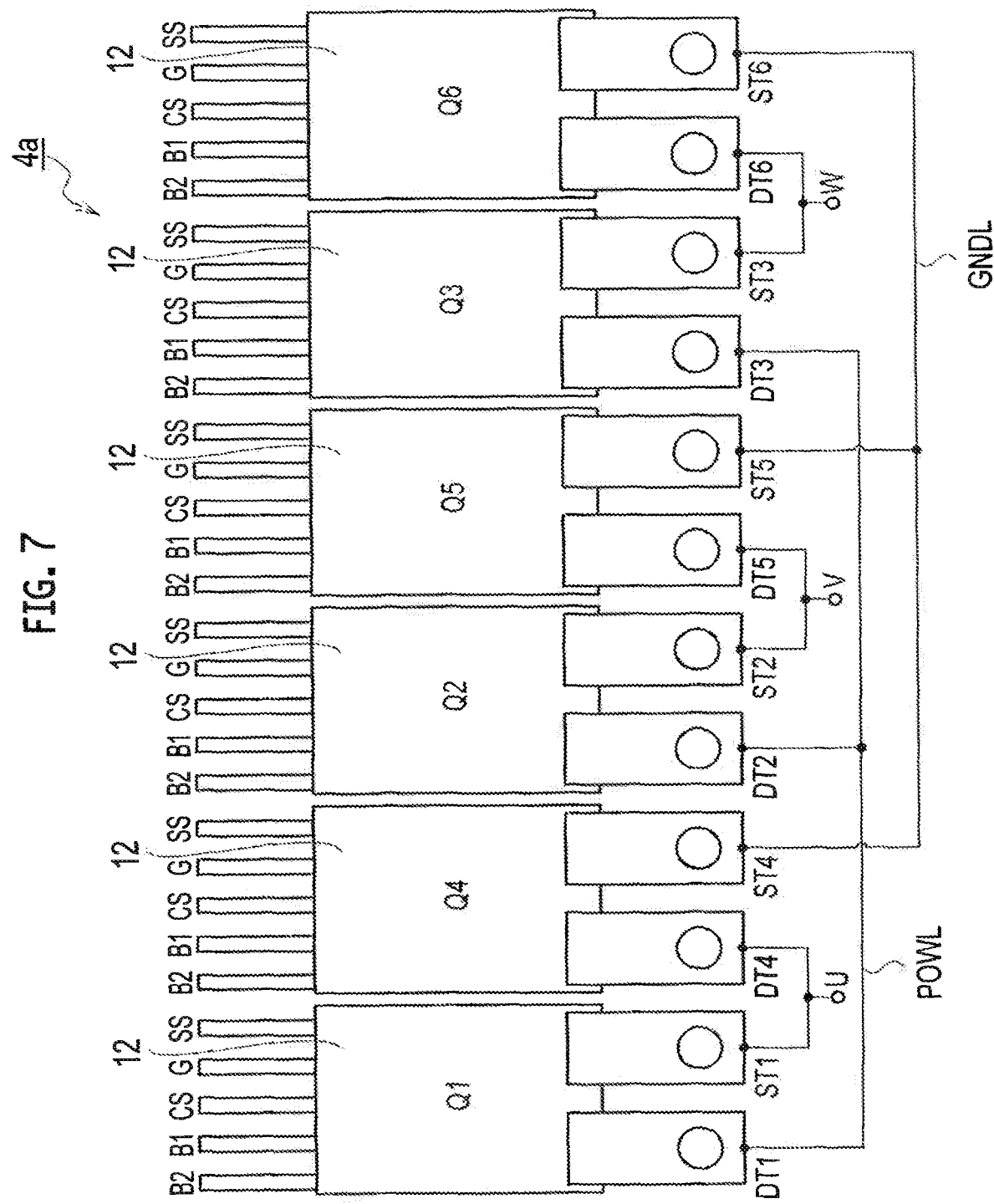

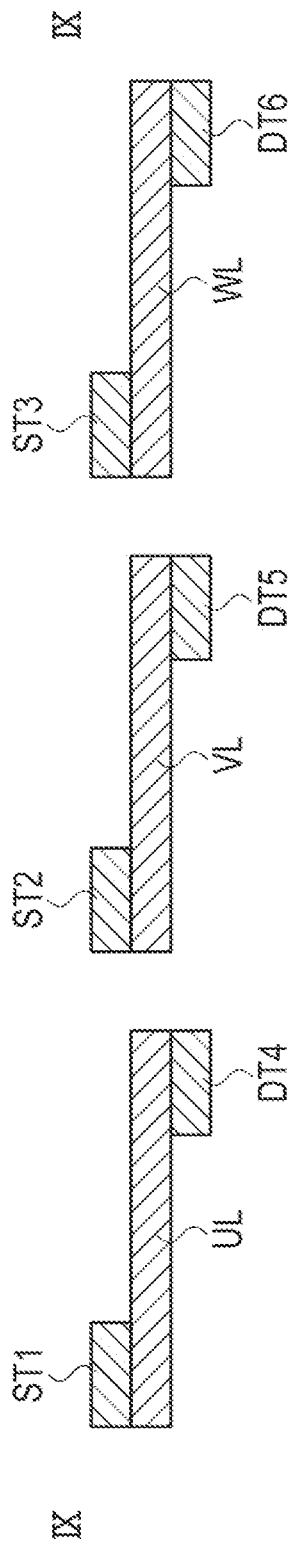
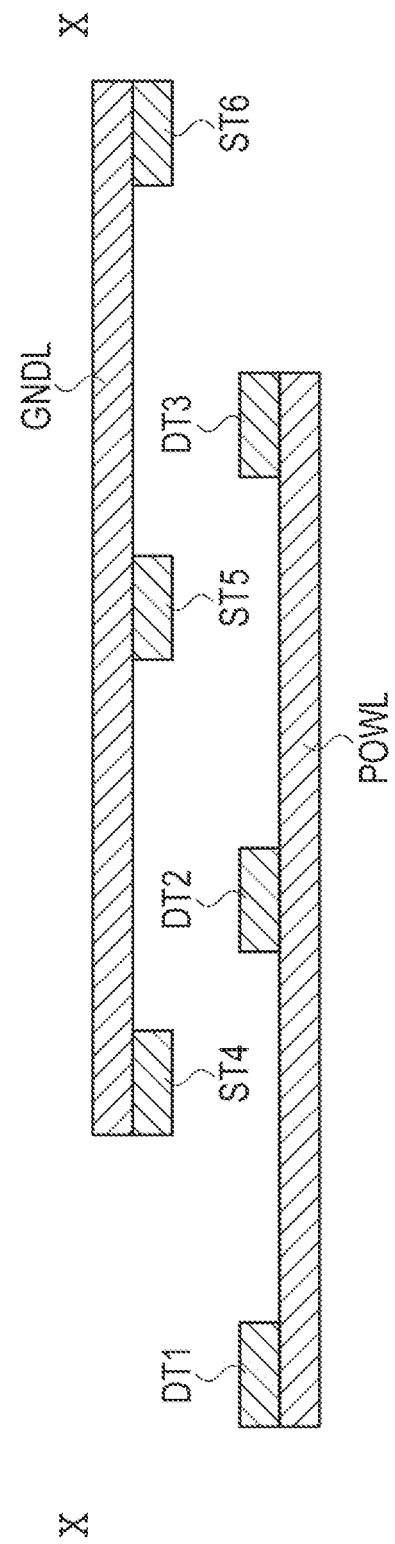

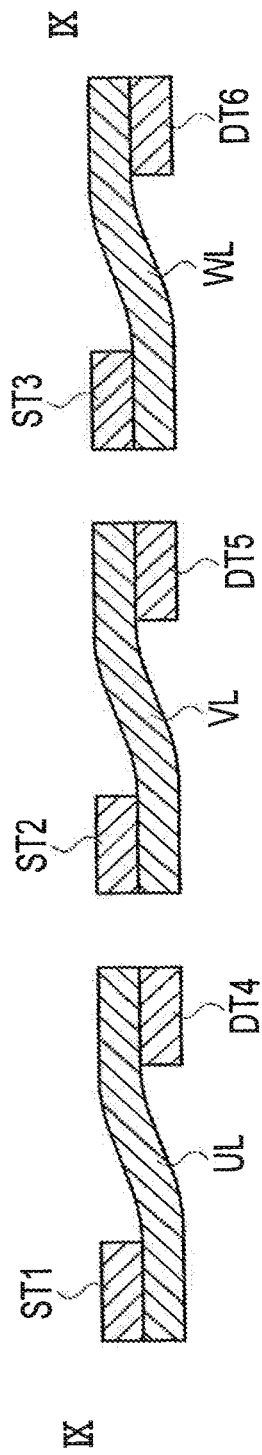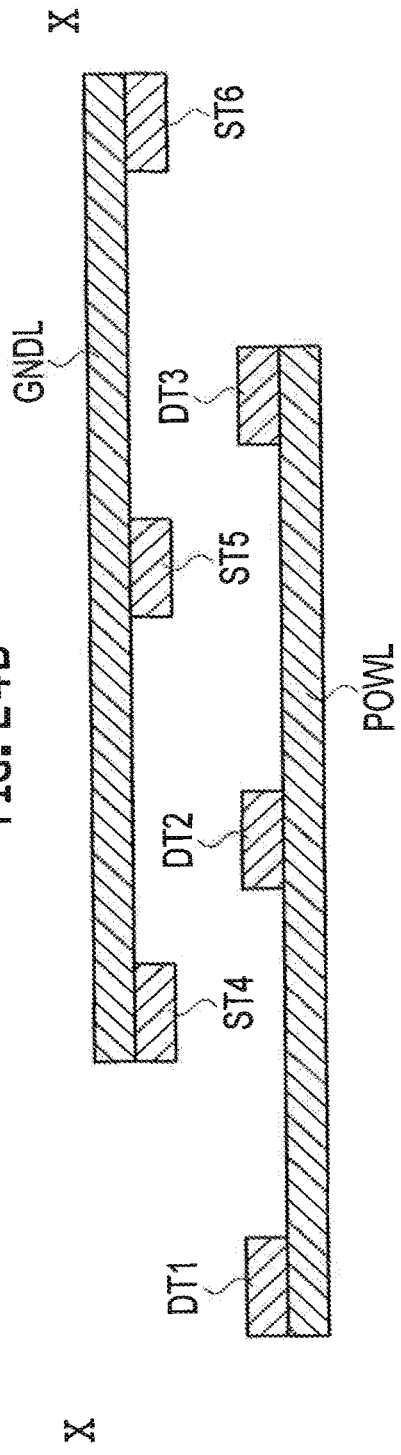
FIG. 24A
FIG. 24B

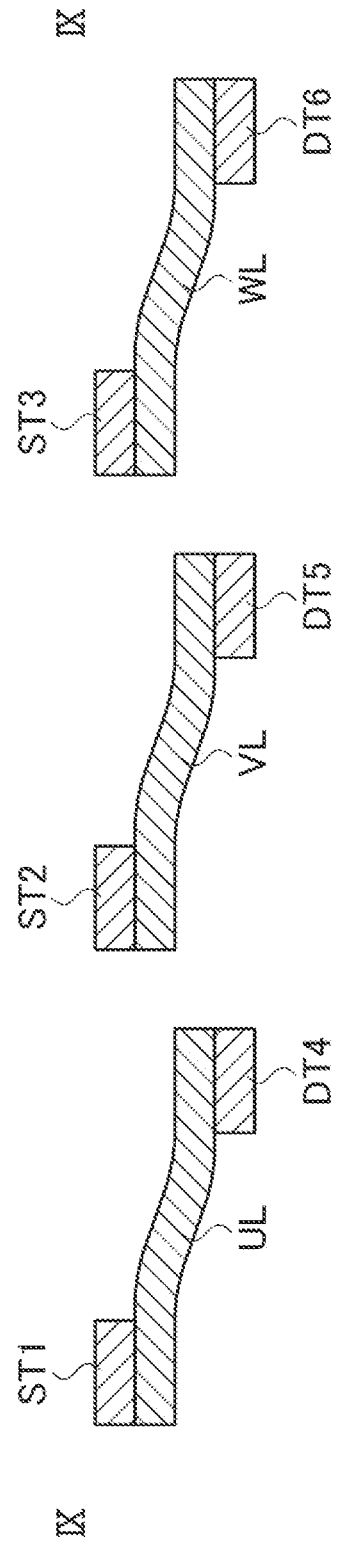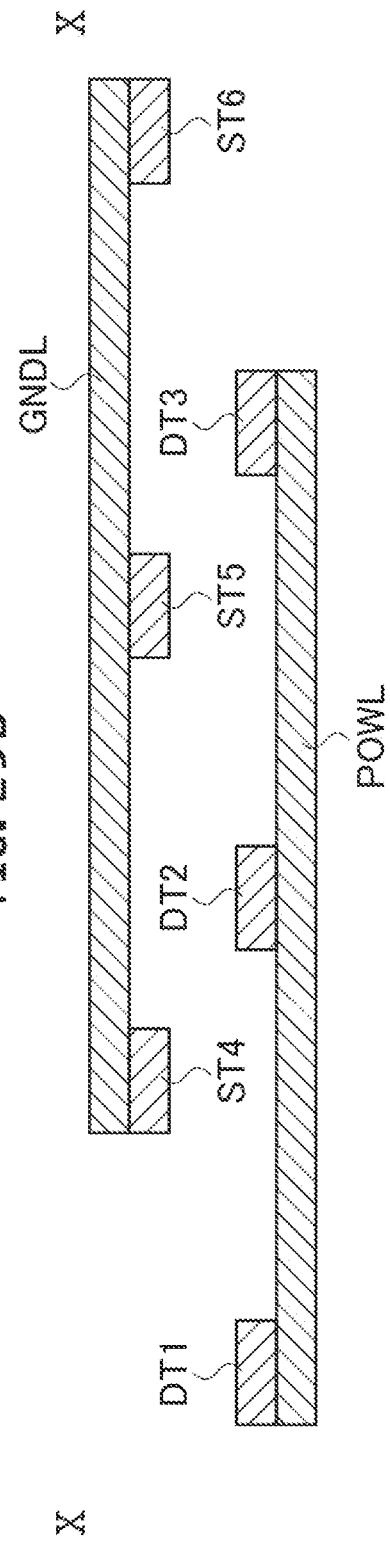

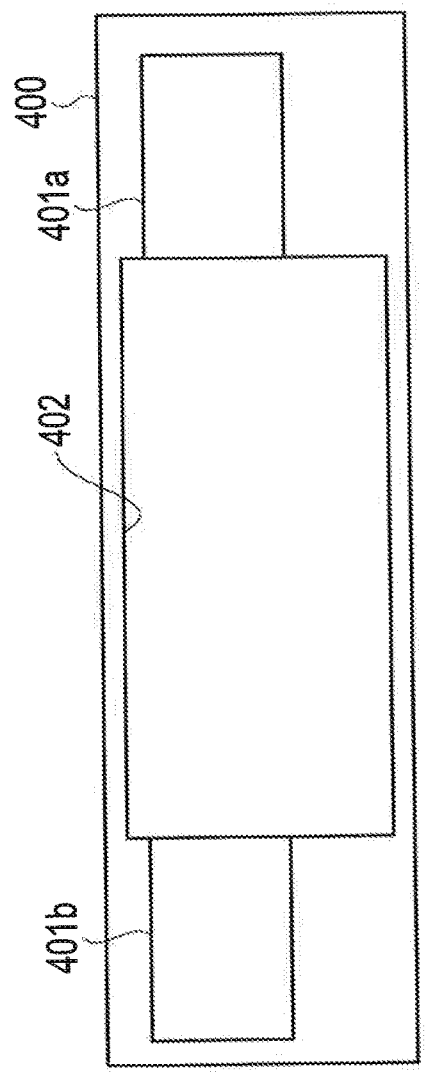
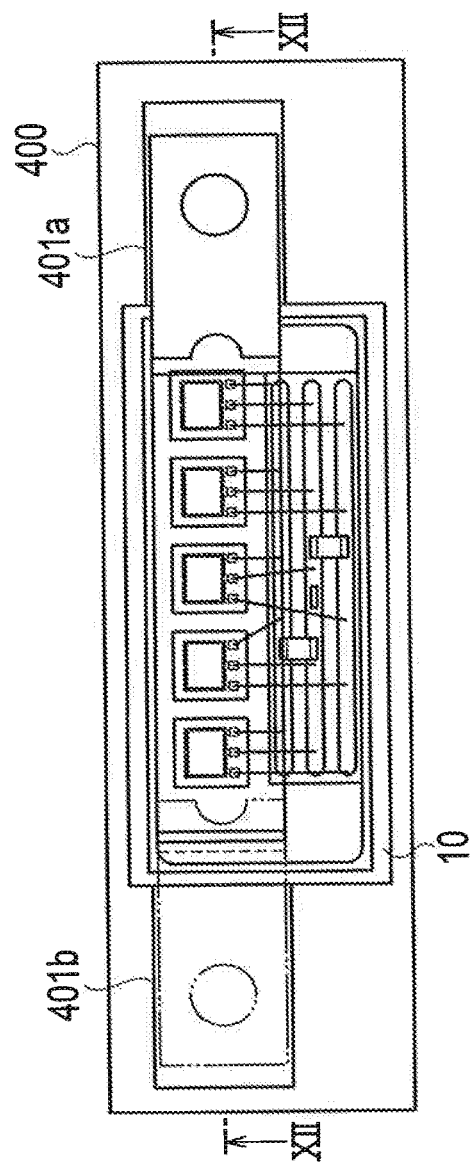

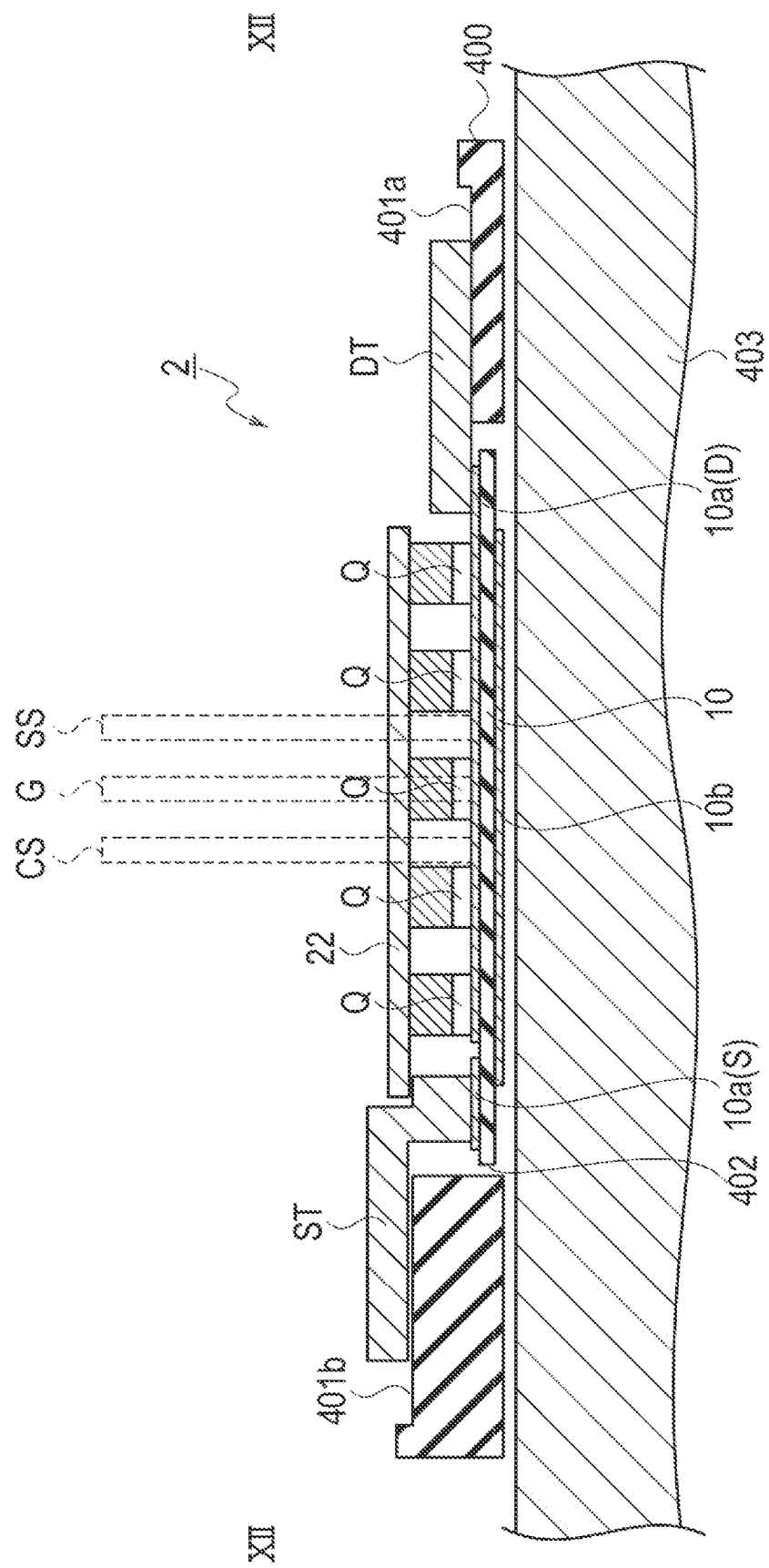

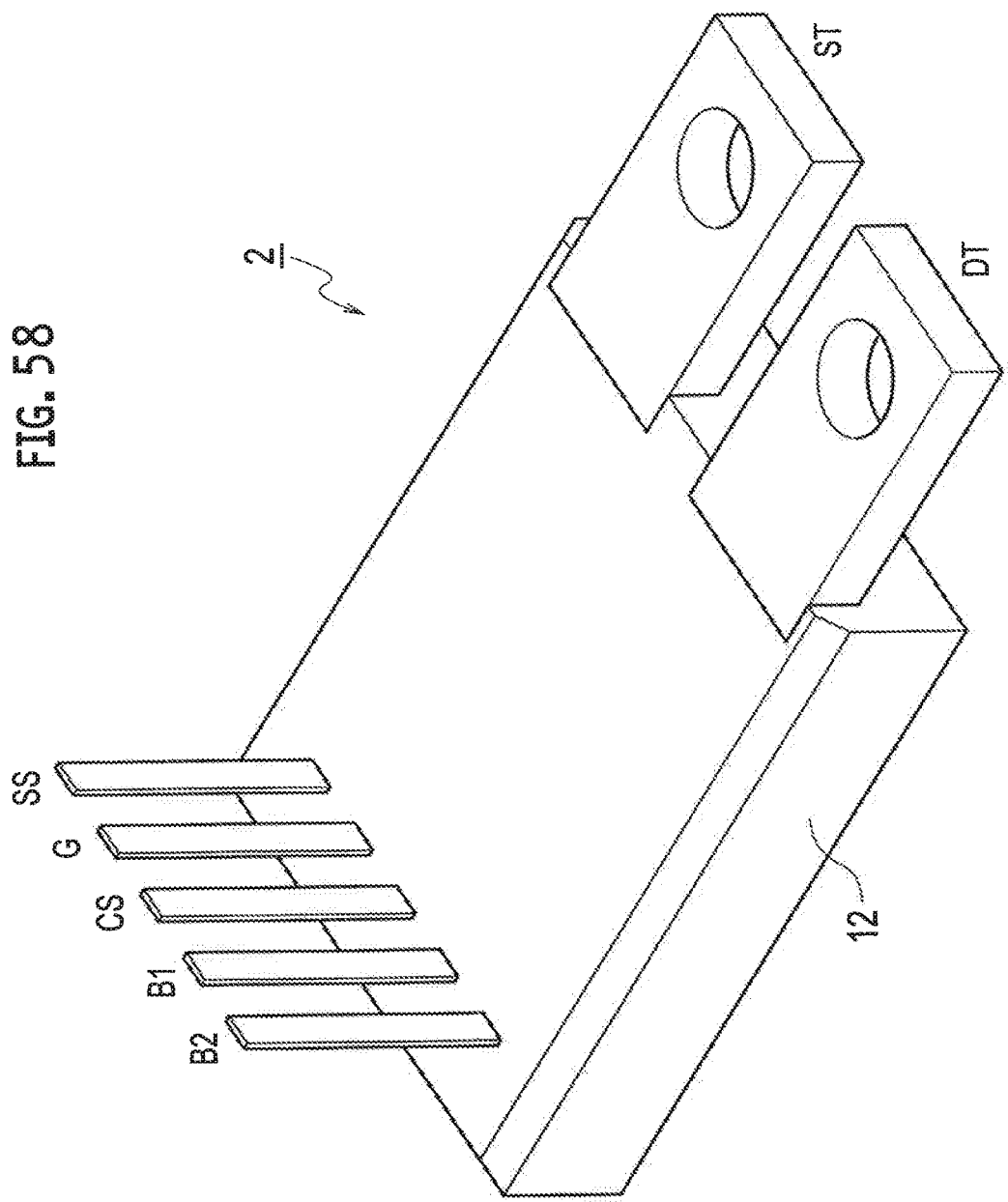

POWER MODULE SEMICONDUCTOR DEVICE AND INVERTER EQUIPMENT, AND FABRICATION METHOD OF THE POWER MODULE SEMICONDUCTOR DEVICE, AND METALLIC MOLD

CROSS REFERENCE TO RELATED APPLICATIONS

This application is a continuation application of U.S. application Ser. No. 18/491,223, filed Oct. 20, 2023, which is a continuation application of U.S. application Ser. No. 18/052,456, filed Nov. 3, 2022, which is a continuation application of U.S. application Ser. No. 17/119,243, filed Dec. 11, 2020, which is a continuation application of U.S. application Ser. No. 16/256,744, filed Jan. 24, 2019, which is a continuation application of U.S. application Ser. No. 15/903,665, filed Feb. 23, 2018, which is a continuation application of U.S. application Ser. No. 14/663,135, which is a continuation application of PCT Application No. PCT/JP2013/074895, filed on Sep. 13, 2013, which claims priority to Japan Patent Applications No. P2012-206947 filed on Sep. 20, 2012 and P2012-207194 filed on Sep. 20, 2012, the entire contents of each of which are incorporated herein by reference, including the original claims.

FIELD

The embodiments described herein relates to a power module semiconductor device and inverter equipment, and a fabrication method of the power module semiconductor device, and a metallic mold thereof. In particular, the embodiments relates to a power module semiconductor device having straight wiring structure, low-inductance inverter equipment, and a power module semiconductor device of a vertical terminal transfermold and a fabrication method thereof, and a metallic mold thereof.

BACKGROUND

Many research institutions are currently conducting research to develop Silicon Carbide (SiC) devices. Advantages of SiC power devices over Si power devices include low on resistance, high switching speed, high temperature operation, etc.

Conventional Si power devices, such as Insulated Gate Bipolar Transistors (IGBTs), are limited to about 150 degrees C. maximum operating temperature.

However, SiC based devices can theoretically operate to temperatures of 600 degrees C.

In conventional Si power modules, since losses produced by Si power devices are relatively larger, high power cannot be output due to a problem of heat generation. Since high thermal resistance of power modules can be tolerated in instead of inability to output high power, the thickness of power modules were increased in consideration of an influence of warpage, thereby reaching the limits of miniaturization of power modules.

SiC power modules can conduct a large electric current, and can be easily operated under high temperature conditions operation, since losses produced by Si power devices are relatively smaller. However, thin type power module design has been required for achieving such SiC power modules.

Case type packages is used as packages of the SiC power devices.

On the other hand, there is also disclosed a semiconductor device which is resin-sealed by transfermold technique.

Moreover, there is also disclosed a transfermold in which a press-fit vertical terminal is formed by integrally molding a socket and then presses fit a terminal therein.

SUMMARY

There are commonly used case type power modules in which signal terminals are disposed in a vertical direction with respect to a main unit of the power module.

On the other hand, in transfermold-structured modules where thin structure is realizable as compared with the case type power modules, a power terminal and a signal terminal are horizontally disposed with respect to an outer periphery of a mold. For this reason, restrictions occur in a creepage surface for securing an insulation between terminals and between a heat sink and the terminal. Moreover, when the modules are disposed in parallel, a distance between modules must be secured, thereby causing a space demerit.

Furthermore, in the case of vertically stacked structure in which a control substrate and passive components are mounted in a vertical direction on a module, it is necessary to perform post processes, e.g. a process for bending signal terminals in the vertical direction. Accordingly, the number of fabricating processes is increased and a break etc. may occur in a bending part of the signal terminal during the post processes, such as the bending process.

The embodiments described herein provide a power module semiconductor device having a vertical terminal transfermold in which structure thereof is simple and the number of parts is reduced, thereby achieving space saving, a fabrication method of such a power module semiconductor device, and a metallic mold thereof.

Moreover, embodiments provide a power module semiconductor device of which a power terminal has straight wiring structure, and low series inductance inverter equipment.

According to one aspect of the embodiments, there is provided a power module semiconductor device comprising: an insulating substrate; a first pattern of a copper plate layer disposed on the insulating substrate; a semiconductor chip disposed on the first pattern; a power terminal and a signal terminal electrically connected to the semiconductor chip; and a resin layer configured to cover the semiconductor chip and the insulating substrate, wherein the signal terminal is disposed so as to be extended in a vertical direction with respect to a main surface of the insulating substrate.

According to another aspect of the embodiments, there is provided a fabrication method of a power module semiconductor device, the method comprising: mounting the power module semiconductor device on a lower metallic mold, the lower metallic mold comprising a main unit mounting unit, a terminal mounting unit of a power terminal, and a fixing mechanism configured to fix a signal terminal thereto; fixing the signal terminal to the fixing mechanism; engaging the lower metallic mold with an upper metallic mold; injecting a resin to a space for resin injection formed between the lower metallic mold and the upper metallic mold; removing the upper metallic mold from the lower metallic mold; and removing the resin sealed power module semiconductor device.

According to still another aspect of the embodiments, there is provided a metallic mold comprising: a main unit mounting unit of a power module semiconductor device; a terminal mounting unit of the power terminal of the power module semiconductor device; a lower metallic mold comprising a fixing mechanism configured to fix the signal terminal of the power module semiconductor device; and an upper metallic mold engaged with the lower metallic mold.

According to still another aspect of the embodiments, there is provided a power module semiconductor device, wherein the power terminal is disposed so as to be extended and from mutually opposite side surfaces of the resin layer in mutually opposite directions, along a long-side direction of the resin layer, in parallel with a main surface of the resin layer, thereby forming straight wiring structure.

According to still another aspect of the embodiments, there is provided an inverter equipment comprising a plurality of power module semiconductor devices having straight wiring structure disposed in parallel, wherein power terminals of the respective power module semiconductor device are connected to each other with a bus bar electrode.

According to the embodiments, there can be provided a power module semiconductor device having a vertical terminal transfermold in which structure thereof is simple and the number of parts is reduced, thereby achieving space saving, a fabrication method of such a power module semiconductor device, and a metallic mold thereof.

Moreover, according to the embodiments, there can be provided a power module semiconductor device of which a power terminal has straight wiring structure, and low series inductance inverter equipment.

BRIEF DESCRIPTION OF DRAWINGS

FIG. 7 is a schematic plane configuration of the three-phase AC inverter equipment composed by disposing the six pieces of the power module semiconductor devices according to the comparative example, and a connection diagram between the respective terminals thereof.

FIG. 23A is a schematic cross-sectional structure diagram taken in the line IX-IX of FIG. 22.

FIG. 23B is a schematic cross-sectional structure diagram taken in the line X-X of FIG. 22.

FIG. 24A is another schematic cross-sectional structure diagram taken in the line IX-IX of FIG. 22.

FIG. 24B is another schematic cross-sectional structure diagram taken in the line X-X of FIG. 22.

FIG. 25A is still another schematic cross-sectional structure diagram taken in the line IX-IX of FIG. 22.

FIG. 25B is still another schematic cross-sectional structure diagram taken in the line X-X of FIG. 22.

FIG. 38A is a schematic plane configuration diagram of a carbon jig used for a soldering process between the power terminals ST, DT and the signal terminals CS, G, SS in a fabrication method of the power module semiconductor device according to the first embodiment.

FIG. 38B is a schematic plane configuration diagram showing an aspect of mounting the power module semiconductor device on the carbon jig to perform the soldering process between the power terminals ST, DT and the signal terminals CS, G, SS.

FIG. 39 is a schematic cross-sectional structure diagram taken in the cutting line XII-XII of FIG. 38B in a long-side direction of the carbon jig mounted on a hot plate, wherein the power module semiconductor device is mounted on the carbon jig.

FIG. 58 is a schematic bird's-eye view configuration diagram showing a 1-in-1 module, which is a power module semiconductor device according to a second embodiment.

DESCRIPTION OF EMBODIMENTS

Figure 1:
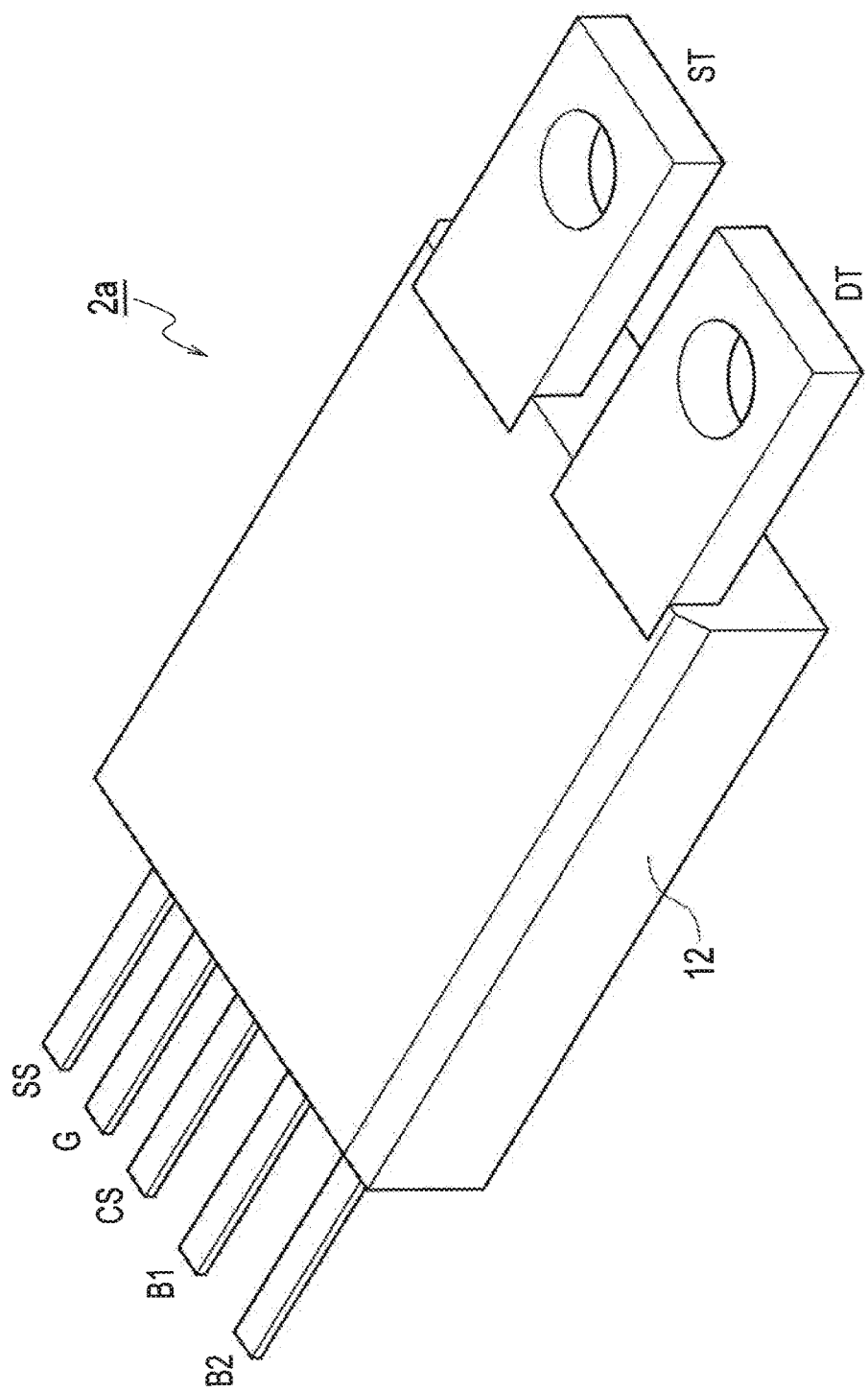
FIG. 1 is a schematic bird's-eye view configuration diagram showing a one-in-one (1-in-1 module), which is a power module semiconductor device according to a comparative example.

Next, the embodiments will be described with reference to drawings. In the description of the following drawings, the identical or similar reference numeral is attached to the identical or similar part. However, it should be noted that the drawings are schematic and therefore the relation between thickness and the plane size and the ratio of the thickness of each component part differs from an actual thing. Therefore, detailed thickness and size should be determined in consideration of the following explanation. Of course, the part from which the relation and ratio of a mutual size differ also in mutually drawings is included.

Moreover, the embodiments shown hereinafter exemplify the apparatus and method for materializing the technical idea; and the embodiments do not specify the material, shape, structure, placement, etc. of each component part as the following. The embodiments may be changed without departing from the spirit or scope of claims.

Comparative Example

A power module semiconductor device 2a according to a comparative example is provided with a configuration of a 1-in-1 module. More specifically, one MOSFETQ is included in one module. As an example, six chips (MOS transistor×6) can be mounted thereon, and a maximum of six pieces of the MOSFETs can be respectively connected to one another in parallel. Note that it is also possible to mount a part of six pieces of the chips for the diode DI.

As shown in FIG. 1, the power module semiconductor device 2a according to the comparative example includes: a drain terminal DT and a source terminal ST which are disposed on a first side of the ceramic substrate 10 covered with the resin layer 12; and signal terminals SS, G, CS, B1, B2 disposed on a side opposite to the first side. In this case, the signal terminals SS, G, CS correspond to the source sense terminal, the gate signal terminal, and the current sense terminal of the semiconductor chip Q, and the signal terminals B1, B2 correspond to the thermistor connecting terminal.

Figure 2:
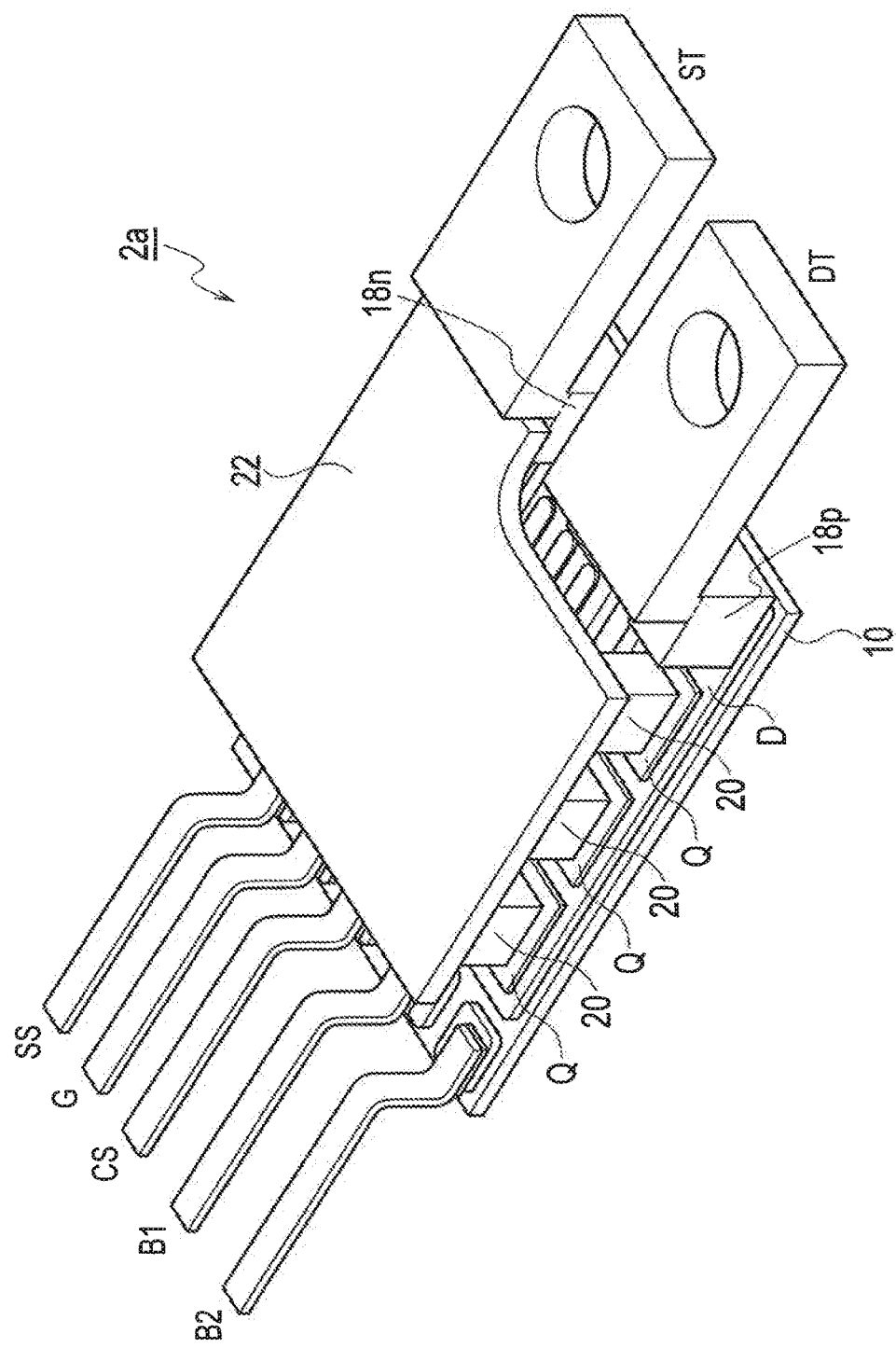
FIG. 2 is a schematic bird's-eye view configuration diagram showing a 1-in-1 module, before forming a resin layer thereon, which is the power module semiconductor device according to the comparative example.

Moreover, FIG. 2 illustrates a schematic bird's-eye view configuration of the power module semiconductor device 1 before forming a resin layer 12 thereon.

Figure 3:
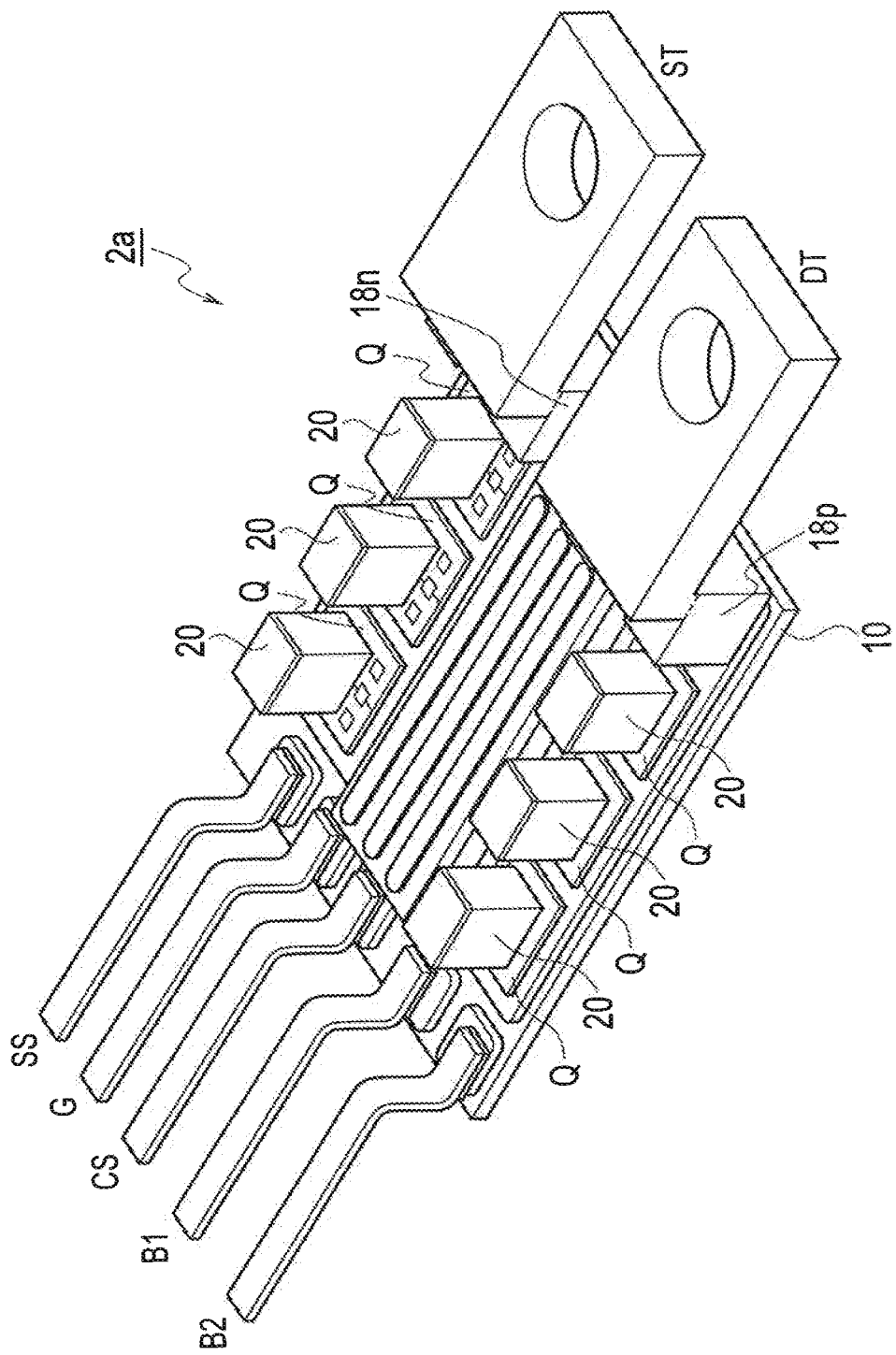
FIG. 3 is a schematic bird's-eye view configuration diagram showing a 1-in-1 module, before forming an upper surface plate electrode thereon, which is the power module semiconductor device according to the comparative example.

Furthermore, FIG. 3 illustrates a schematic bird's-eye view configuration of the power module semiconductor device 2, before forming an upper surface plate electrode 22 thereon.

Figure 4:
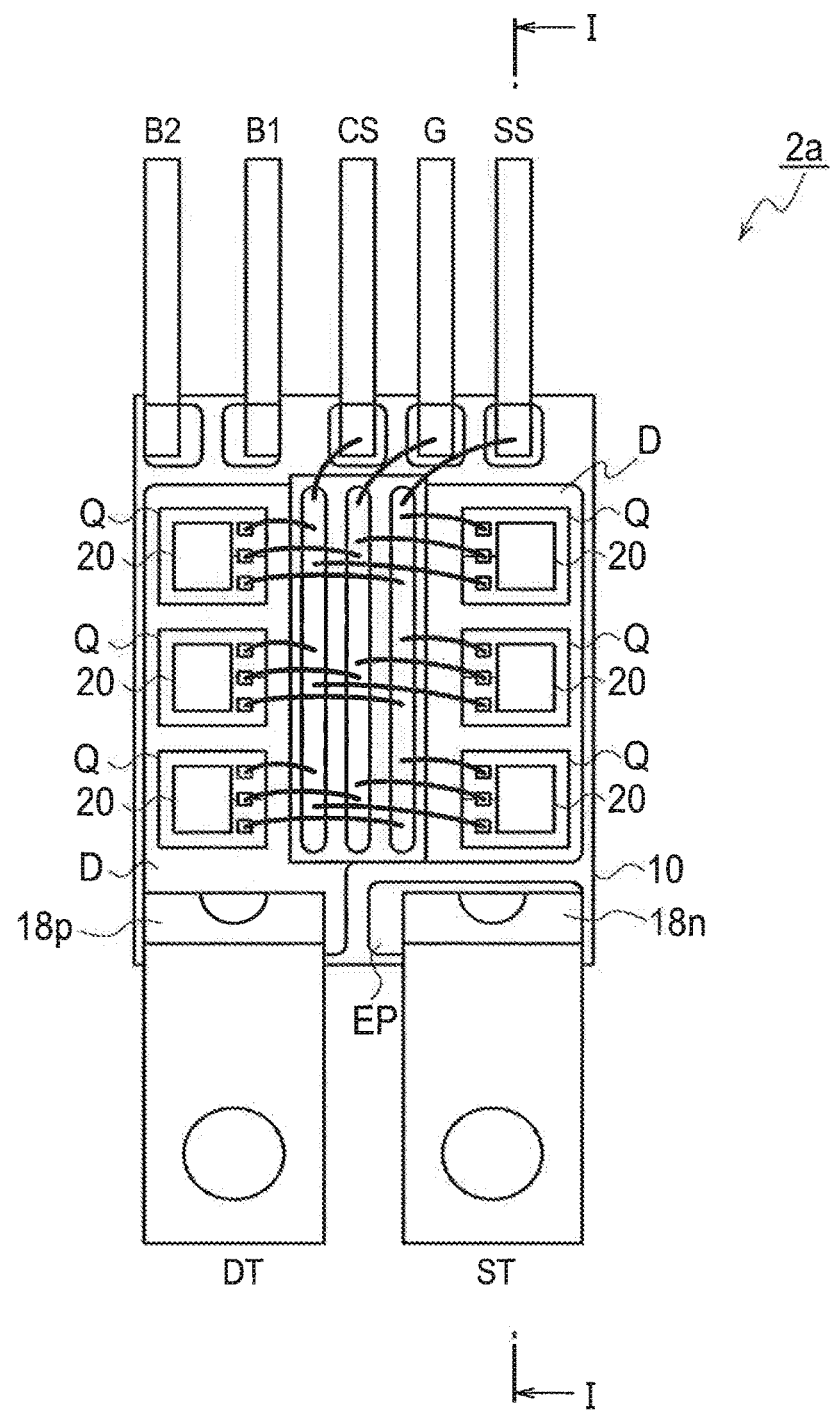
FIG. 4 is a schematic planar pattern configuration diagram showing the 1-in-1 module, which is the power module semiconductor device according to the comparative example.
Figure 5:
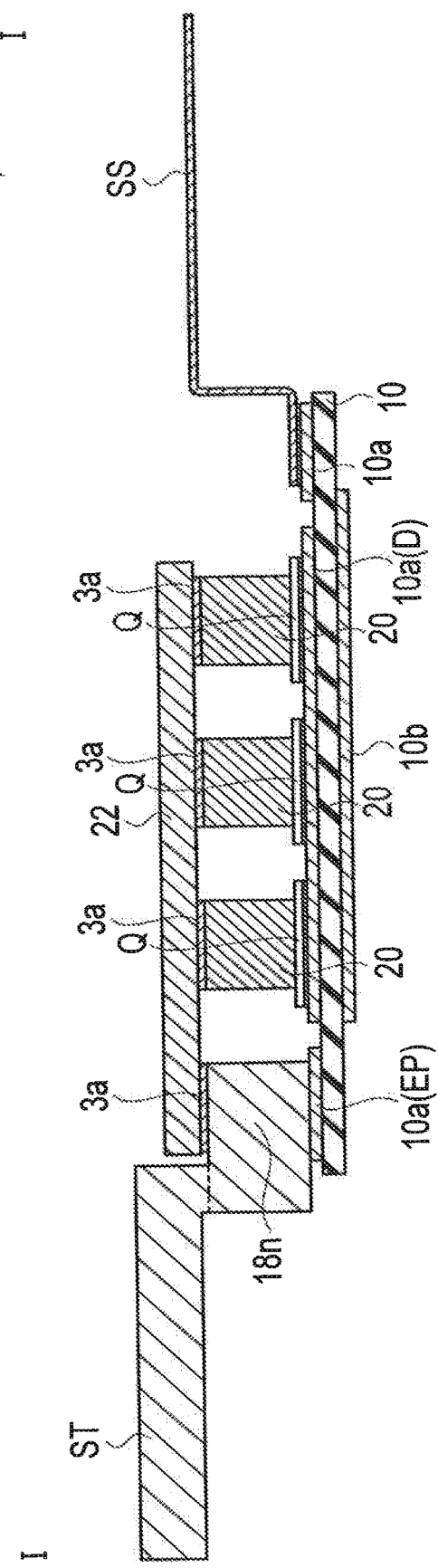
FIG. 5 is a schematic cross-sectional structure diagram taken in the line I-I of FIG. 4.

Moreover, FIG. 4 illustrates a schematic planar pattern configuration of the 1-in-1 module, which is the power module semiconductor device 2a according to the comparative example. FIG. 5 illustrates a schematic cross-sectional structure taken in the line I-I of FIG. 4.

As shown in FIGS. 1-4, the power module semiconductor device 2a according to the comparative example includes: a ceramic substrate 10; a first pattern 10a (D) of a first copper plate layer 10a disposed on the surface of the ceramic substrate 10; a semiconductor chip Q disposed on the first pattern 10a (D); a first pillar connection electrode $18_p$ disposed on the first pattern 10a (D); and a drain terminal DT connected to the first pillar connection electrode $18_p$. Moreover, the power module semiconductor device 2s includes: a second pattern 10a (EP) of the first copper plate layer 10a; a second pillar connection electrode $18_n$ disposed on the second pattern 10a (EP); and a source terminal ST connected to the second pillar connection electrode $18_n$. Moreover, the power module semiconductor device 2a includes a pillar electrode 20 disposed on the semiconductor chip Q. Moreover, the power module semiconductor device 2a includes an upper surface plate electrode 22 disposed via a soldering layer 3a on the pillar electrode 20 and the second pillar connection electrode $18_n$.

Figure 6:
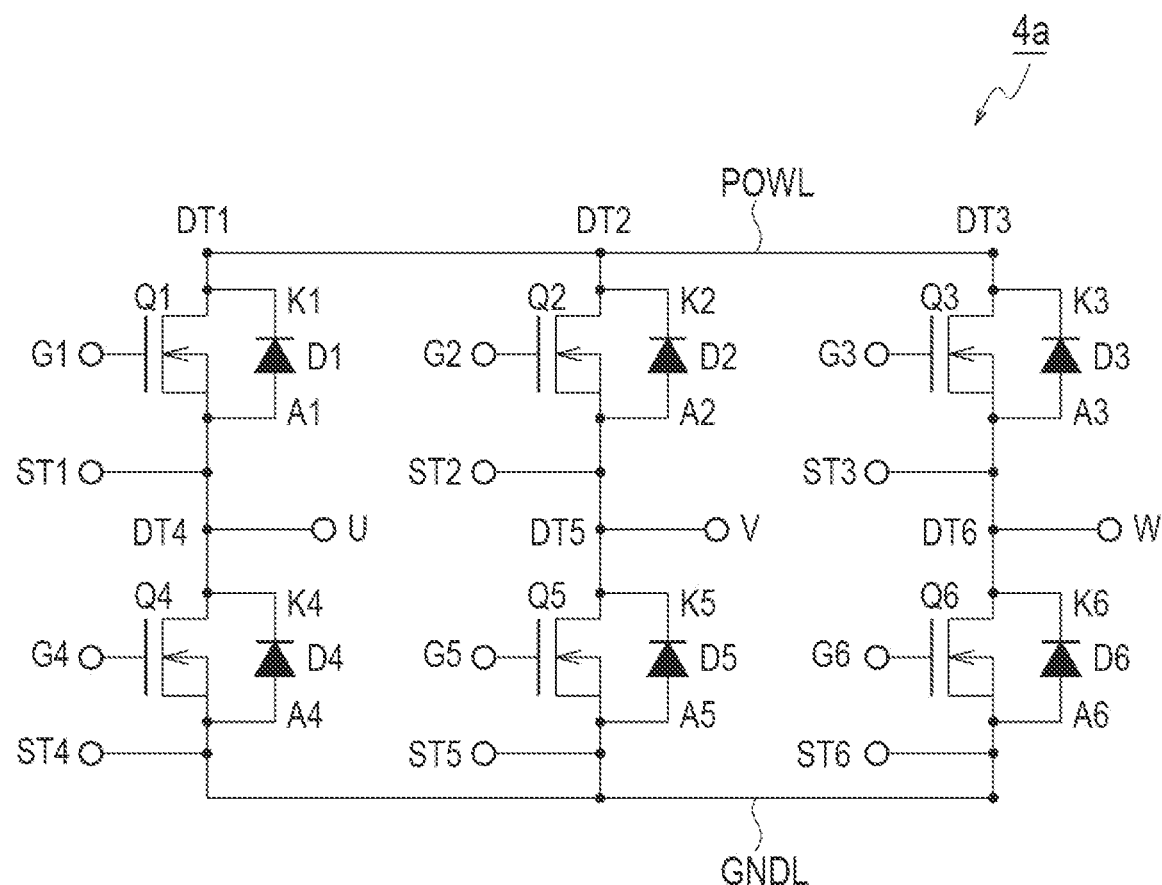
FIG. 6 is a schematic circuit configuration diagram of a three-phase alternating current (AC) inverter equipment composed by disposing six pieces of the power module semiconductor devices according to the comparative example.

FIG. 6 illustrates a schematic circuit configuration of three-phase alternating current (AC) inverter equipment 4a composed by disposing six pieces of the power module semiconductor devices 2a according to the comparative example, and FIG. 7 illustrates a schematic plane configuration of the three-phase AC inverter equipment, and a connection diagram between the respective terminals thereof.

Figures 8A, 8B:
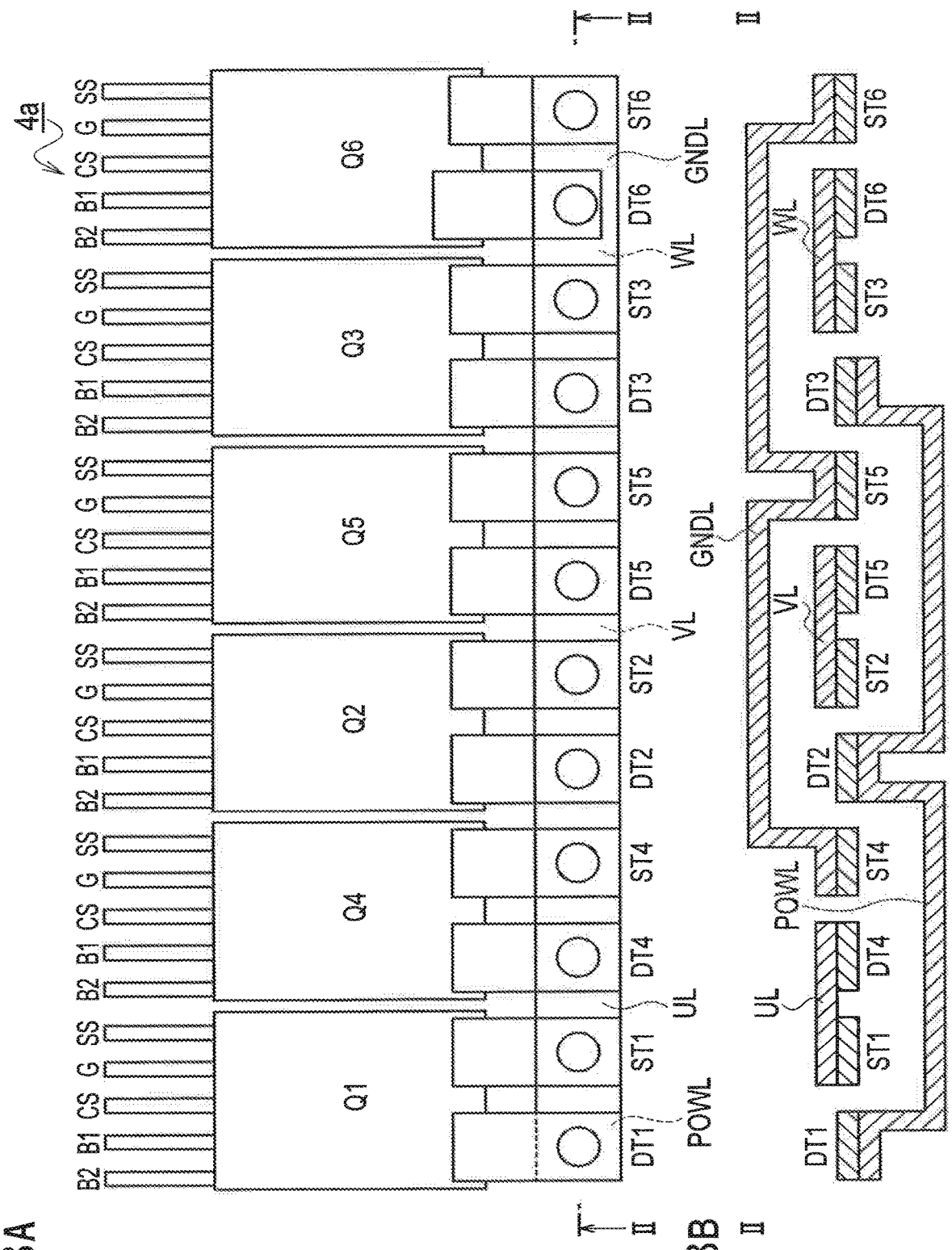
FIG. 8A is a schematic plane configuration diagram also including connection wiring (bus bar) electrodes (GNDL, POWL) connected between each power terminal in the three-phase AC inverter equipment composed by disposing the six pieces of the power module semiconductor devices according to the comparative example.
FIG. 8B is a schematic cross-sectional structure diagram taken in the line II-II of FIG. 8A.

FIG. 8A illustrates a schematic plane configuration also including connection wiring (bus bar) electrodes (GNDL, POWL) connected between each power terminal in the three-phase AC inverter equipment 4a composed by disposing the six pieces of the power module semiconductor devices according to the comparative example, and FIG. 8B illustrates a schematic cross-sectional structure taken in the line II-II of FIG. 8A.

In the power module semiconductor device 2a according to the comparative example, a current conducting path is used as a U-turn path, i.e., from the drain terminal DT to an inside of a main unit of the power device, and further from the inside of the main unit of the power device to the source terminal ST.

It is effective that parasitic components (inductance, resistance component, etc.) can be canceled with such a path in which the current conducting path is U-turned. Moreover, there is advantages that a power source is easy to disposed at a side of the source terminal ST and drain terminal DT, and a control unit etc. is easy to disposed at a side of the signal terminals SS, G, CS, B1, B2.

However, if composing three-phase AC inverter equipment 4a, it is necessary to dispose a plurality of the power module semiconductor devices 2a in parallel, as shown in FIGS. 7 and 8. Accordingly, if using such a package configuration in which the electric current is U-turned, there is a high possibility that the parasitic components of module wiring (bus bar etc.) will become larger after all as the whole inverter equipment. More specifically, the parasitic component in the module is reduced, but a length of external wiring is increased. Accordingly, it is difficult to reduce parasitic component, as the whole inverter equipment.

Moreover, the source terminal ST and the drain terminal DT are exposed from the same side surface of the package. Accordingly, as shown in FIG. 8, it is necessary to perform a bending process of the bus bar electrodes GNDL, POWL used for wiring, in order to secure an insulation distance at the time of connecting between terminals, thereby degrading the wiring efficiency.

Furthermore, the source terminal ST and the drain terminal DT are disposed at the same side surface of the package. Accordingly, if a plurality of the power module semiconductor devices 2a are disposed in parallel, the distance in the disposed direction becomes relatively longer, and thereby the installation area increases and cooling mechanisms etc. are upsized.

First Embodiment

Configuration of Semiconductor Device

Figure 9:
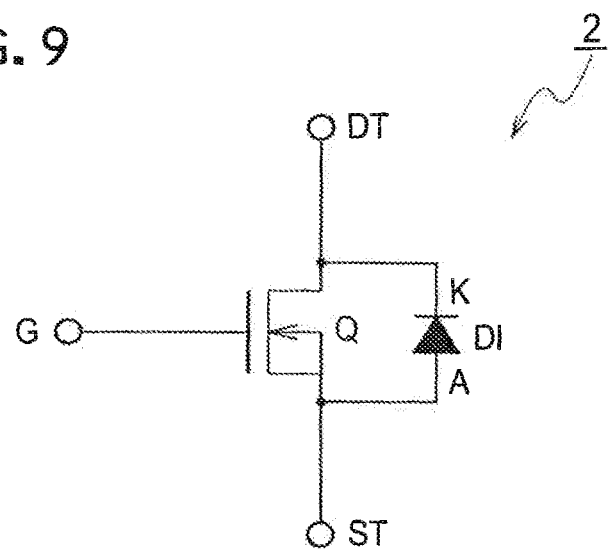
FIG. 9 is a schematic circuit representative diagram showing a 1-in-1 module, which is a power module semiconductor device according to a first embodiment.

FIG. 9 illustrates a schematic circuit representative of a 1-in-1 module, which is a power module semiconductor device 2 according to a first embodiment. Moreover, FIG. 10 illustrates a detail circuit representative of the 1-in-1 module, which is the power module semiconductor device 2 according to the first embodiment.

The power module semiconductor device 2 according to the first embodiment has a configuration of 1-in-1 module. More specifically, one MOSFETQ is included in one module. As an example, five chips (MOS transistor×5) can be mounted thereon, and a maximum of five pieces of the MOSFETs can be respectively connected to one another in parallel. Note that it is also possible to mount a part of five pieces of the chips for the diode DI thereon.

The diode DI connected to the MOSFETQ inversely in parallel is shown in FIG. 9. A main electrode of the MOSFETQ is expressed with a drain terminal DT and a source terminal ST.

Figure 10:
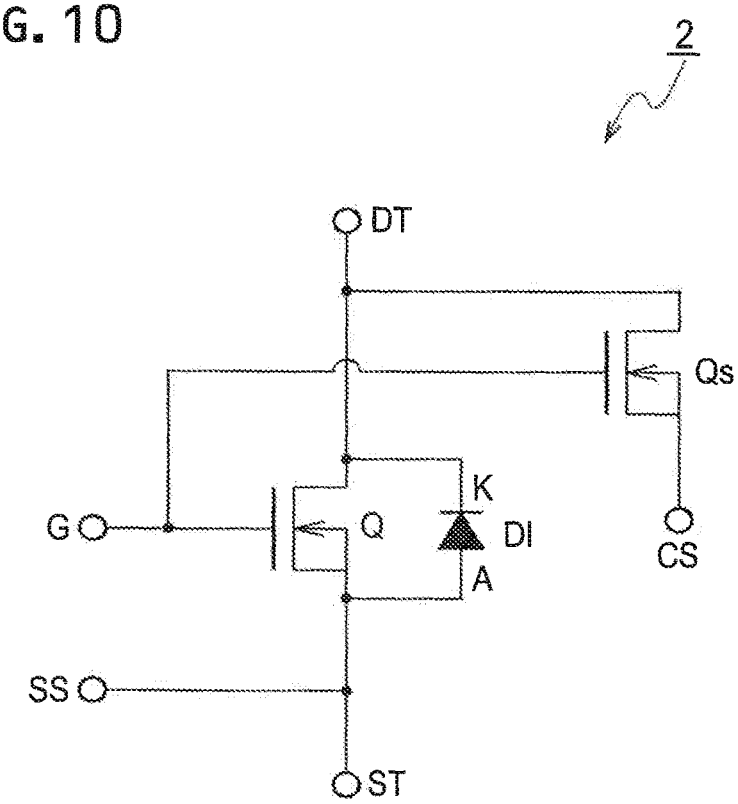
FIG. 10 is a detail circuit representative diagram showing the 1-in-1 module, which is the power module semiconductor device according to the first embodiment.

More particularly, as shown in FIG. 10, a sense MOSFET Qs is connected to the MOSFETQ in parallel. The sense MOSFET Qs is formed as a minuteness transistor in the same chip as the MOSFET Q. In FIG. 10, reference numeral SS denotes a source sense terminal, reference numeral CS denotes a current sense terminal, and reference numeral G denotes a gate signal terminal. Note that, also in the semiconductor chip Q according to the first embodiment, the sense MOSFET Qs is formed as a minuteness transistor in the same chip.

Figure 11:
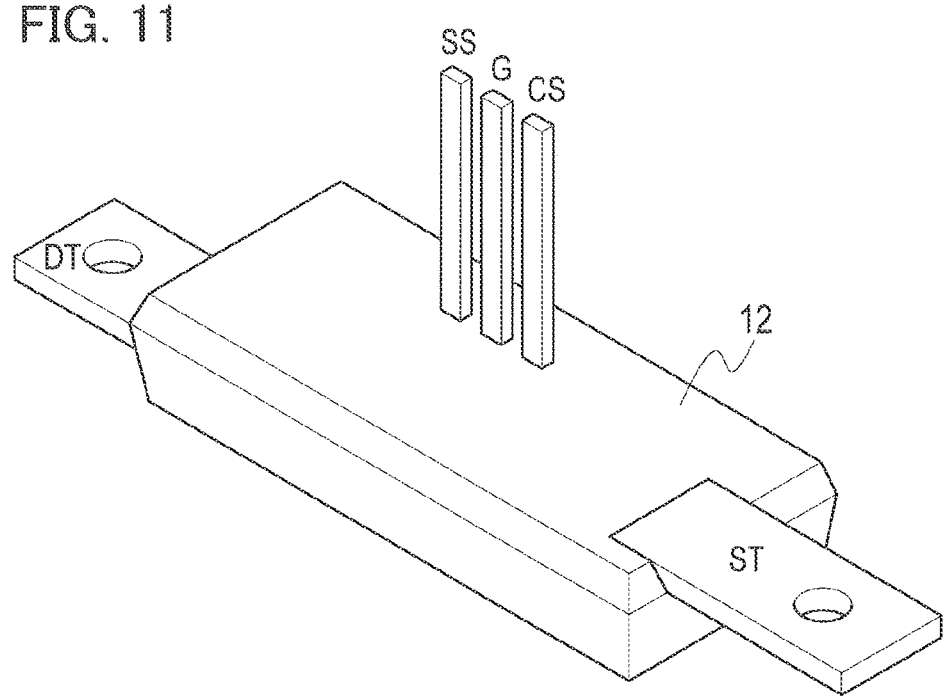
FIG. 11 is a bird's-eye view of a power module semiconductor device having straight wiring structure according to the first embodiment.

FIG. 11 illustrates a schematic bird's-eye view configuration of a 1-in-1 module, which is a power module semiconductor device 2 having a straight wiring structure according to the first embodiment. In the power module semiconductor device 2 having the straight wiring structure according to the first embodiment, the signal terminals SS, G, CS are disposed so as to be projected in a vertical direction from a resin layer 12, as shown in FIG. 11.

Figure 12:
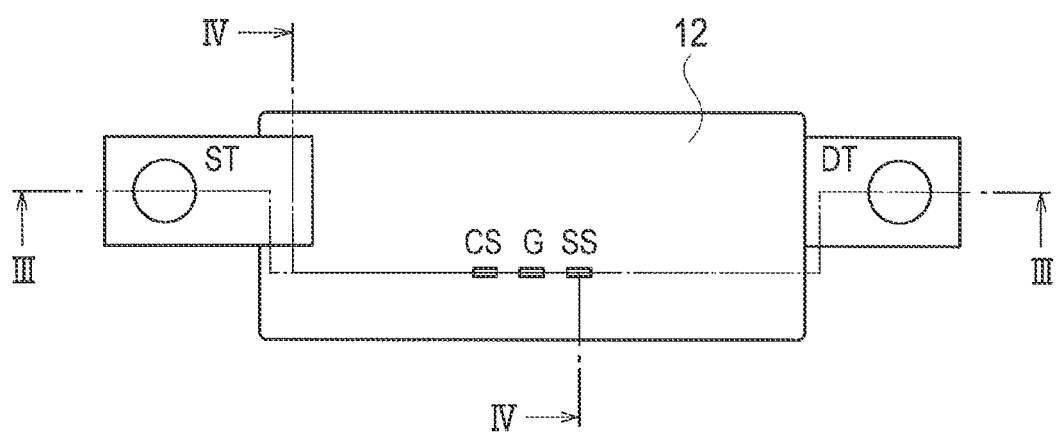
FIG. 12 is a schematic plane configuration diagram of the power module semiconductor device having the straight wiring structure according to the first embodiment.
Figure 13A:
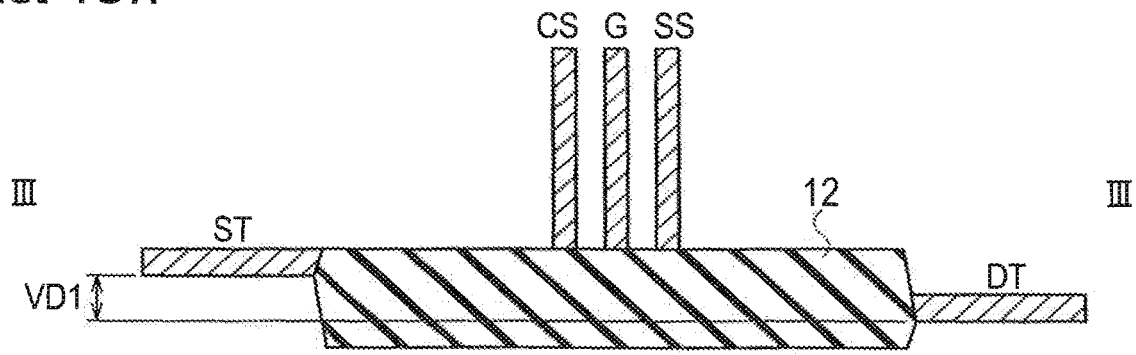
FIG. 13A is a schematic cross-sectional structure diagram taken in the line III-III of FIG. 12.
Figure 13B:
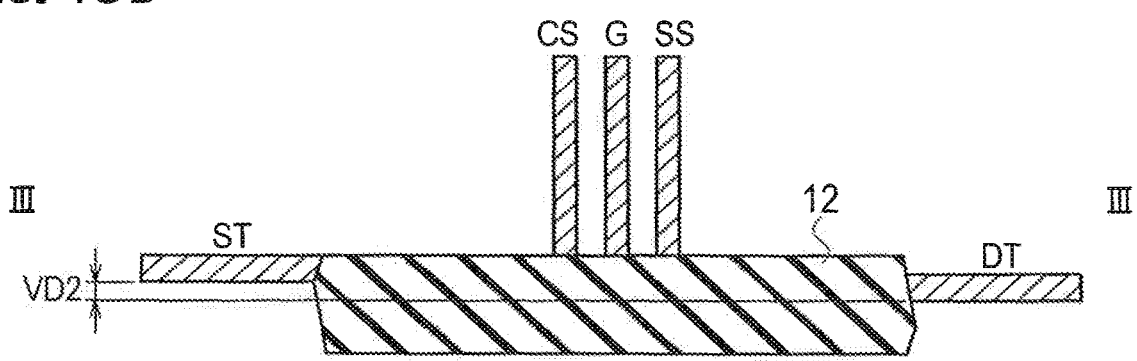
FIG. 13B is another schematic cross-sectional structure diagram taken in the line III-III of FIG. 12.
Figure 13C:
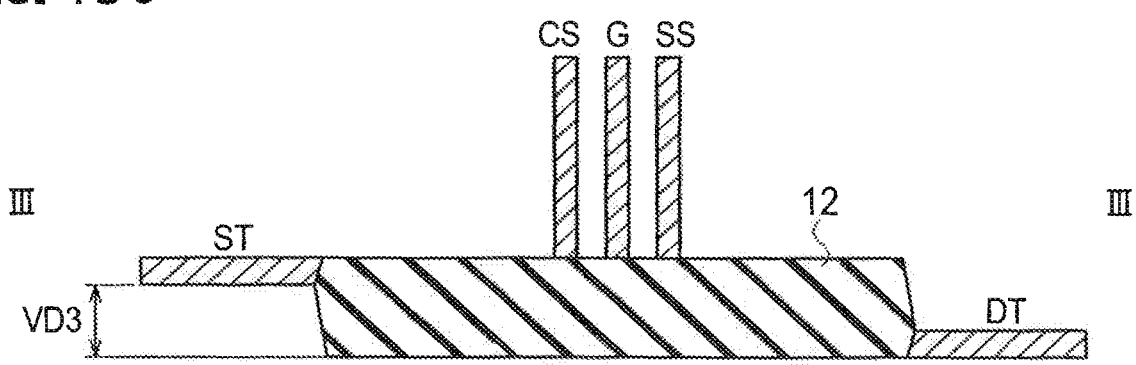
FIG. 13C is still another schematic cross-sectional structure diagram taken in the line III-III of FIG. 12.
Figure 14:
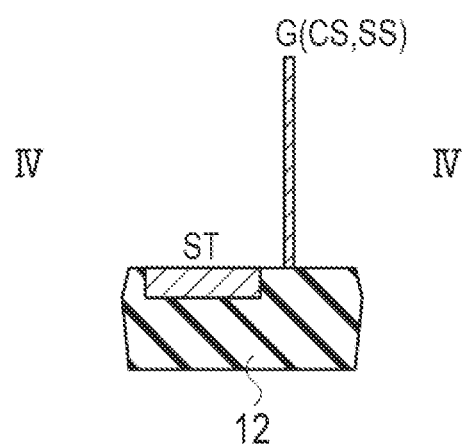
FIG. 14 is a schematic cross-sectional structure diagram taken in the line IV-IV of FIG. 12.

Moreover, FIG. 12 illustrates a schematic plane configuration of the power module semiconductor device 2 having the straight wiring structure according to the first embodiment. FIG. 13A illustrates a schematic cross-sectional structure taken in the line III-III of FIG. 12, FIG. 13B illustrates another schematic cross-sectional structure taken in the line III-III of FIG. 12, and FIG. 13C illustrates still another schematic cross-sectional structure taken in the line III-III of FIG. 12. Moreover, FIG. 14 illustrates a schematic cross-sectional structure taken in the line IV-IV of FIG. 12.

Figure 15:
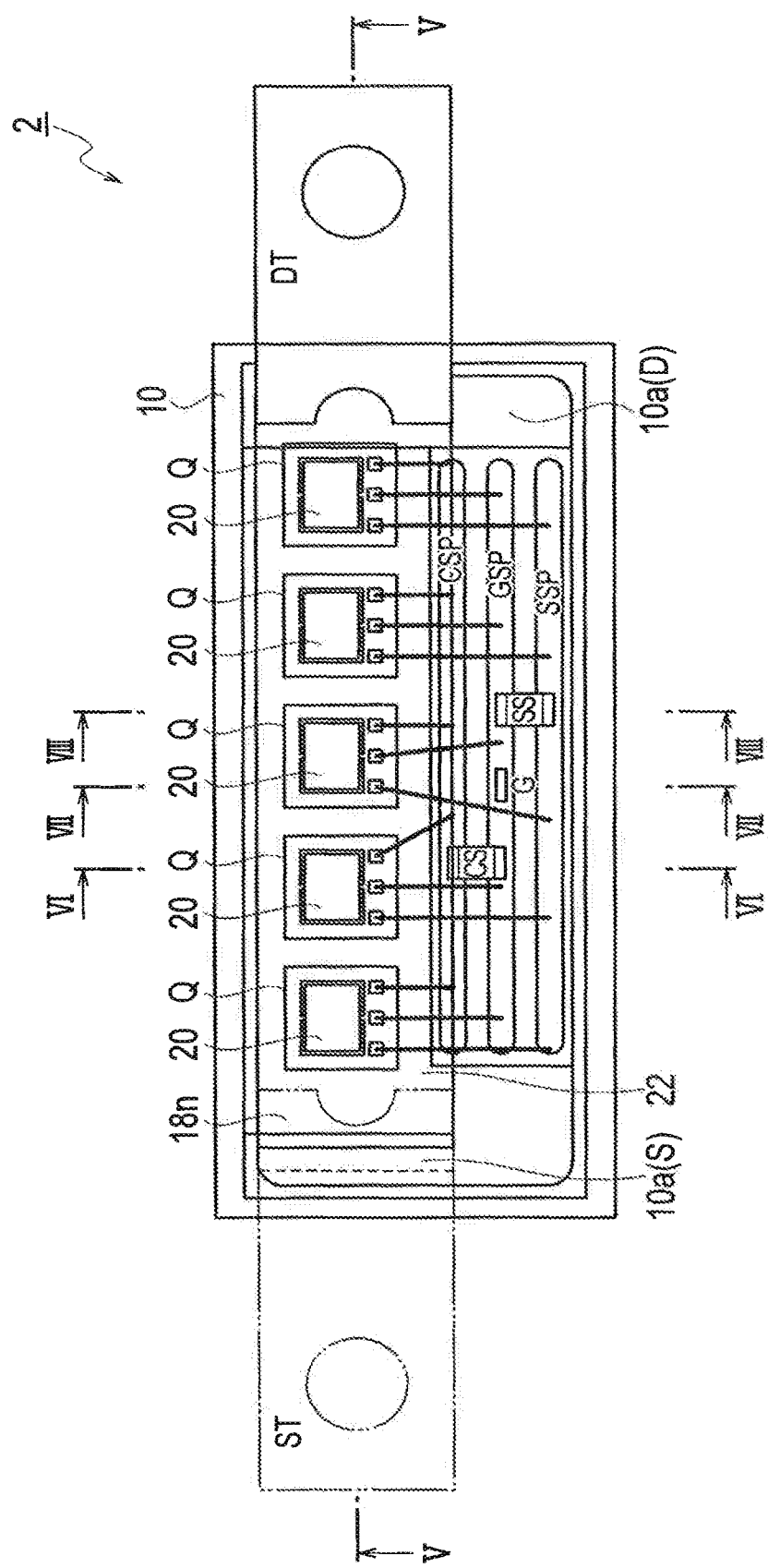
FIG. 15 is a schematic planar pattern configuration diagram showing the 1-in-1 module, which is a power module semiconductor device according to the first embodiment.
Figure 16:
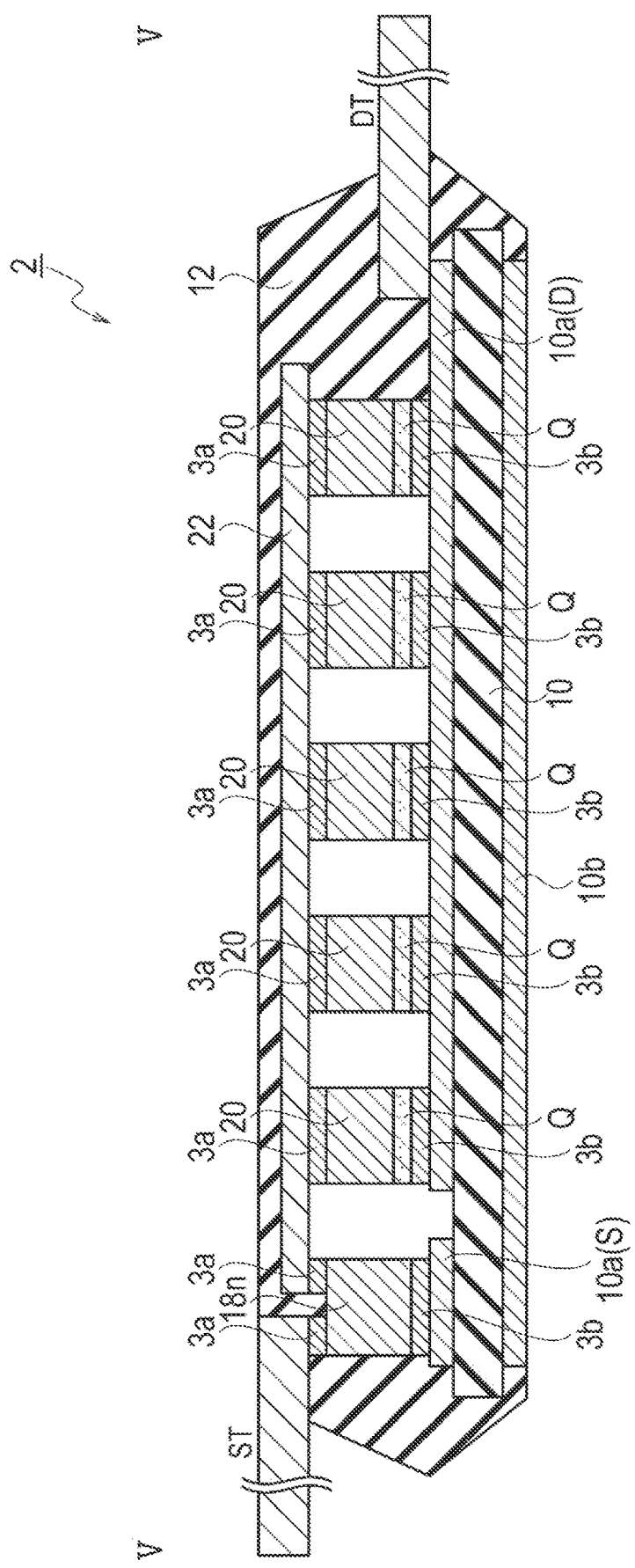
FIG. 16 is a schematic cross-sectional structure diagram taken in the line V-V of FIG. 15.
Figure 17:
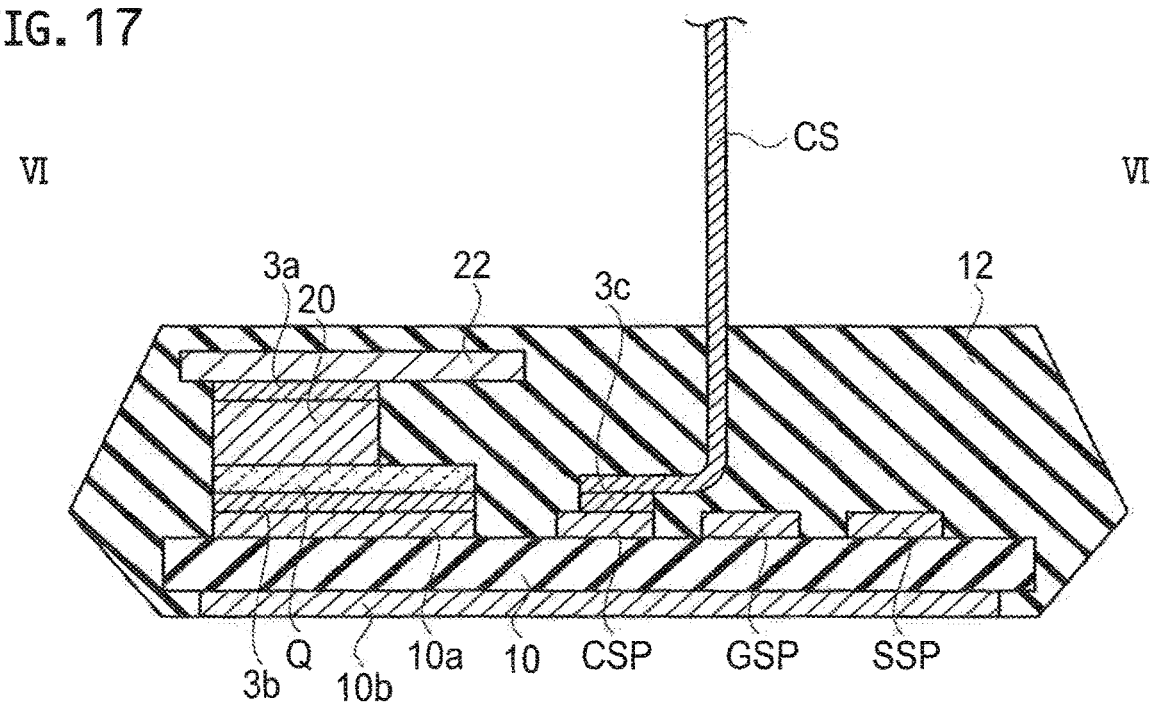
FIG. 17 is a schematic cross-sectional structure diagram taken in the line VI-VI of FIG. 15.
Figure 18:
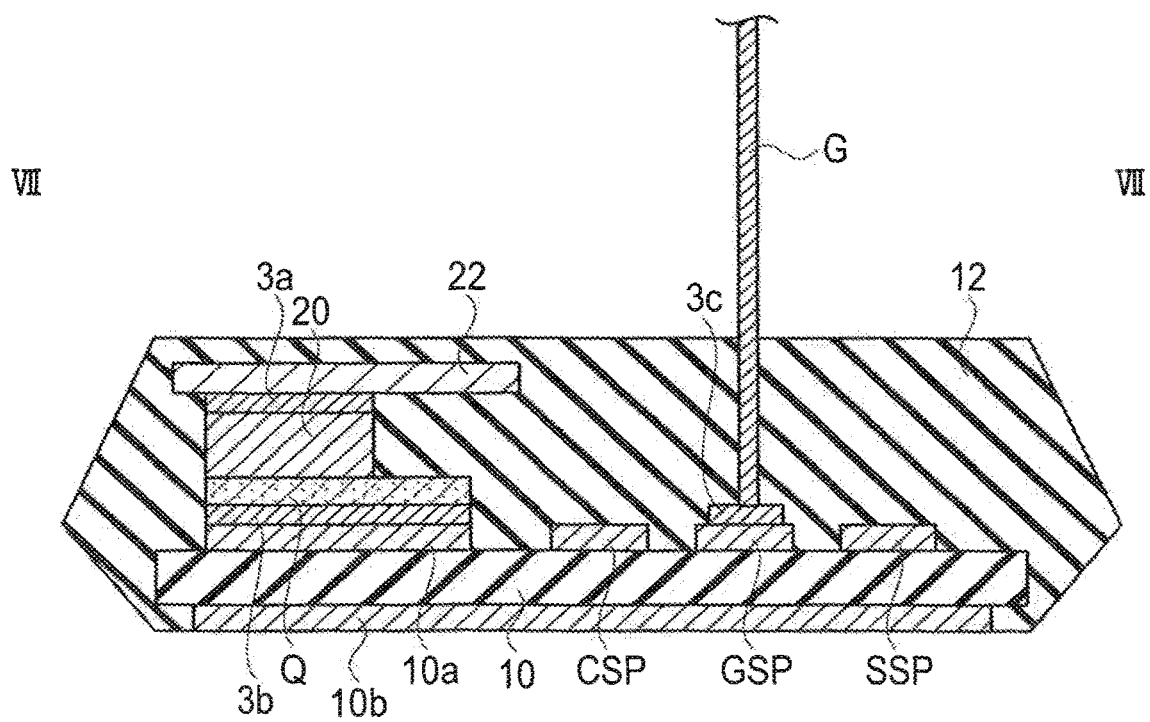
FIG. 18 is a schematic cross-sectional structure diagram taken in the line VII-VII of FIG. 15.
Figure 19:
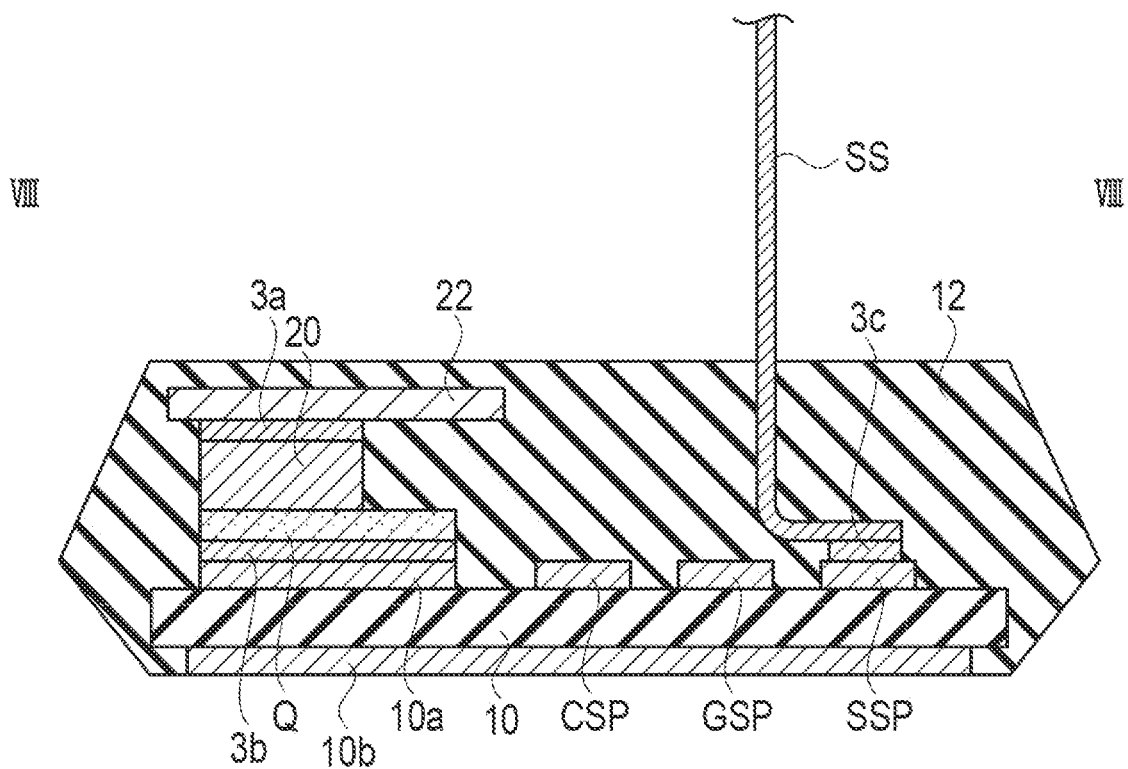
FIG. 19 is a schematic cross-sectional structure diagram taken in the line VIII-VIII of FIG. 15.

FIG. 15 illustrates a schematic planar pattern configuration of the 1-in-1 module, which is the power module semiconductor device 2 having the straight wiring structure according to the first embodiment. FIG. 16 illustrates a schematic cross-sectional structure taken in the line V-V of FIG. 15, FIG. 17 illustrates a schematic cross-sectional structure taken in the line VI-VI of FIG. 15, FIG. 18 illustrates a schematic cross-sectional structure taken in the line VII-VII of FIG. 15, and FIG. 19 illustrates a schematic cross-sectional structure taken in the line VIII-VIII of FIG. 15.

As shown in FIGS. 15 and 16, the power module semiconductor device 2 having the straight wiring structure according to the first embodiment includes: an insulating substrate 10; a first pattern 10a(D) of a copper plate layer 10a disposed on the surface of the ceramic substrate 10; a semiconductor chip Q disposed on the first pattern 10a(D); power terminals ST, DT and signal terminals CS, G, SS, both electrically connected to the semiconductor chip Q; and a resin layer 12 configured to cover the semiconductor chip Q and the insulating substrate 10. In this case, the signal terminals CS, G, SS are mutually disposed so as to be extended in a vertical direction with respect to a main surface of the insulating substrate 10; and the power terminals ST, DT are mutually disposed so as to be extended from the mutually opposite side surfaces of the resin layer 12 in the mutually opposite directions, along a long-side direction of the resin layer 12, in parallel with a main surface of the resin layer 12; thereby forming the straight wiring structure.

In the power module semiconductor device 2 having the straight wiring structure according to the first embodiment, the power terminals ST, DT are disposed from the side surface of the resin layer 12 in a parallel direction with the main surface of the resin layer 12, as shown in FIGS. 11-16.

Moreover, the power terminals ST, DT are mutually disposed so as to be extended from the mutually opposite side surfaces of the resin layer 12 in the mutually opposite directions, along a long-side direction of the resin layer 12, as shown in FIGS. 11-16.

Moreover, the power terminals ST, DT are disposed in a thickness direction of the resin layer 12 so as to form a predetermined step height (difference in level) VD1, VD2, or VD3, as shown in FIGS. 12 and 13.

Moreover, the vertical direction with respect to the main surface of the insulating substrate 10 is equal to a vertical direction with respect to a main surface of the resin layer 12.

Moreover, the signal terminals CS, G, SS may be linearly disposed on the main surface of the resin layer 12, as shown in FIGS. 11 and 12.

Moreover, the signal terminal may include a gate signal terminal G and a sensor terminal.

Moreover, the sensor terminal may include a source sense terminal SS and a current sense terminal CS. Moreover, thermistor connecting terminals B1, B2, etc. (not shown therein) used for temperature sensing may be disposed in the vertical direction with respect to the main surface of the insulating substrate 10 in the same manner as the signal terminals, other than the source sense terminal SS and the current sense terminal CS.

Moreover, the power module semiconductor device 2 having the straight wiring structure according to the first embodiment includes electrode patterns CSP, GSP, SSP disposed so as to be adjacent to the semiconductor chip Q on the insulating substrate 10, and the signal terminals CS, G, SS may be connected to the electrode patterns CSP, GSP, SSP with soldering.

As shown in FIGS. 15 and 17, the current sense terminal CS is connected with soldering via a soldering layer 3c to the current sense electrode pattern CSP. Furthermore, the current sense terminal CS is disposed so as to be bent on the gate signal electrode pattern GSP and extended in the vertical direction respect to the main surface of the insulating substrate 10.

As shown in FIGS. 15 and 18, the gate signal terminal G is connected with soldering via the soldering layer 3c to the gate signal electrode pattern GSP. Furthermore, the gate signal terminal G is disposed so as to be extended in the vertical direction respect to the main surface of the insulating substrate 10.

As shown in FIGS. 15 and 19, the source sense terminal SS is connected with soldering via the soldering layer 3c to the source sense electrode pattern SSP. Furthermore, the source sense terminal SS is disposed so as to be bent on the gate signal electrode pattern GSP and extended in the vertical direction respect to the main surface of the insulating substrate 10.

Moreover, the insulating substrate 10 may be composed of a ceramic substrate. In this case, the ceramic substrate 10 can be formed of $Al_2O_3$, AlN, SiN, AlSiC, or SiC of which at least the surface is insulation, for example.

Furthermore, as shown in FIGS. 15 and 16, the power module semiconductor device 2 according to the first embodiment includes: a second pattern 10a(S) of the first copper plate layer 10a; a pillar electrode 20 disclosed on the semiconductor chip Q; an upper surface plate electrode 22 disposed on the pillar electrode 20; a drain terminal DT disposed on the first pattern 10a (D); a pillar connection electrode 18$_n$ disposed on the second pattern 10a(S) and connected to the upper surface plate electrode 22; and a source terminal ST connected to the pillar connection electrode 18$_n$.

The power terminals ST, DT include: a source terminal ST connected to a source pad electrode SP (refer to FIG. 35) of the semiconductor chip Q; and a drain terminal DT connected to a drain electrode pattern D (refer to FIGS. 34 and 35) of the semiconductor chip Q. Moreover, the source terminal ST is connected to the source pad electrode SP of the semiconductor chip Q, and the drain terminal DT is connected to the drain electrode pattern D of the semiconductor chip Q.

Moreover, as shown in FIGS. 15 and 16, the current sense terminal CS, the gate signal terminal G, and the source sense terminal SS of the semiconductor chip Q is respectively bonding connected via bonding wires to the current sense electrode pattern CSP, the source sense electrode pattern SSP, and the source sense electrode pattern SSP disposed so as to be adjacent to the semiconductor chip Q.

Moreover, the first pattern 10a (D) and the semiconductor chip Q are bonded to each other via the soldering layer 3b, and the pillar connection electrode $18_n$ and the second pattern 10a(S) are also bonded to each other via the soldering layer 3b.

Moreover, the pillar electrode 20 and the upper surface plate electrode 22 are bonded to each other via the soldering layer 3a, and the pillar connection electrode $18_n$ is also bonded to the upper surface plate electrode 22 and the source terminal ST via the soldering layer 3a.

The power module semiconductor device 2 according to the first embodiment may include a diode DI disposed so as to be adjacent to the semiconductor chip Q on the first pattern 10a (D), in the 1-in-1 module configuration. A cathode K of the diode DI is connected to the first pattern 10a (D), and an anode A thereof is connected to the upper surface plate electrode 22 via the pillar electrode 20.

In this case, the semiconductor chip Q is formed of SiC MOSFET, for example, and the diode DI can be formed of SiC Schottky Barrier Diode (SBD), for example.

The second copper plate layer 10b disposed on the back side surface of the ceramic substrate 10 functions as a heat spreader.

Moreover, the resin layer 12 may be formed of a transfermold resin. The resin layer 12 may be formed of an epoxy based resin or a silicone based resin.

A plurality of the semiconductor chips Q are disposed on the surface of the ceramic substrate 10 at a position apart from one another in planar view observed from a thickness direction of the ceramic substrate 10, and are resin-molded with the resin layer 12.

Moreover, the pillar connection electrode $18_n$ may be formed of electrode materials of which the value of a Coefficient of Thermal Expansion (CTE) is relatively small, e.g., CuMo, Cu, etc.

A portion of the upper surface plate electrode 22 may be formed of electrode materials of which the value of CTE is relatively small, e.g. CuMo, Cu, etc.

A portion of the pillar electrode 20 may be formed of electrode materials of which the value of CTE is relatively small, e.g. CuMo, Cu, etc.

If materials of the same size of which the values of CTE are equivalent to each other are compared with each other, the generated stress of materials having a larger value of Young's modulus becomes larger than that of materials having a smaller value of Young's modulus. Accordingly, if materials of which the value of Young's modulus×CTE is smaller is selected, structural members having a smaller value of the generated stress can be obtained.

CuMo has such an advantage. Moreover, although CuMo is inferior to Cu, the electric resistivity of CuMo is also relatively low.

Techniques, e.g. metallic bonding using metallic particles, solid phase diffusion bonding, and Transient Liquid Phase (TLP) bonding, as well as the solder bonding, are applicable to form a bonded structure of each structural member.

For example, a metallic bonded structure is formed by annealing paste materials containing conductive particles. The annealing temperature of paste materials is approximately 200-400 degrees C., for example. The conductive particles are metallic fine particles which are silver particles, gold particles, or nickel particles, copper particles, etc., for example. As an example, if the silver particles are applied as metallic fine particles, the cardinalities of the silver particles are from approximately 80 mass % to approximately 95 mass %, for example. Moreover, an average particle diameter of the silver nanoparticles is from approximately 10 nm to approximately 100 nm.

In the vertical terminal internal structure of the power module semiconductor device 2 according to the first embodiment, since the metallic terminal parts are soldered directly to the electrode patterns etc., parts, e.g. a socket, are not required.

Three-Phase AC Inverter Configuration

Figure 20:
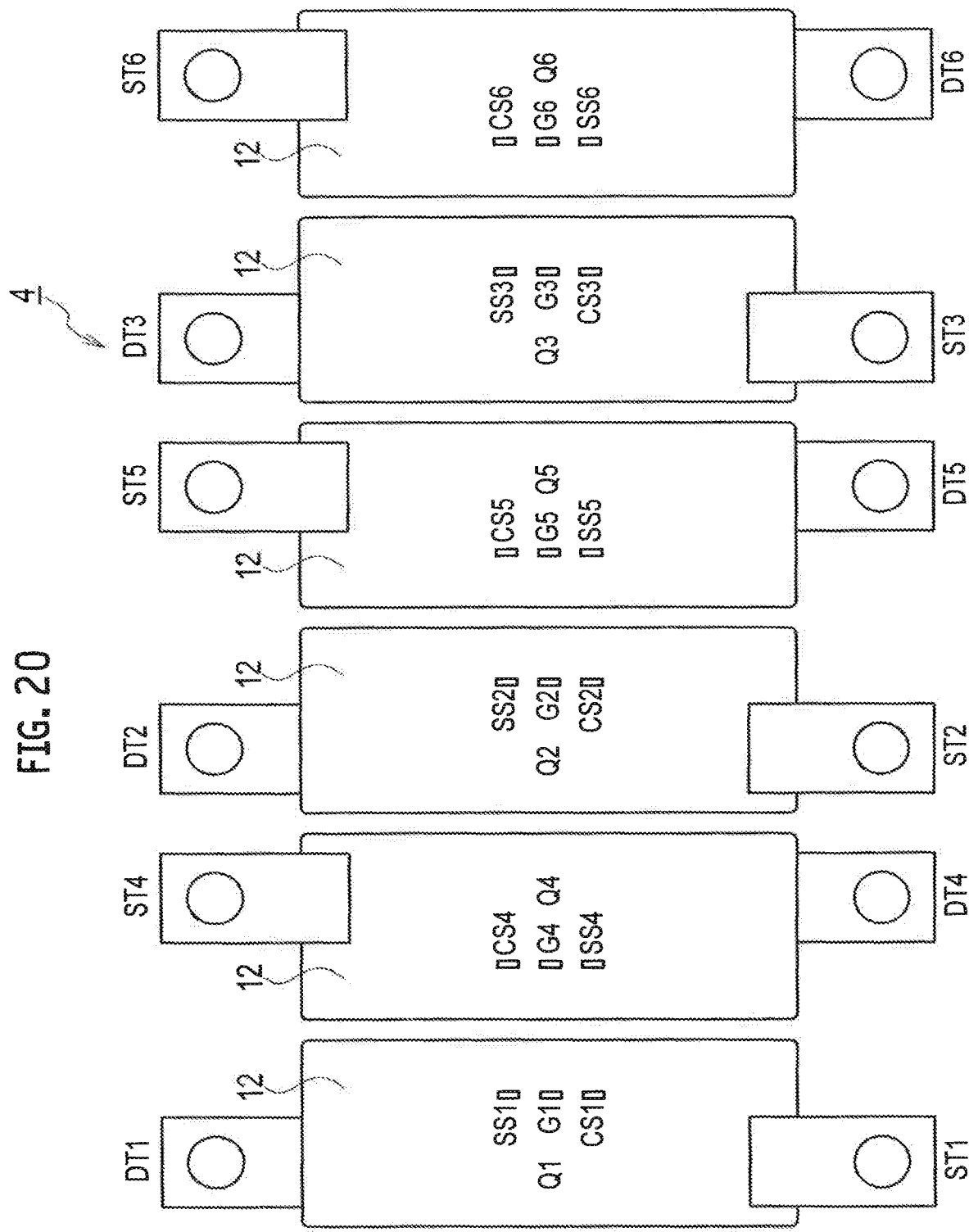
FIG. 20 is a schematic circuit configuration diagram of a three-phase AC inverter composed by disposing six pieces of the power module semiconductor devices according to the first embodiment.

FIG. 20 illustrates a schematic plane configuration of a three-phase AC inverter equipment 4 composed by disposing six pieces of the power module semiconductor devices 2 having the straight wiring structure according to the first embodiment.

In the power module semiconductor device 2 having the straight wiring structure according to the first embodiment, since the signal terminals SS, G, CS are not disposed on the outer periphery of the resin layer 12, as shown in FIG. 20, a distance between the power modules can be reduced even if the three-phase AC inverter equipment 4 are disposed in parallel.

Moreover, FIG. 20 illustrates a connecting relationship between each terminal of the three-phase AC inverter equipment 4 composed by disposing and six pieces of the power module semiconductor devices 2 having the straight wiring structure according to the first embodiment.

Figure 22:
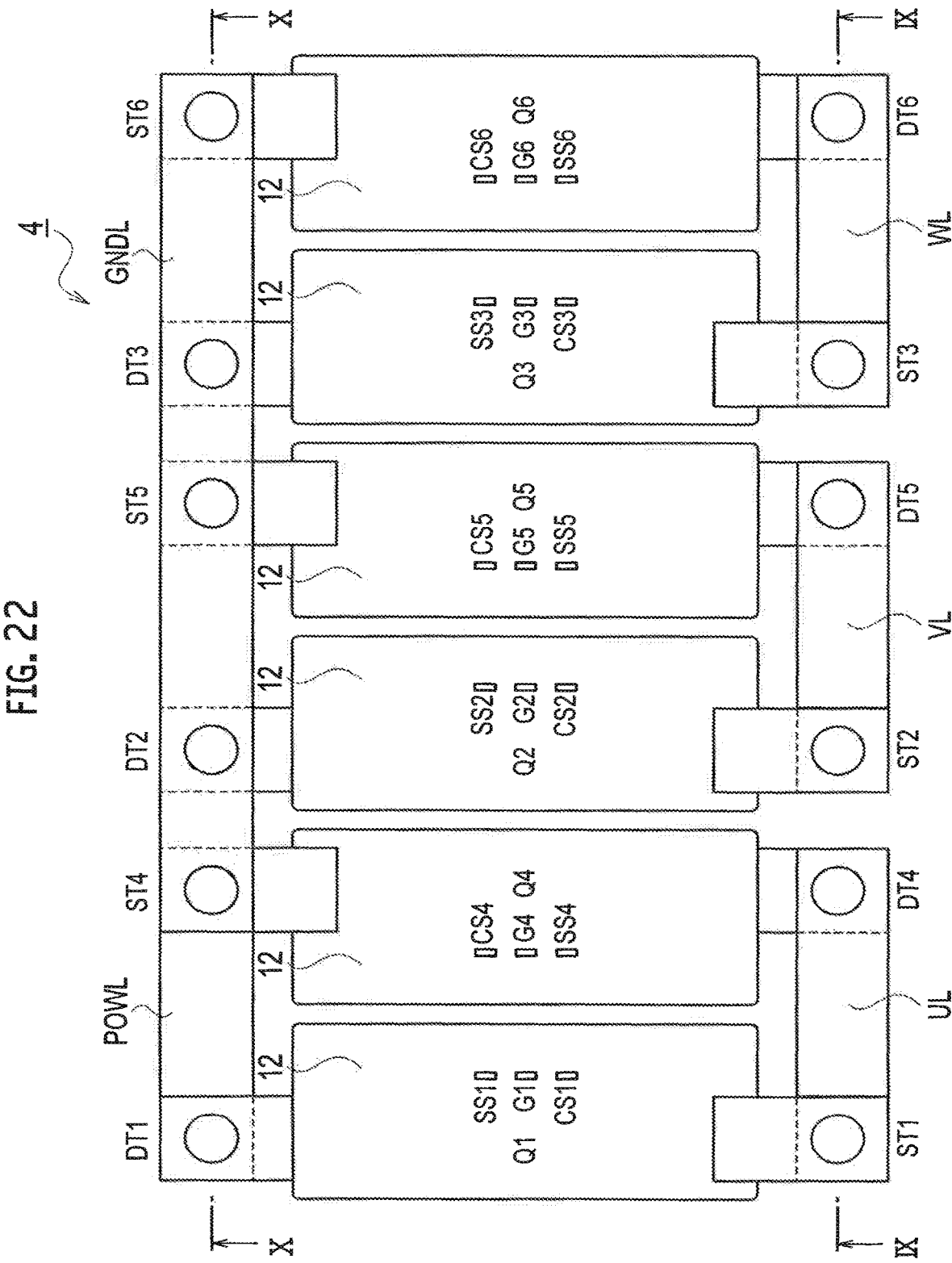
FIG. 22 is a schematic plane configuration diagram also including connection wiring (bus bar) electrodes (GNDL, POWL) connected between each power terminal in the three-phase AC inverter composed by disposing the six pieces of the power module semiconductor devices according to the first embodiment.

FIG. 22 illustrates a schematic plane configuration also including connection wiring (bus bar) electrodes (GNDL, POWL) connected between each power terminal in the three-phase AC inverter equipment 4 composed by disposing the six pieces of the power module semiconductor devices 2 having the straight wiring structure according to the first embodiment.

The transistors Q1, Q4, Q2, Q5, Q3, Q6 respectively compose half bridge inverters.

Figure 21:
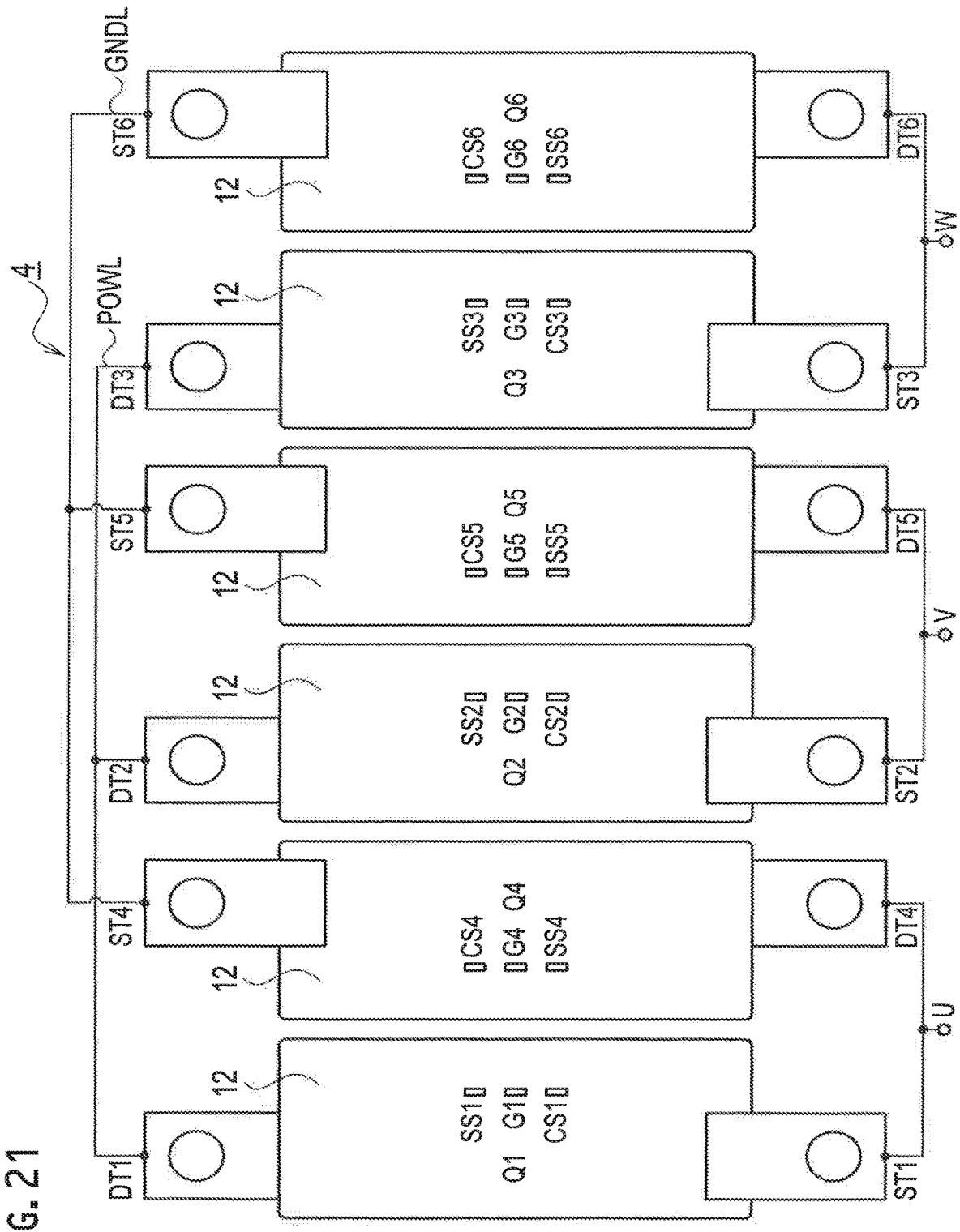
FIG. 21 is a connection diagram between the respective terminals of the three-phase AC inverter composed by disposing the six pieces of the power module semiconductor devices according to the first embodiment.

As shown in FIG. 21 and FIG. 22, drain terminals DT1, DT2, DT3 of the transistors Q1, Q2, Q3 are commonly connected to one another with a bus bar electrode POWL used for power source, and source terminals ST4, ST5, ST6 of the transistors Q4, Q5, Q6 are commonly connected to one another with a bus bar electrode GNDL used for earth (ground).

Moreover, as shown in FIGS. 21 and 22, the source terminals ST1, ST2, ST3 of the transistors Q1, Q2, Q3 are respectively connected in common to the drain terminals DT4, DT5, DT6 of the transistors Q4, Q5, Q6 with bus bar electrodes UL, VL, WL. As a result, 3-phase (U, V, and W phases) outputs (AC Inverter) can be respectively obtained from the bus bar electrodes UL, VL, WL.

Moreover, FIG. 23A illustrates a schematic cross-sectional structure taken in the line IX-IX of FIG. 22, and FIG. 23B illustrates a schematic cross-sectional structure taken in the line X-X of FIG. 22.

Moreover, FIG. 24A illustrates another schematic cross-sectional structure taken in the line IX-IX of FIG. 22, and FIG. 24B illustrates another schematic cross-sectional structure taken in the line X-X of FIG. 22.

Moreover, FIG. 25A illustrates still another schematic cross-sectional structure taken in the line IX-IX of FIG. 22, and FIG. 25B illustrates still another schematic cross-sectional structure taken in the line X-X of FIG. 22.

Moreover, the power terminals ST, DT are disposed in a thickness direction of the transfermold resin layer so as to form a predetermined step height (difference in level) VD1, VD2, or VD3, as shown in FIGS. 12 and 13. The example shown in FIG. 23 corresponds to the example of forming the predetermined step height VD1 shown in FIG. 13A, the example shown in FIG. 24 corresponds to the example of forming the predetermined step height VD2 shown in FIG. 13B, and the example shown in FIG. 25 corresponds to the example of forming the predetermined step height VD3 shown in FIG. 13C.

In the example of the predetermined step height VD1 shown in FIG. 13A, the bus bar electrodes UL, VL, WL have straight electrode structure in the same manner as the bus bar electrodes POWL, GNDL.

In the example of the predetermined step height VD2 shown in FIG. 13B, although the bus bar electrodes POWL, GNDL have straight electrode structure, the bus bar electrodes UL, VL, WL have electrode structure bent upward since the value of the predetermined step height VD2 is relatively small.

In the example of the predetermined step height VD3 shown in FIG. 13C, although the bus bar electrodes POWL, GNDL have straight electrode structure, the bus bar electrodes UL, VL, WL have electrode structure bent downward since the value of the predetermined step height VD2 is relatively large.

Figure 26:
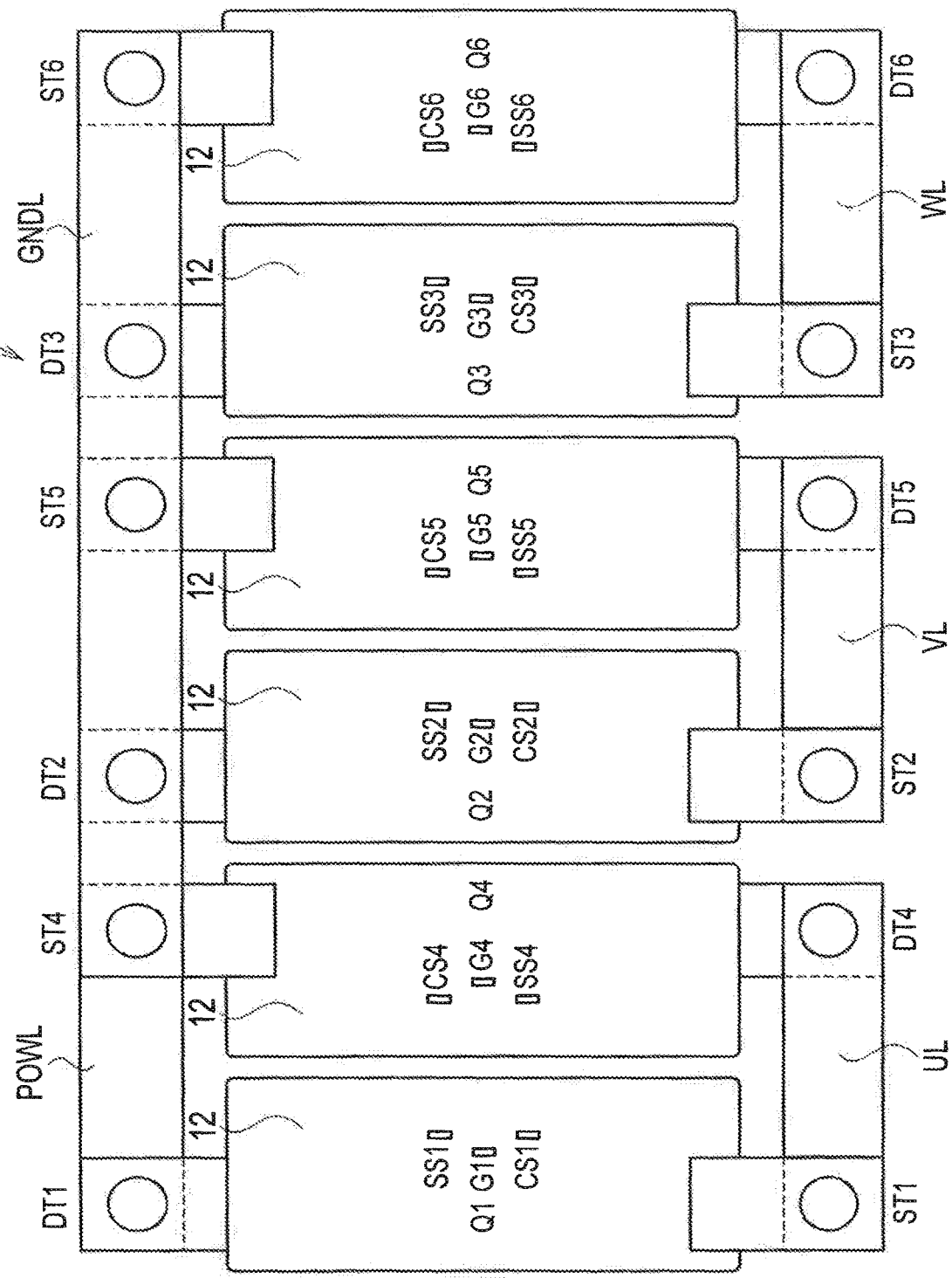
FIG. 26 is a diagram showing an example of disposing the signal terminal electrodes (SS, G, CS) in a zigzag lattice pattern, in a schematic plane configuration diagram also including the connection wiring (bus bar) electrodes (GNDL, POWL) connected between each power terminal of the three-phase AC inverter composed by disposing the six pieces of the power module semiconductor devices according to the first embodiment shown in FIG. 22.

FIG. 26 illustrates an example of disposing the signal terminal electrodes (SS, G, CS) in a zigzag lattice pattern, in the three-phase AC inverter equipment 4 composed by disposing six pieces of the power module semiconductor devices 2 having the straight wiring structure according to the first embodiment. Accordingly, in the power module semiconductor device 2 having the straight wiring structure according to the first embodiment, the signal terminals CS, G, SS may be disposed in a zigzag on the main surface of the resin layer 12. Furthermore, the signal terminals CS, G, SS may be disposed at random on the main surface of the resin layer 12.

In the inverter equipment 4 composed by disposing a plurality of the power module semiconductor devices 2 having the straight wiring structure according to the first embodiment in parallel, as shown in FIGS. 20-22, the plurality of the power module semiconductor devices 2 having the straight wiring structure are disposed in parallel, and the power terminals ST, DT of each power module semiconductor device 2 are connected to each other with the bus bar electrode.

In the inverter equipment 4 composed by disposing the plurality of the power module semiconductor devices 2 having the straight wiring structure according to the first embodiment in parallel, the drain terminal DT and the source terminal ST of the power module semiconductor device are disposed so as to be opposite to a source terminal ST and a drain terminal DT of another power module semiconductor device opposite thereto.

In the inverter equipment 4 composed by disposing the plurality of the power module semiconductor devices 2 having the straight wiring structure according to the first embodiment in parallel, the respective first and second transistors (Q1, Q4), (Q2, Q5), and (Q3, Q6) composing half bridges are disposed so as to be adjacent to one another, in the plurality of the power module semiconductor devices 2. Furthermore, the source terminals of the first transistor and the drain terminals of the second transistor are respectively disposed so as to be adjacent to one another, and the drain terminals of the first transistor and the source terminals of the second transistor are respectively disposed so as to be adjacent to one another. More specifically, the terminals (ST1, DT4), (ST2, DT5) and (ST3, DT6) are respectively disposed so as to be adjacent to one another, and the terminals (DT1, ST4), (DT2, ST5), and (DT3, ST6) are respectively disposed so as to be adjacent to one another.

In the power module semiconductor device having the straight wiring structure according to the first embodiment, the three-phase AC inverter device 4 can be compactly composed by including the plurality of the power module semiconductor devices 2, and connecting the power terminals of each power module semiconductor device via the bus bar electrodes.

In the power module semiconductor device having the straight wiring structure according to the first embodiment, wirings of low series inductance Ls can be realized by including such a stepped terminal structure in the straight wiring modular structure.

In the power module semiconductor device having the straight wiring structure according to the first embodiment, the drain terminal DT and the source terminal ST are straightly (linearly) disposed in the 1-in-1 configuration, and the step height is formed between the drain terminal DT and the source terminal ST, and thereby the (6-in-1) three-phase AC inverter equipment can be easily configured by disposing the modules side by side in parallel.

Moreover, since the step height is formed between the drain terminal DT and the source terminal ST, the insulation distance between the bus bar electrodes for wiring between the modules can be easily secured, thereby achieving satisfactory wiring efficiency.

Moreover, in the three-phase AC inverter equipment to which the power module semiconductor device according to the first embodiment is applied, the wire length can be reduced and the parasitic series inductance Ls can be reduced by approximately 10%, as comparing with the comparative example of performing the bending process of the wirings (bus bar) in order to secure the insulation distance.

Vertically Stacked Structure

Figure 27:
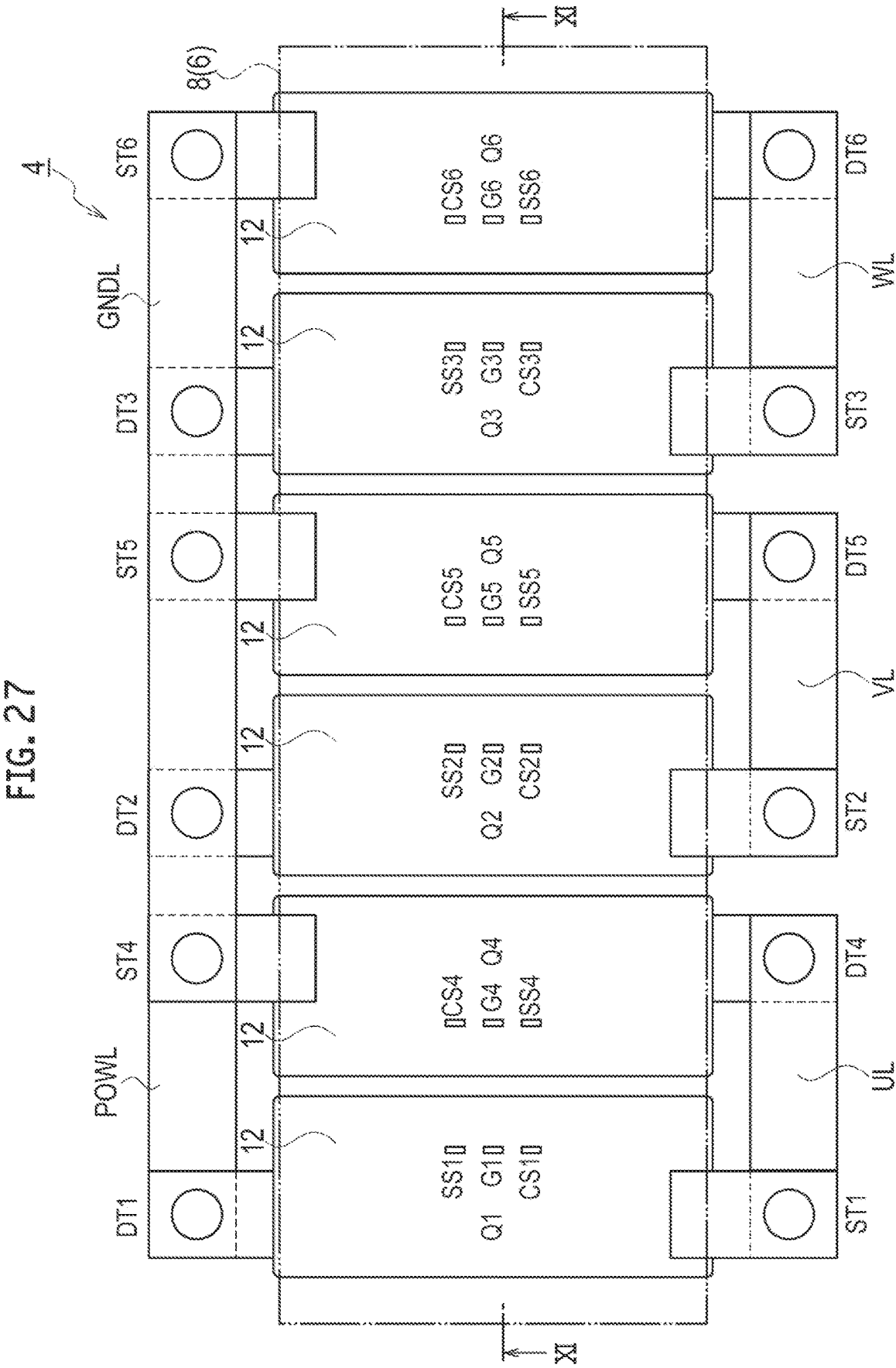
FIG. 27 is a diagram showing an example of disposing a control substrate and a power source substrate on a surface of the three-phase AC inverter, in a schematic plane configuration diagram also including the connection wiring (bus bar) electrodes (GNDL, POWL) connected between each power terminal of the three-phase AC inverter composed by disposing the six pieces of the power module semiconductor devices according to the first embodiment shown in FIG. 22.
Figure 28:
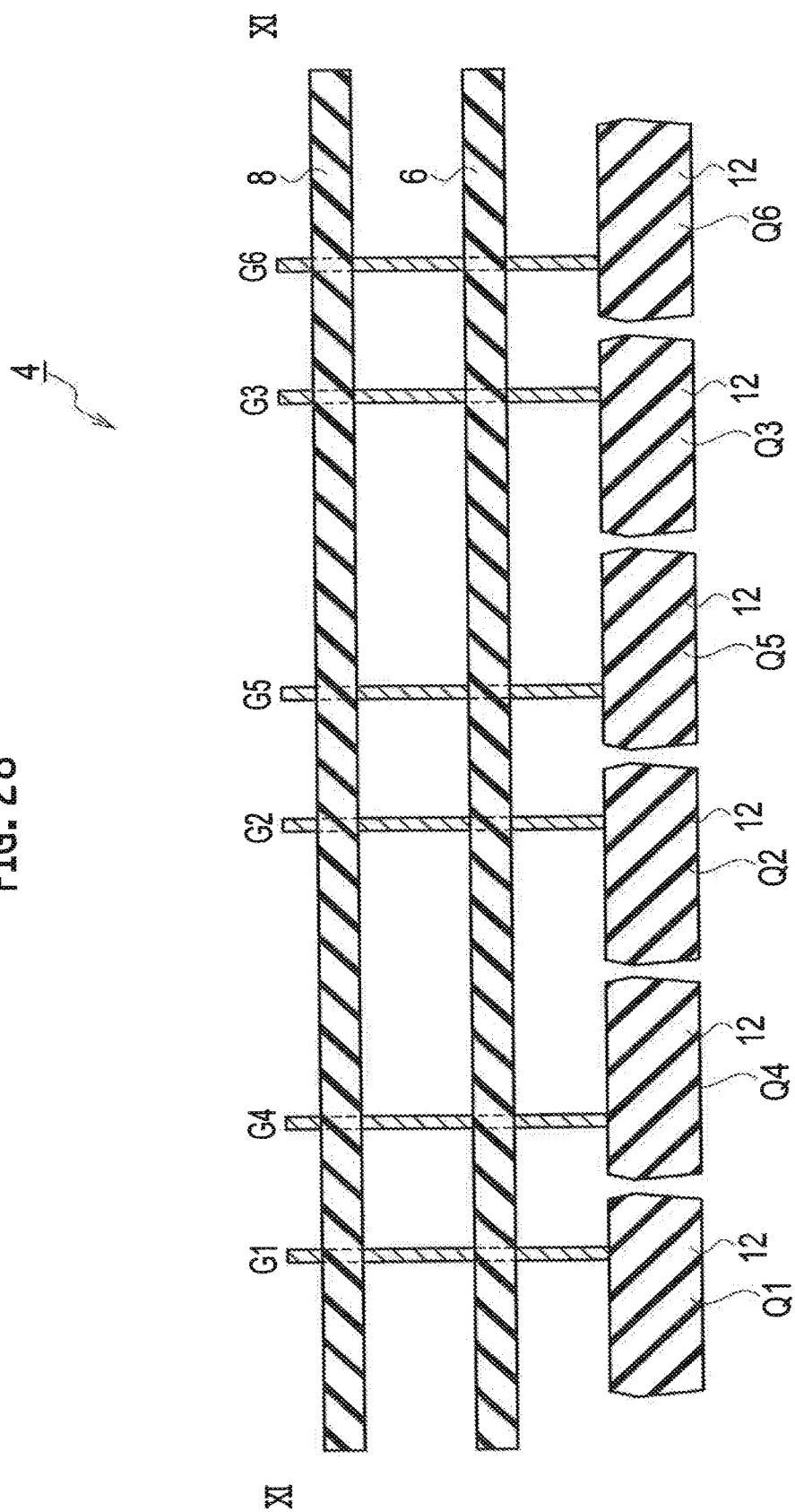
FIG. 28 is a schematic cross-sectional structure diagram taken in the line XI-XI of FIG. 27.

FIG. 27 illustrates an example of disposing a control substrate 6 and a power source substrate 8 above the three-phase AC inverter equipment 4, and FIG. 28 illustrates a schematic cross-sectional structure taken in the line XI-XI of FIG. 27, in a schematic plane configuration also including connection wiring (bus bar) electrodes (GNDL, POWL) connected between each power terminal in the three-phase AC inverter equipment 4 composed by disposing the six pieces of the power module semiconductor devices 2 having the straight wiring structure according to the first embodiment.

As shown in FIGS. 27 and 28, the three-phase AC inverter equipment 4 composed by disposing six pieces of the power module semiconductor devices having the straight wiring structure according to the first embodiment includes: a control substrate 6 disposed on the plurality of the power module semiconductor devices 2 disposed in parallel, and configured to control the power module semiconductor devices 2; and a power source substrate 8 disposed on the plurality of the power module semiconductor devices 2 disposed in parallel, and configured to supply a power source to the power module semiconductor devices 2 and the control substrate 6, wherein the length of the vertical direction in which the signal terminals CS, G, SS are extended is an enough length to connect the signal terminals CS, G, SS to the control substrate 6 and the power source substrate 8.

Figure 29:
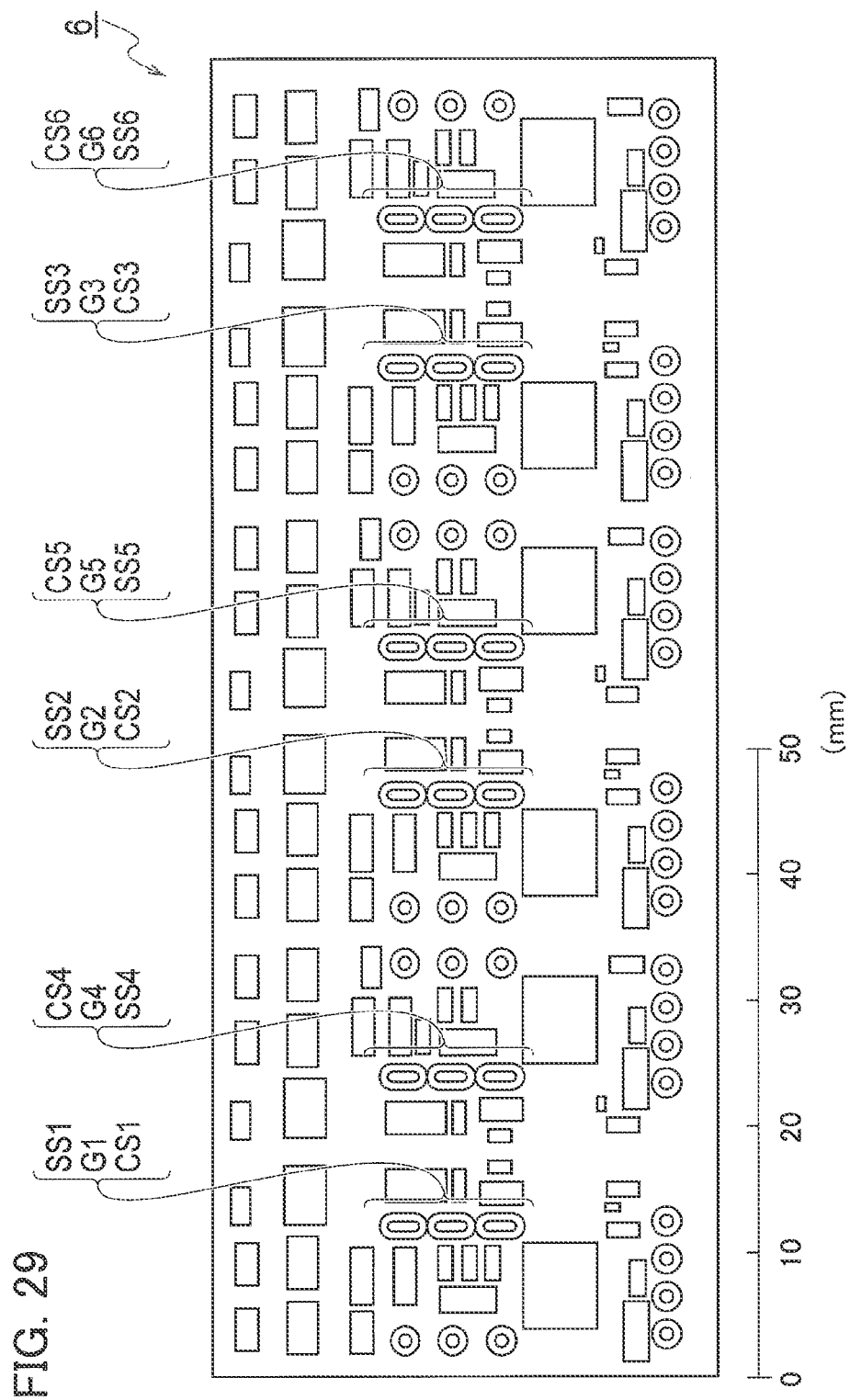
FIG. 29 is an example of a photograph of a surface of a control substrate applied to the three-phase AC inverter composed by disposing the six pieces of the power module semiconductor devices according to the first embodiment.
Figure 30:
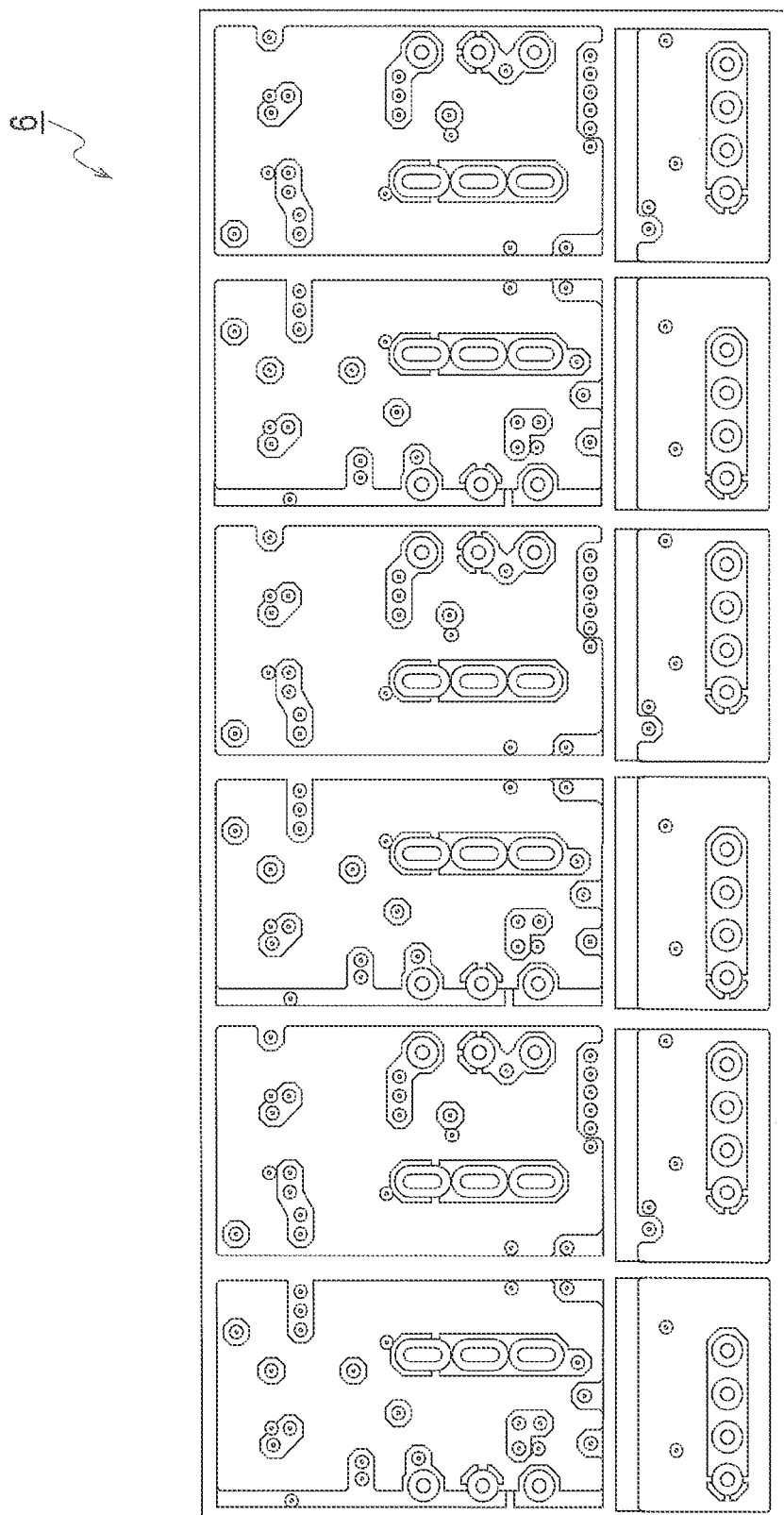
FIG. 30 is an example of a photograph of a back side surface of the control substrate applied to the three-phase AC inverter composed by disposing the six pieces of the power module semiconductor devices according to the first embodiment.

FIG. 29 illustrates an example of a photograph of a surface of the control substrate 6 applied to the three-phase AC inverter equipment 4 composed by disposing six pieces of the power module semiconductor devices having the straight wiring structure according to the first embodiment, and FIG. 30 illustrates an example of a photograph of a back side surface of the control substrate.

Figure 31:
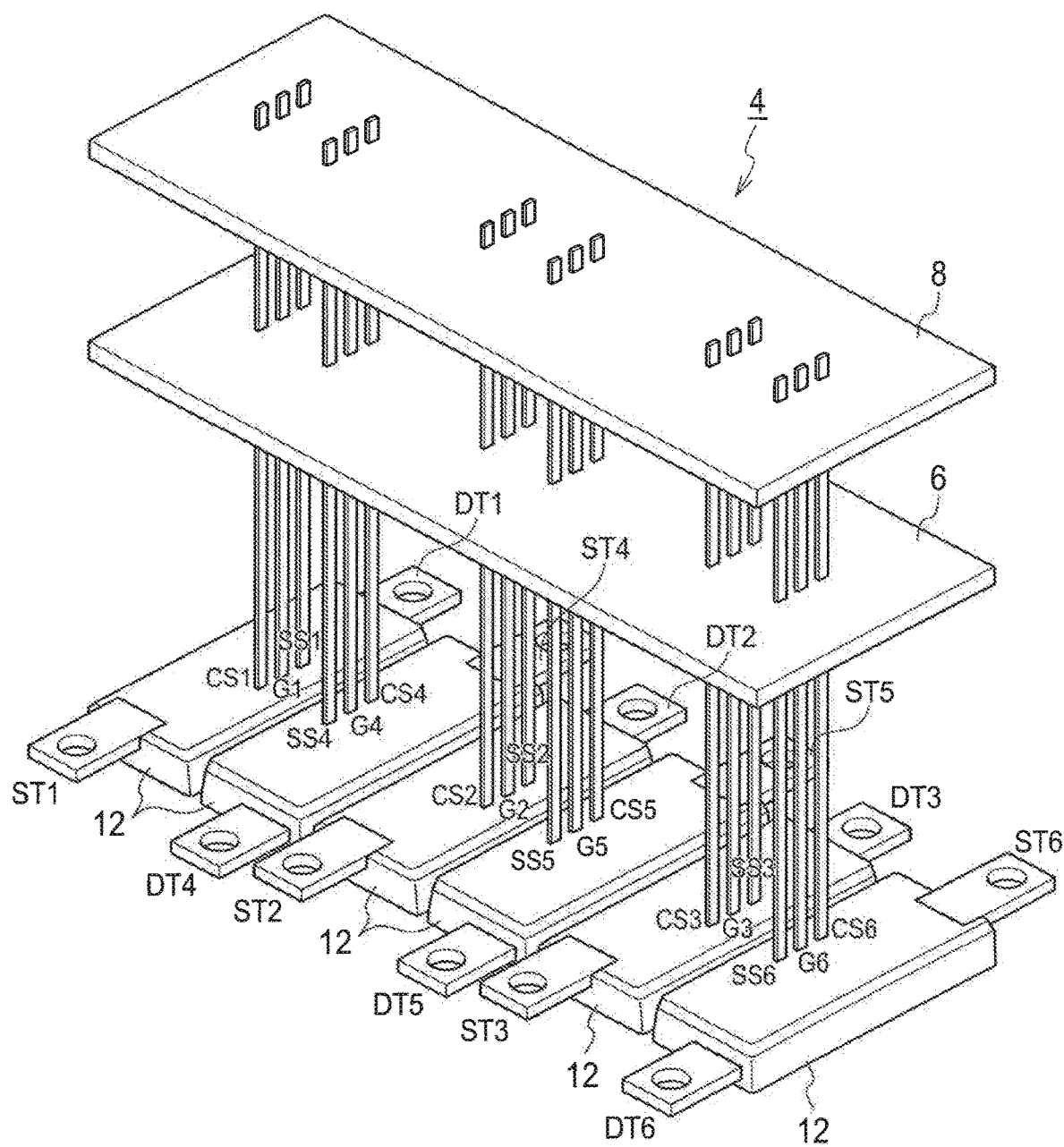
FIG. 31 is a schematic bird's-eye view of disposing a control substrate and a power source substrate on the three-phase AC inverter composed by disposing the six pieces of the power module semiconductor devices according to the first embodiment.

FIG. 31 illustrates a schematic bird's-eye view configuration of the control substrate 6 and the power source substrate 8 disposed on the three-phase AC inverter equipment 4 composed by arranging six pieces of the power module semiconductor devices 2 having the straight wiring structure according to the first embodiment. As shown in FIG. 31, the signal terminals (CS1, G1, SS1), (CS2, G2, SS2), (CS3, G3, SS3), (CS4, G4, SS4), (CS5, G5, SS5) and (CS6, G6, SS6) of the six pieces of the power module semiconductor devices 2 are respectively connected to the control substrate 6 and the power source substrate 8 in vertical direction, thereby composing the three-phase AC inverter equipment 4. Note that detailed patterns of the control substrate 6 and the power source substrate 8 are not shown in FIG. 31 for the purpose of simplification. Moreover, FIG. 31 illustrates so that the vertical distance between the power module semiconductor device 2, and the control substrate 6 and power source substrate 8 relatively long in order to clarify the details of structure, but the distance therebetween is shortened.

In the three-phase AC inverter equipment composed by arranging six pieces of the power module semiconductor devices 2 having the straight wiring structure according to the first embodiment, the control substrate, the power source substrate, the snubber capacitor C, etc. can be easily arranged in the vertically stacked structure, thereby slimming down the system.

Full Bridge Inverter Configuration

Figure 32:
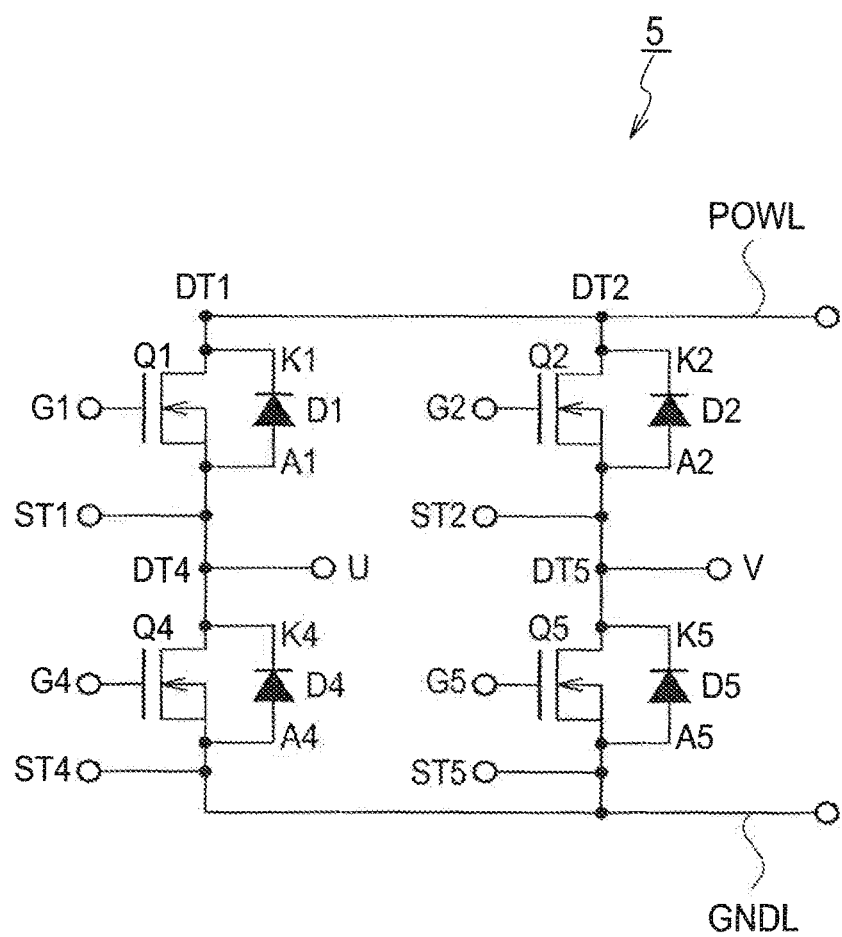
FIG. 32 is a circuit configuration diagram of a full bridge inverter composed by disposing four pieces of the power module semiconductor devices according to the first embodiment.

FIG. 32 illustrates a circuit configuration of a full bridge inverter equipment 5 composed by arranging four pieces of the power module semiconductor devices 2 having the straight wiring structure according to the first embodiment.

Figure 33:
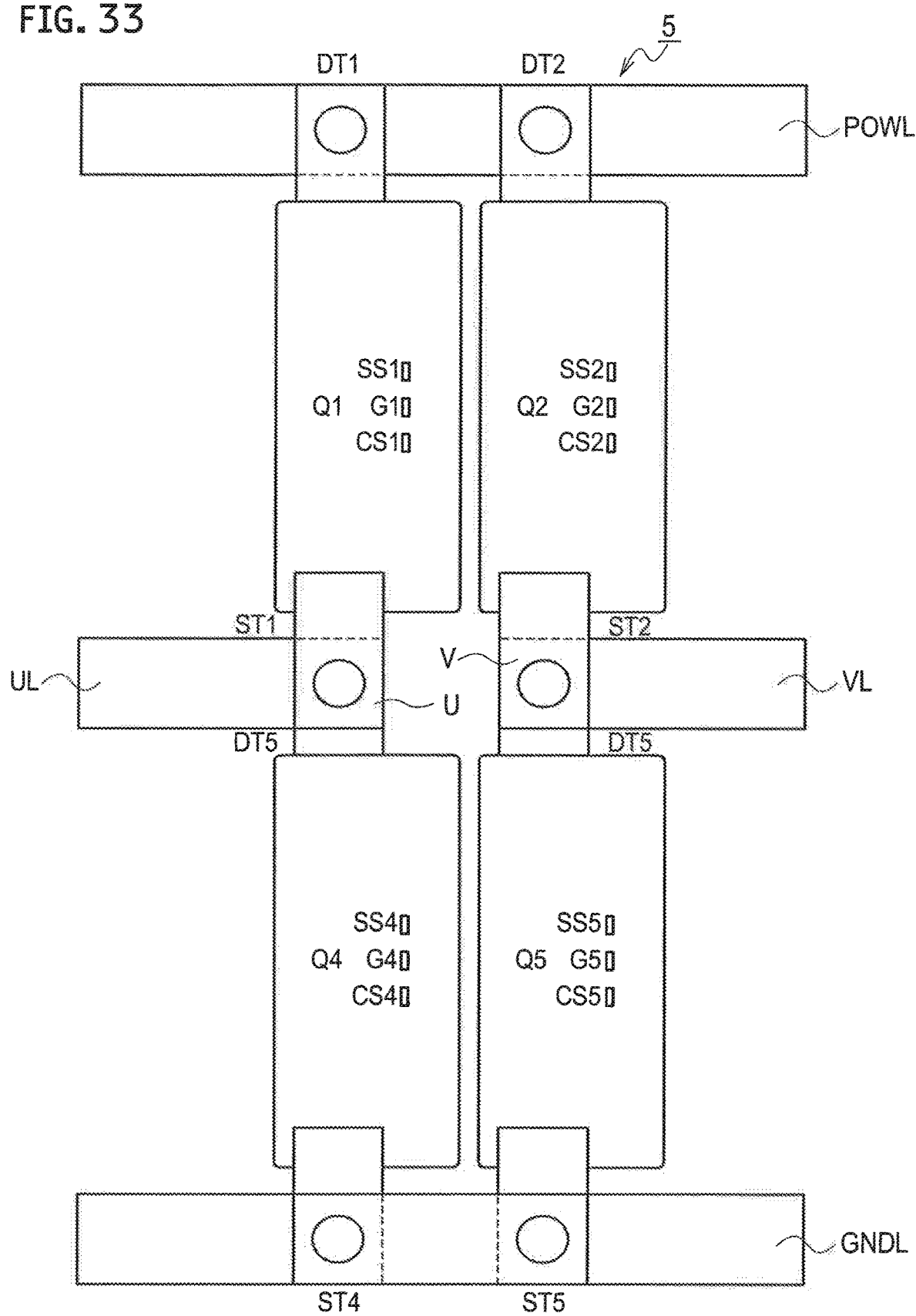
FIG. 33 is a schematic plane configuration diagram also including the connection electrodes (GNDL, POWL) connected between each power terminal of the full bridge inverter composed by disposing the four pieces of the power module semiconductor devices according to the first embodiment.

Moreover, FIG. 33 illustrates a schematic plane configuration also including connection wiring (bus bar) electrodes (GNDL, POWL) connected between each power terminal in the full bridge inverter equipment 5 composed by arranging the four pieces of the power module semiconductor devices 2 having the straight wiring structure according to the first embodiment.

Also in the full bridge inverter equipment composed by arranging four pieces of the power module semiconductor devices 2 having the straight wiring structure according to the first embodiment, the control substrate, the power source substrate, the snubber capacitor C, etc. can be easily arranged in the vertically stacked structure, thereby slimming down the system.

Configuration Example of Semiconductor Chip

Figure 34:
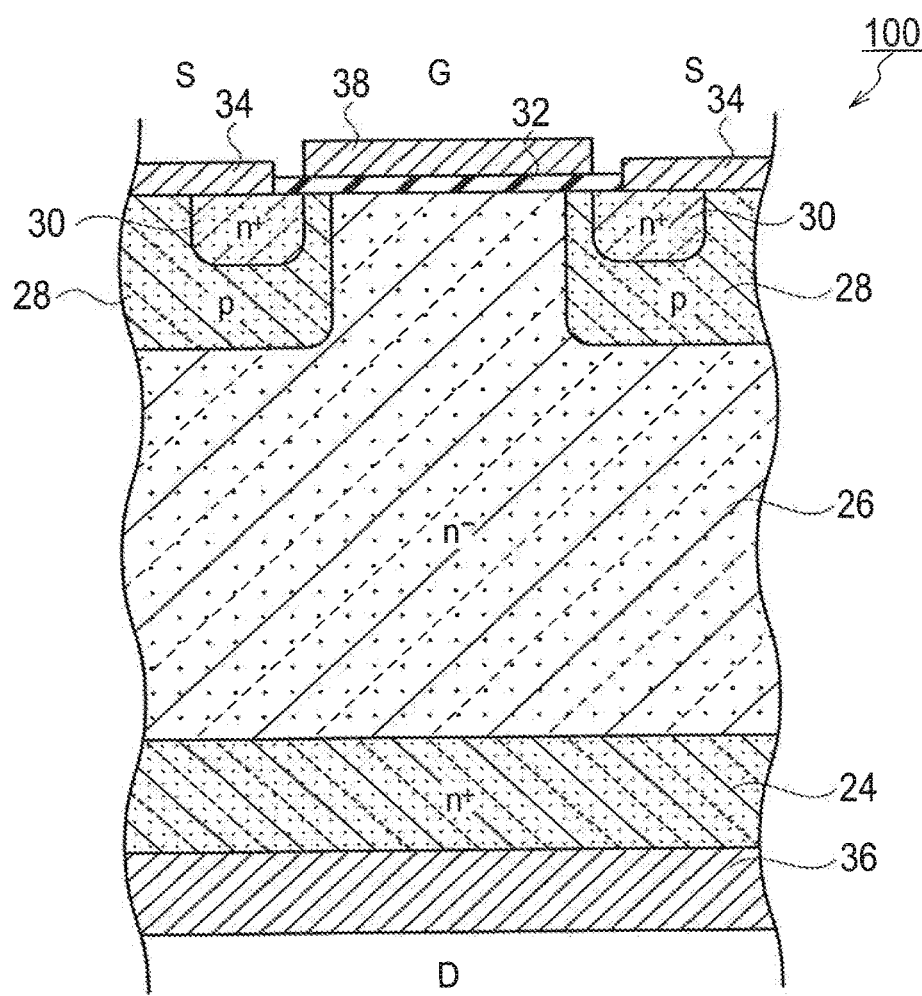
FIG. 34 is a schematic cross-sectional structure diagram of SiC Metal Oxide Semiconductor Field-Effect Transistor (MOSFET), which is an example of a semiconductor chip applied to the power module semiconductor device according to the first embodiment.

As shown in FIG. 34, the schematic cross-sectional structure of the SiC MOSFET as an example of the semiconductor chip 100(Q) applied to the power module semiconductor device 2 according to the first embodiment includes: a semiconductor substrate 26 composed of an n$^-$ type high resistivity layer; a p type base region 28 formed on the surface side of the semiconductor substrate 26; source regions 30 formed on the surface of the p type base regions 28; a gate insulating film 32 disposed on the surface of the semiconductor substrate 26 between the p type base regions 28; a gate electrode 38 disposed on the gate insulating film 32; a source electrode 34 connected to the source region 30 and the p type base region 28; an n$^+$ drain region 24 disposed on a back side surface opposite to the surface of the semiconductor substrate 26; and a drain pad electrode 36 connected to the n$^+$ drain region 24.

In FIG. 34, although the semiconductor chip 100 is composed of a planar-gate-type n channel vertical SiC-MOSFET, the semiconductor chip 100 may be composed of a trench-gate-type n channel vertical SiC-MOSFET, etc.

Moreover, a GaN based FET etc. instead of SiC MOSFET are also applicable to the semiconductor chip 100(Q) applied to the power module semiconductor device 2 according to the first embodiment.

Any one of an SiC based power device, a GaN based power device, and an AlN based power device is applicable to the semiconductor chip 100 applied to the power module semiconductor device 2 according to the first embodiment.

Furthermore, a semiconductor of which the bandgap energy is from 1.1 eV to 8 eV, for example, can be used for the semiconductor chip 100 applied to the power module semiconductor device 2 according to the first embodiment.

Figure 35:
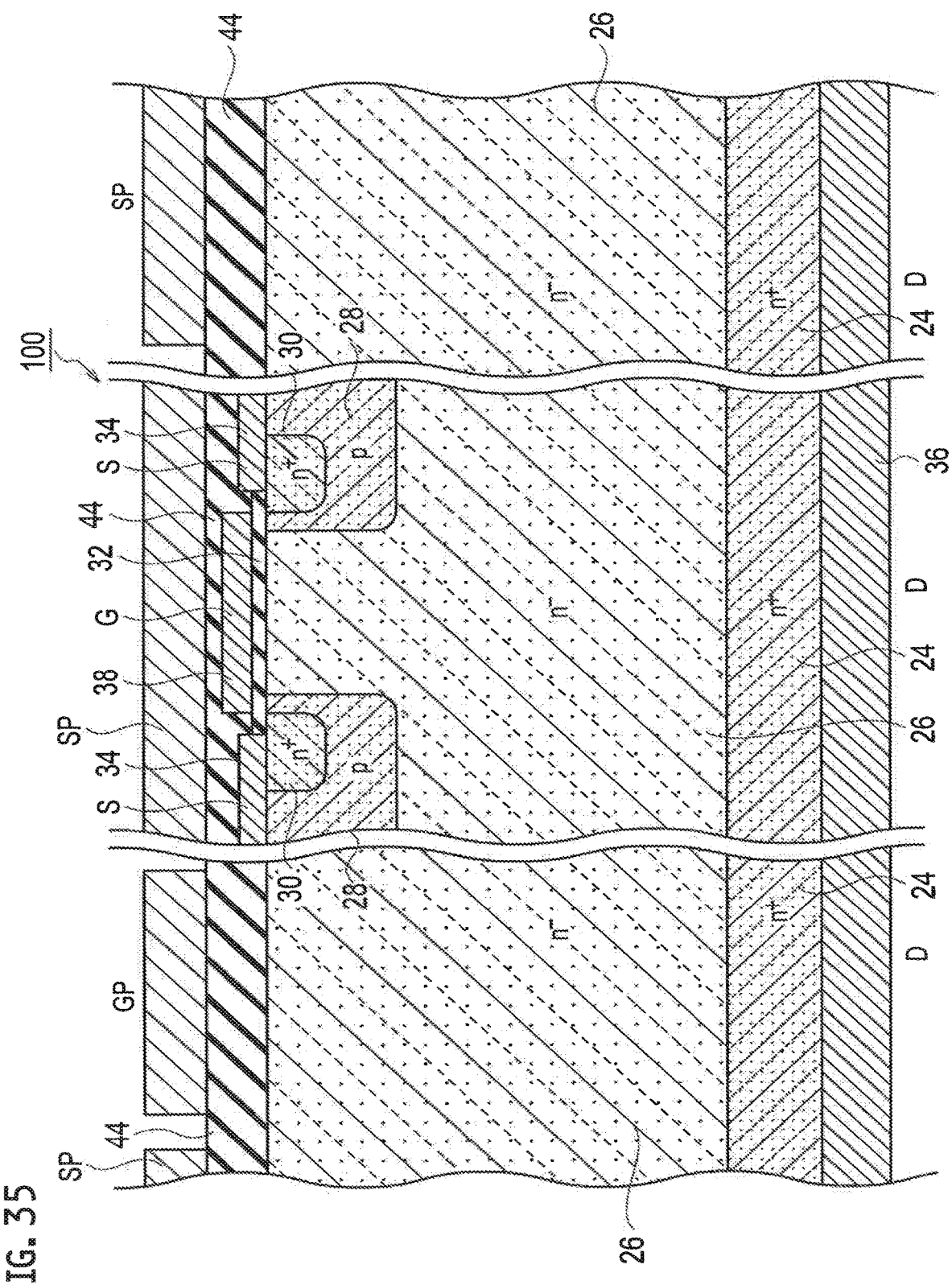
FIG. 35 is a schematic cross-sectional structure diagram showing the SiC MOSFET including a source pad electrode SP and a gate pad electrode GP, which is an example of the semiconductor chip applied to the power module semiconductor device according to the first embodiment.

FIG. 35 illustrates a schematic cross-sectional structure of an SiC MOSFET including a source pad electrode SP and a gate pad electrode GP, which is an example of the semiconductor chip 100 applied to the power module semiconductor device 2 according to the first embodiment. The gate pad electrode GP is connected to the gate electrode 38 disposed on the gate insulating film 32, and the source pad electrode SP is connected to the source electrode 34 connected to the source region 30 and the p type base region 28.

Moreover, as shown in FIG. 35, the gate pad electrode GP and the source pad electrode SP are disposed on an interlayer insulating film 44 for passivation which covers the surface of the semiconductor chip 100. An addition, microstructural transistor structure may be formed in the semiconductor substrate 26 below the gate pad electrode GP and the source pad electrode in the same manner as the center portion shown in FIG. 34 or 35 (not shown in FIG. 12).

Furthermore, as shown in FIG. 35, the source pad electrode SP may be disposed to be extended onto the interlayer insulating film 44 for passivation, also in the transistor structure of the center portion.

Figure 36:
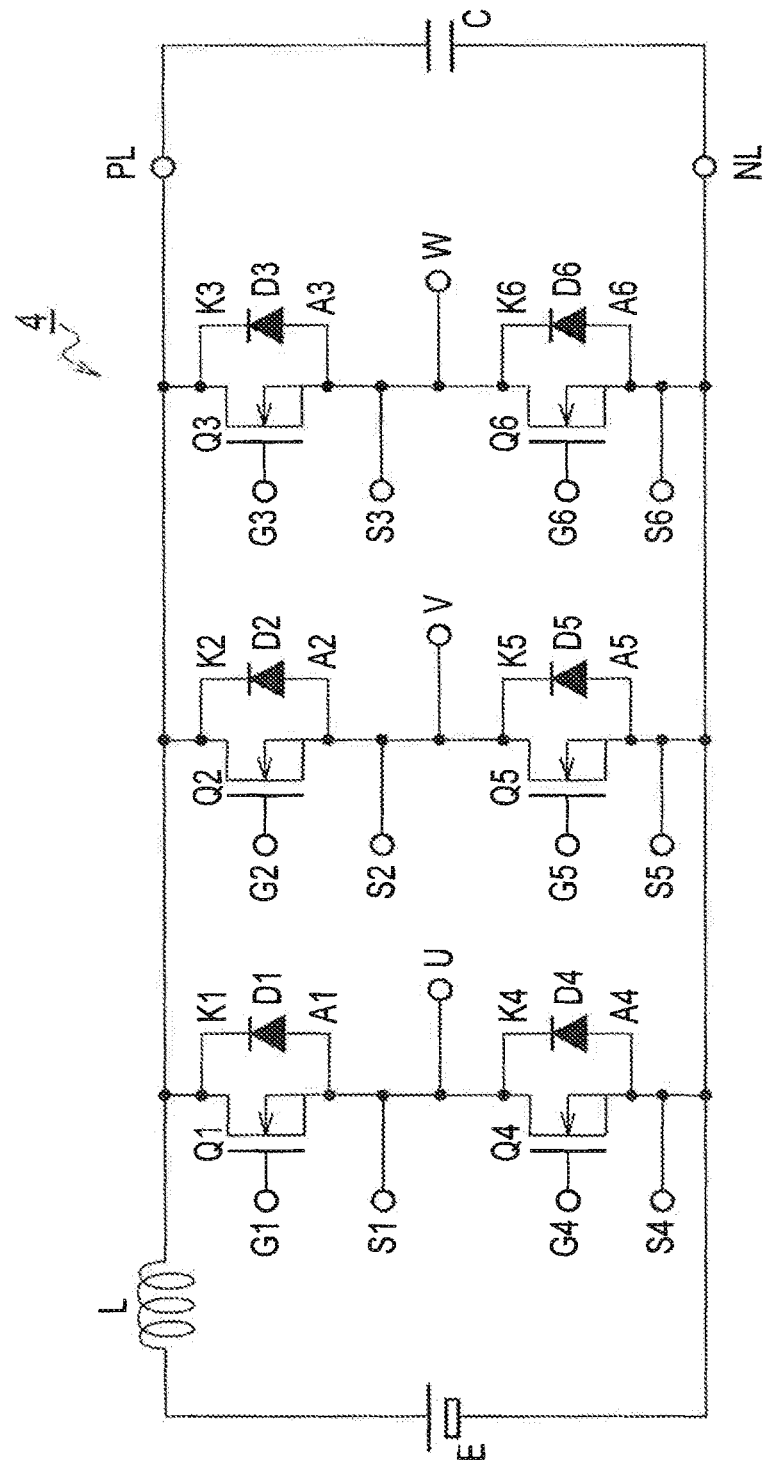
FIG. 36 is an example of a circuit configuration in which a snubber capacitor is connected between a power terminal PL and an earth terminal (ground terminal) NL in a schematic circuit configuration of the three-phase AC inverter composed using the power module semiconductor devices according to the first embodiment.

In the power module semiconductor device 2 according to the first embodiment, FIG. 36 illustrates a circuit configuration to connect the snubber capacitor C between the power terminal PL and the earth terminal (ground terminal) NL.

When connecting the power module semiconductor device 2 according to the first embodiment to the power source E, large surge voltage Ldi/dt is produced by an inductance L included in a connection line due to a high switching speed of the SiC device. For example, the surge voltage Ldi/dt is expressed as follows: Ldi/dt=3×10$^9$ (A/s), where a current change di=300 A, and a time variation accompanying switching dt=100 ns. Although a value of the surge voltage Ldi/dt changes dependent on a value of the inductance L, the surge voltage Ldi/dt is superimposed on the power source V. Such a surge voltage Ldi/dt can be absorbed by the snubber capacitor C connected between the power terminal PL and the earth terminal (ground terminal) NL.

Application Examples for Applying Semiconductor Device

Next, there will now be explained a three-phase AC inverter composed by using the power module semiconductor device 2 according to the first embodiment with reference to FIG. 37.

Figure 37:
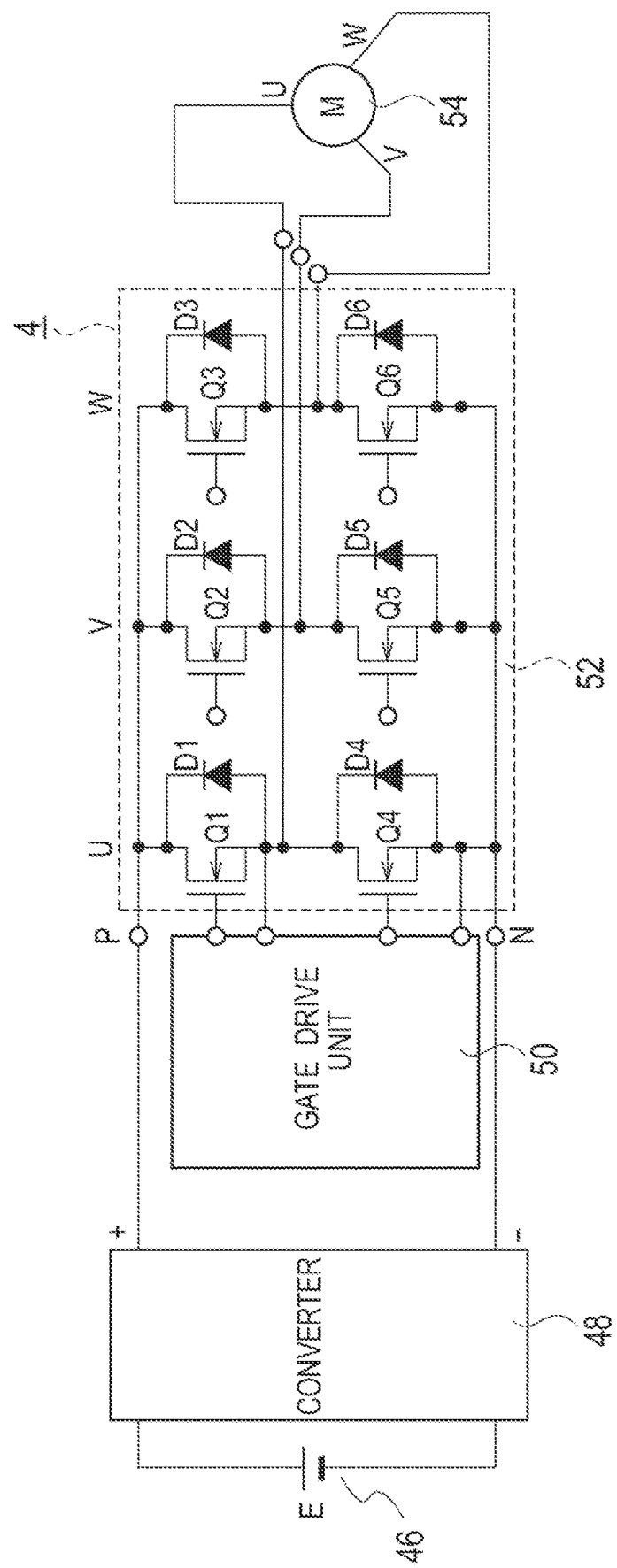
FIG. 37 is a schematic circuit configuration diagram of the three-phase AC inverter composed using the power module semiconductor devices according to the first embodiment.

As shown in FIG. 37, the three-phase AC inverter includes: a gate drive unit 50; a power module unit 52 connected to the gate drive unit 50 and a three-phase alternating current (AC) motor unit 54. Inverters of U phase, V phase and W phase are connected to the power module unit 52 corresponding to U phase, V phase, and W phase of the three-phase AC motor unit 54. In this case, although the gate drive unit 50 is connected to the SiC MOSFETs Q1, Q4 as shown in FIG. 35, the gate drive unit 50 is similarly connected also to the SiC MOSFETs Q2, Q5 and the SiC MOSFETs Q3, Q6 (not shown in FIG. 35).

In the power module unit 52, the SiC MOSFETs Q1, Q4, and Q2, Q5, and Q3, Q6 having inverter configurations are connected between a positive terminal (+) and a negative terminal (−) to which the converter 48 in a storage battery (E) 46 is connected. Furthermore, diodes D1-D6 are connected inversely in parallel to one another between the source and the drain of the SiC-MOSFETs Q1 to Q6.

Although the structure of the single phase inverter corresponding to U phase portion of FIG. 37 has been explained in the power module semiconductor device 2 according to the first embodiment, a three-phase power module unit 52 corresponding to V phase and/or W phase can also be formed in the same manner thereas.

Fabrication Method

FIG. 38A illustrates a schematic plane configuration of a carbon jig 400 used for a soldering process between the power terminals ST, DT and the signal terminals CS, G, SS in a fabrication method of the power module semiconductor device according to the first embodiment.

As shown in FIG. 38A, the carbon jig 400 includes: a ceramic substrate inserting unit 402 at the center thereof; and recessed region-shaped drain terminal DT mounting unit 401a and source terminal ST mounting unit 401b at both the right and left ends thereof.

FIG. 38B illustrates a schematic plane configuration showing an aspect of mounting the power module semiconductor device on the carbon jig 400 to perform the soldering process between the power terminals ST, DT and the signal terminals CS, G, SS.

Moreover, FIG. 39 illustrates a schematic cross-sectional structure diagram cutting a long-side direction of the carbon jig 400 mounted on a hot plate 403, wherein the power module semiconductor device 2 is mounted on the carbon jig 400. FIG. 39 corresponds to a schematic cross-sectional structure taken in the line XII-XII of FIG. 38B. The dashed line portions projectively show the relative positions of the signal terminals CS, G, SS.

The signal terminals CS, G, SS can be respectively soldered to the electrode patterns CSP, GSP, SSP by heating the hot plate 403. Similarly, the power terminals ST, DT can be soldered to the pillar connection electrode $18_n$ and the first pattern 10a(D) of the power module semiconductor device 2. In this case, if using high melting point solder, the hot plate 403 should be heated at approximately 340 degrees C. to approximately 360 degrees C.

In the fabrication method of the power module semiconductor device according to the first embodiment, the parallelism of the power terminals ST, DT and the ceramic substrate 10 is securable by using the carbon jig 400 having such a structure shown in FIGS. 38-39.

Figure 40:
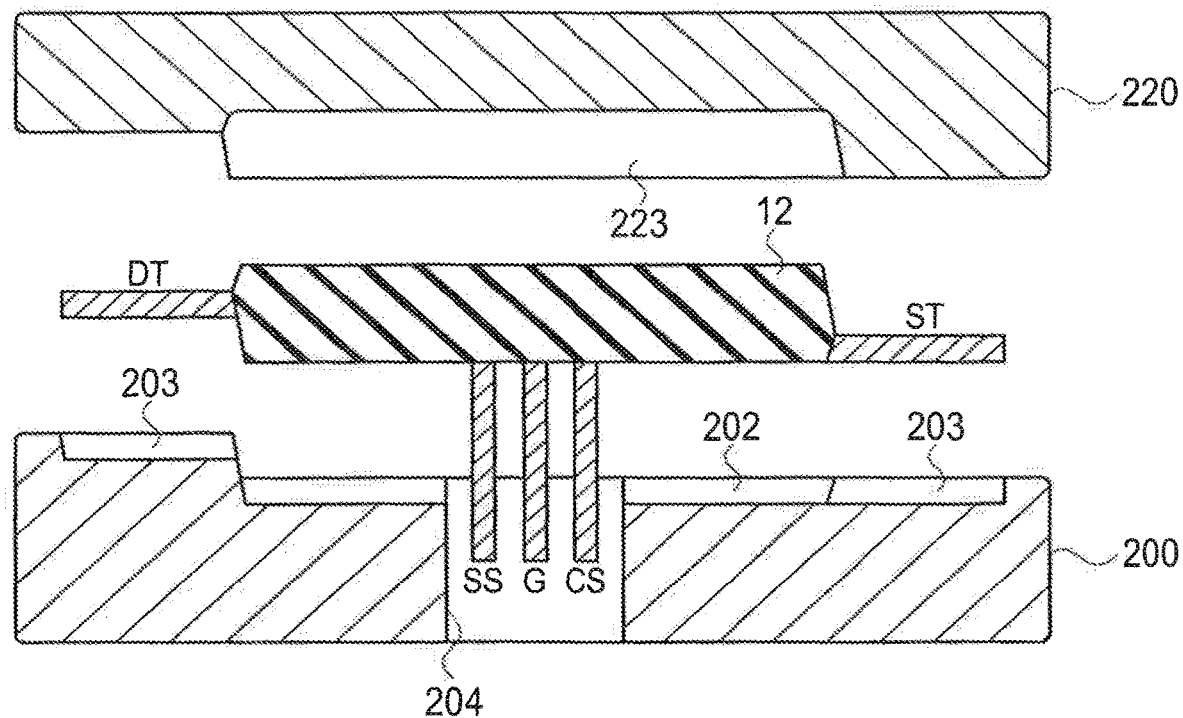
FIG. 40 is a schematic cross-sectional structure diagram for explaining a process of sealing a transfermold resin, in the fabrication method of the power module semiconductor device according to the first embodiment.

FIG. 40 illustrates a schematic cross-sectional structure for explaining a process of sealing the transfermold resin, in the fabrication method of a power module semiconductor device according to the first embodiment. FIG. 40 shows an aspect that the power module semiconductor device is turned upside down to be sandwiched with an upper metallic mold 220 and a lower metallic mold 200, and then the upper metallic mold 220 and the lower metallic mold 200 are removed after forming the resin layer 12 by injecting a transfermold resin thereinto. In FIG. 40, reference numerals 202, 203 respectively denote a main unit mounting unit and a terminal mounting unit, reference numeral 204 denotes a housing unit of the signal terminals CS, G, SS, and reference numeral 223 denotes a resin injection part.

In the fabrication method of a power module semiconductor device according to the first embodiment, stepped terminal structure of the power terminals ST, DT is realized by using the upper metallic mold 220 and the lower metallic mold 200 shown in FIG. 40.

According to the first embodiment, there can be provided the low series inductance inverter system with the power module semiconductor device having the straight wiring structure and the 1-in-1 trusted platform module (TPM).

Metallic Mold

Hereinafter, there will now be explained a configuration of a metallic mold used in the fabrication method of the power module semiconductor device according to the first embodiment, with reference to FIGS. 41-46.

The metallic mold applied in the fabrication method of a power module semiconductor device according to the first embodiment includes: a main unit mounting unit of the power module semiconductor device; a terminal mounting unit of the power terminal of the power module semiconductor device; a lower metallic mold including a fixing mechanism configured to fix the signal terminal of the power module semiconductor device; and an upper metallic mold engaged with the lower metallic mold.

The fixing mechanism includes: a first block member including a linear guide groove to guide the signal terminal; a second block member including a protruding portion engaged with the guide groove, the second block member configured to slide movably forward and backward with respect to the first block member; and a third block member engaged with the second block member to press the second block member against the first block member side, wherein the surface of the second block member opposite to the third block member has a downward inclined surface inclined in a downward direction, and a surface of the third block member opposite to the second block member has an upward inclined surface inclined in an upward direction.

The lower metallic mold includes a rectangular-shaped housing unit, and then the fixing mechanism is housed in the housing unit.

Each of the first block member and the third block member includes a screw hole into which a locking screw screwed in the lower metallic mold side in the housing unit can be inserted. When the locking screw is screwed and moves to the lower metallic mold, the third block member produces a suppress strength in a direction toward the first block member with respect to the second block member by the engagement between the inclined surfaces.

Each of the first block member and the second block member includes a screw hole in which a jack-up screw is screwed.

The screw hole into which the locking screw of the first block member can be inserted also functions as a screw hole into which the jack-up screw is screwed.

Figure 41A:
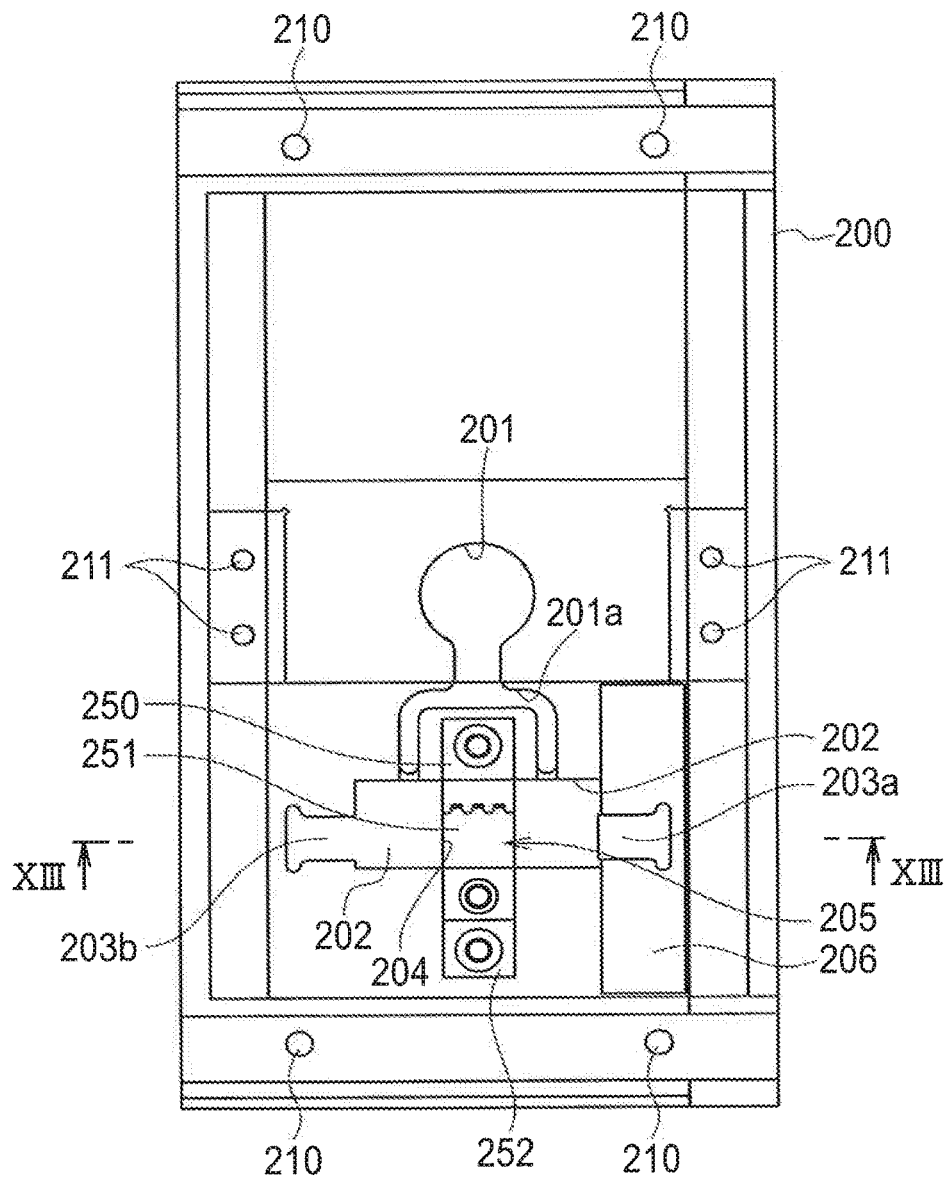
FIG. 41A is a top view diagram of a lower metallic mold used in the fabrication method of the power module semiconductor device according to the first embodiment.
Figure 41B:
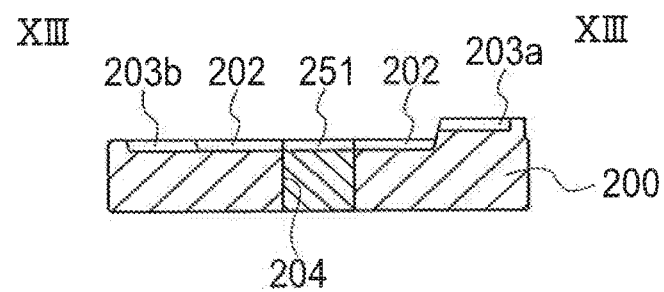
FIG. 41B is a schematic cross-sectional structure diagram taken in the line XIII-XIII of FIG. 41A.

FIG. 41A is a top view diagram of the lower metallic mold 200 used in the fabrication method of the power module semiconductor device according to the first embodiment. FIG. 41B is a schematic cross-sectional structure diagram taken in the line XIII-XIII of FIG. 41A.

The lower metallic mold 200 is formed of a metallic plate made of ferrous materials etc. subjected to cutting process etc., for example.

As shown in FIG. 41A, a resin introducing hole 201 passing through the lower metallic mold 200 is formed at approximately center of the lower metallic mold 200.

Moreover, a guide groove 201a for guiding a resin introduced from the introducing hole 201 is formed at a lower part of the introducing hole 201.

A main unit mounting unit 202 configured to mount a main unit of the semiconductor chip thereon to be molded, and terminal mounting units 203a, 203b configured to mount the drain terminal DT and the source terminal ST of the semiconductor chip thereon are formed at a lower part of the guide groove 201a.

In addition, as shown in FIG. 41B, the terminal mounting unit 203a configured to mount the power terminal DT of the power module semiconductor device thereon is formed in a position higher than that of the terminal mounting unit 203b configured to mount the power terminal ST thereon, in accordance with a shape of the power module semiconductor device.

Moreover, as shown in FIG. 41B, the housing unit 204 of the fixing mechanism 205 in the power module semiconductor device is formed so as to pass through the center portion of the main unit mounting unit 202.

In addition, bolt holes 210, 211 each into which a bolt for fixing the lower metallic mold 200 itself to a molding machine is inserted are formed in an edge of the lower metallic mold 200.

Figure 42A:
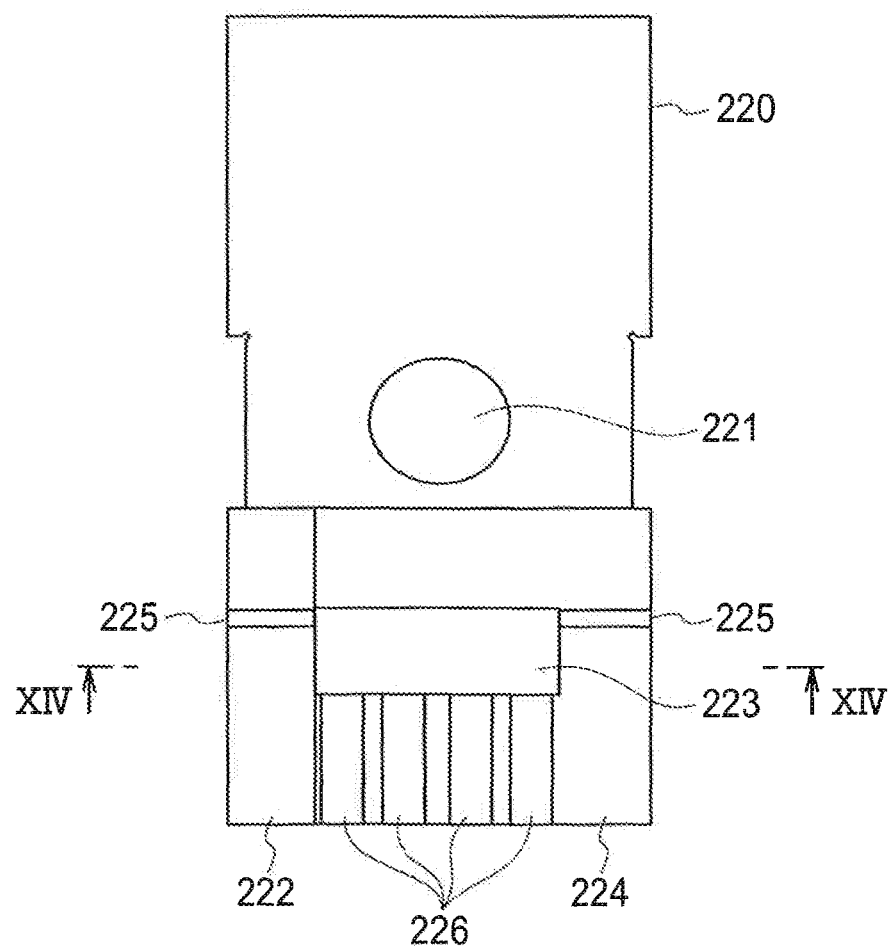
FIG. 42A is a top view diagram of an upper metallic mold used in the fabrication method of the power module semiconductor device according to the first embodiment.
Figure 42B:
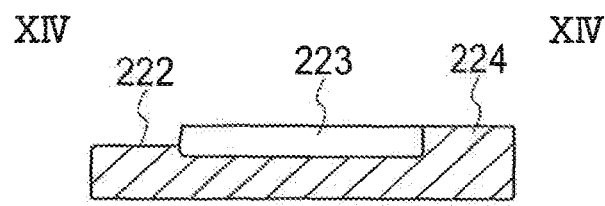
FIG. 42B is a schematic cross-sectional structure diagram taken in the line XIV-XIV of FIG. 42A.

FIG. 42A is a top view diagram of the upper metallic mold 220 used in the fabrication method of the power module semiconductor device according to the first embodiment. FIG. 42B is a schematic cross-sectional structure diagram taken in the line XIV-XIV of FIG. 42A.

The upper metallic mold 220 is formed of a metallic plate made of ferrous materials etc. subjected to cutting process etc., for example.

As shown in FIG. 42A, a resin introducing hole 221 passing through the upper metallic mold 220 is formed at approximately center of the upper metallic mold 220.

A resin injection part 223 into which a resin is injected at the time of being superposed on the lower metallic mold 200 is formed at a lower part of the introducing hole 221.

Moreover, bank portions 222, 224 for sealing the resin injection part 223 so as to be abutted on the lower metallic mold 200 are formed in an outermost layer of the resin injection part 223.

Figure 45A:
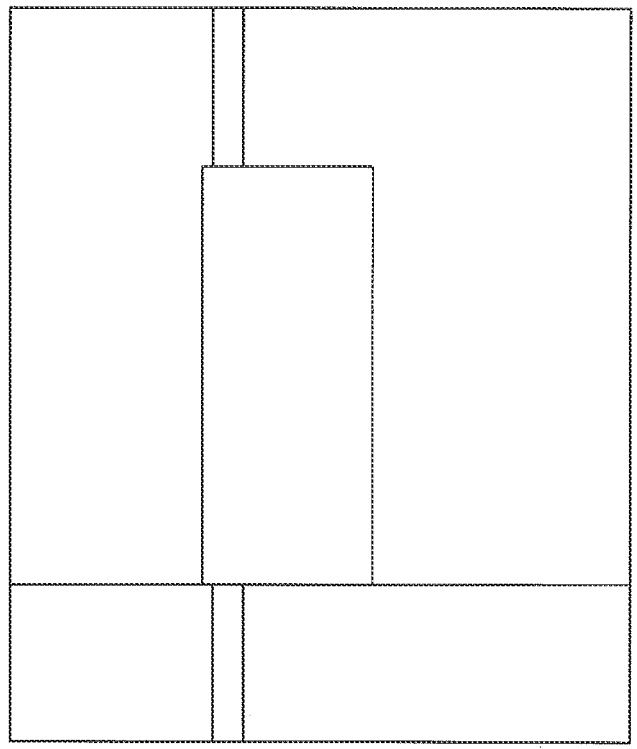
FIG. 45A is a planar photographic view showing a part of the upper metallic mold used in the fabrication method of the power module semiconductor device according to the first embodiment.
Figure 45B:
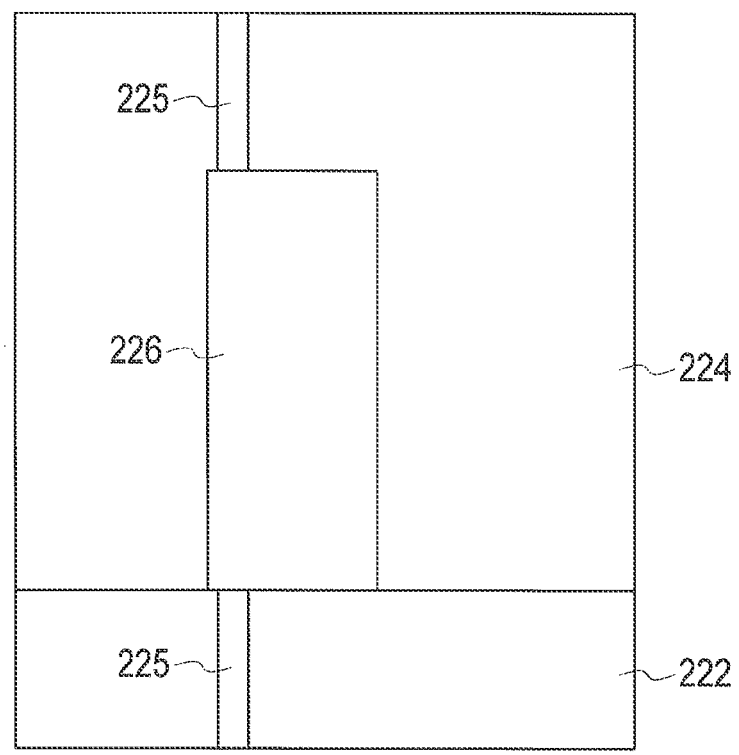
FIG. 45B is a top view diagram showing the part of the upper metallic mold.

As shown in FIGS. 42A and 45, when resin is injected, air vents 225, 226 for venting an air from the resin injection part 223 etc. are respectively formed at bank portions 222, 224.

Figure 43A:
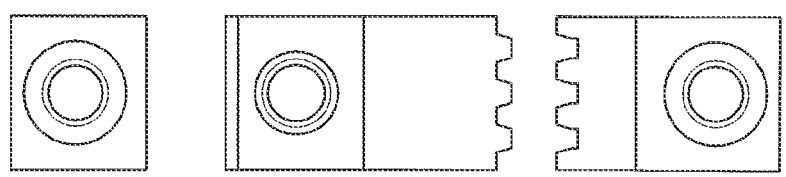
FIG. 43A is a planar photographic view showing a fixing mechanism of the semiconductor chip used in the fabrication method of the power module semiconductor device according to the first embodiment.
Figure 43B:
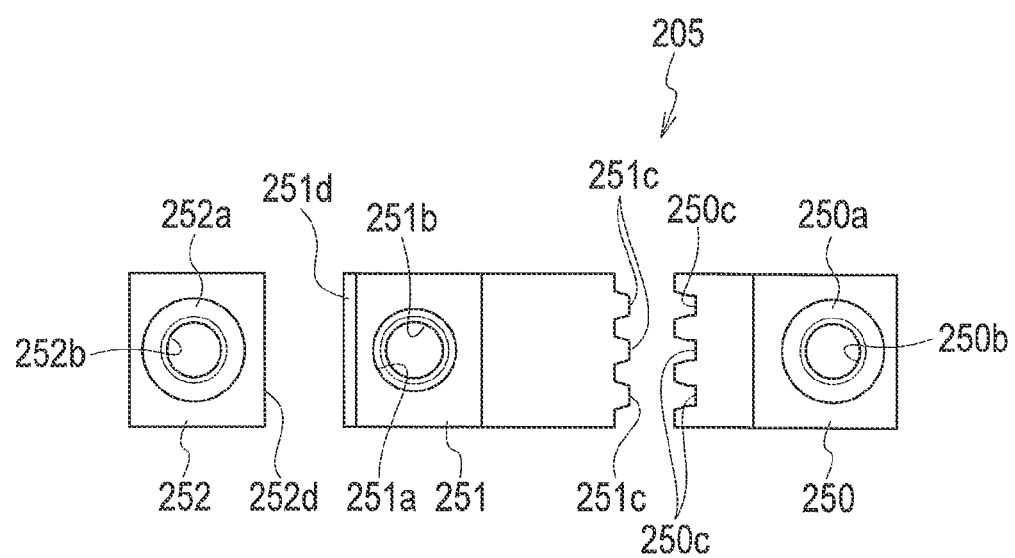
FIG. 43B is a top view diagram of the fixing mechanism of the semiconductor chip.
Figure 44A:
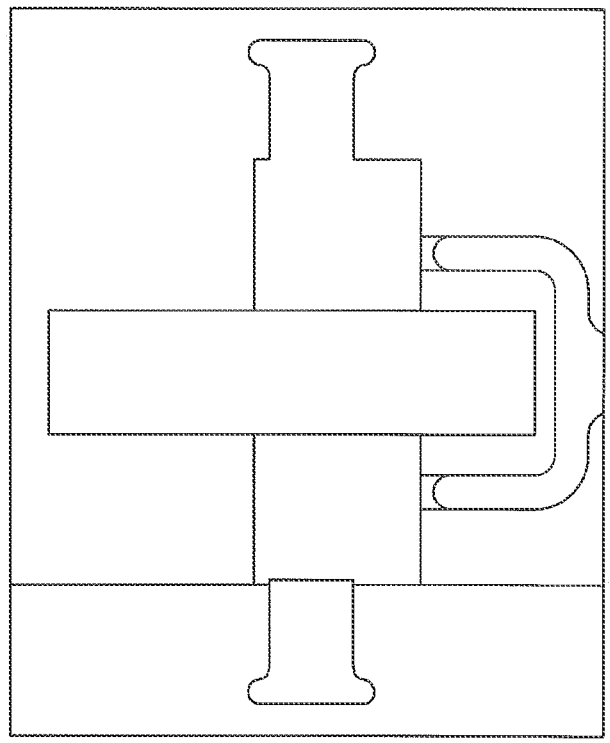
FIG. 44A is a planar photographic view showing a part of the lower metallic mold used in the fabrication method of the power module semiconductor device according to the first embodiment.
Figure 44B:
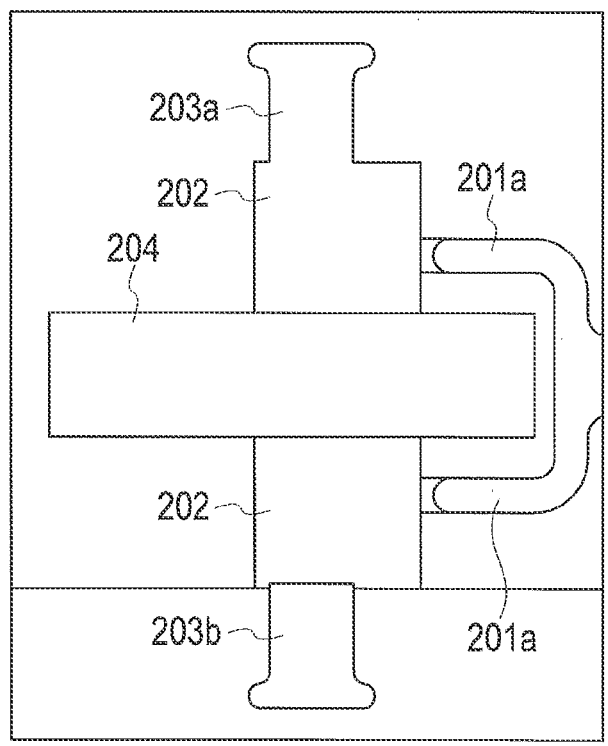
FIG. 44B is a top view diagram showing the part of the lower metallic mold.

FIG. 43A is a planar photographic view of the fixing mechanism 205 used in the fabrication method of the power module semiconductor device according to the first embodiment, and FIG. 43B is a top view diagram of the fixing mechanism 205.

As shown in FIG. 43, the fixing mechanism 205 is composed of three metal first block member 250, second block member 251, and third block member 252.

A screw hole 250b into which a locking screw 280 can be inserted (refer to FIG. 47), and a receiving hole 250a for receiving a head of the locking screw are formed in the first block member 250. The locking screw 280 is used for fixing the block member 250 to the lower metallic mold 200.

Moreover, guide grooves 250c for respectively guiding the signal terminals SS, G, CS in a height direction of the second block member 251 are formed on a surface of the second block member 251 opposite to the first block member 250.

In addition, a female screw formed in the screw hole 250b is not screwed with a male screw of the locking screw 280 keeping a predetermined air gap, but is screwed with a male screw of the jack-up screw 282 mentioned below (refer to FIG. 54).

On the other hand, the second block member 251 is a structural member housed in the housing unit 204 of the lower metallic mold 200 so as to be close to or keep a spacing to the fixed first block member 250.

A screw hole 251b in which a female screw screwed in the jack-up screw 283 (refer to FIG. 54) is formed, and a receiving hole 251a for receiving a head of the jack-up screw 283 are formed in the second block member 251.

Moreover, protruding portions 251c respectively engaged with three pieces of the guide grooves 250c are formed at a surface of the first block member 250 opposite to the guide groove 250c.

When the guide groove 250c of the first block member 250 and the protruding portion 251c of the second block member 251 are engaged with each other, a predetermined gap is formed between the both, as shown in FIG. 46. Thus, signal terminals SS, G, CS are finally held in a state of being slightly pressed.

Figure 49A:
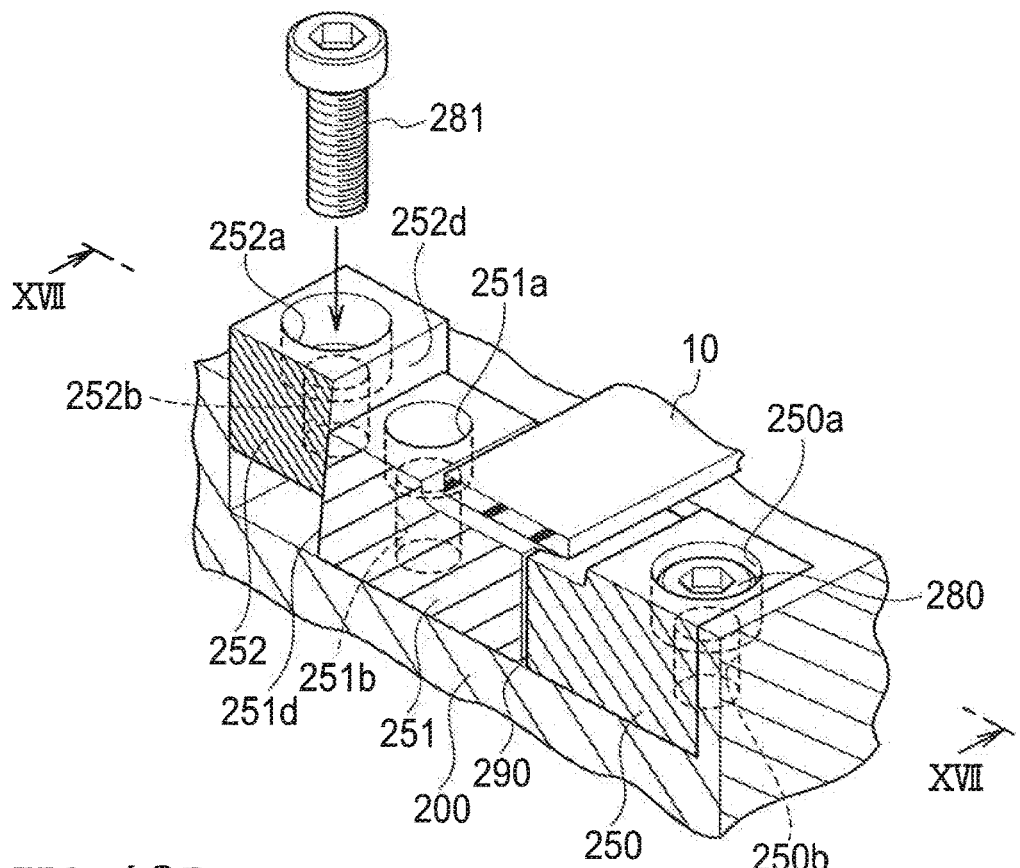
FIG. 49A is a perspective diagram showing a state of the fixing mechanism of the semiconductor chip in a third molding process of the power module semiconductor device according to the first embodiment.
Figure 49B:
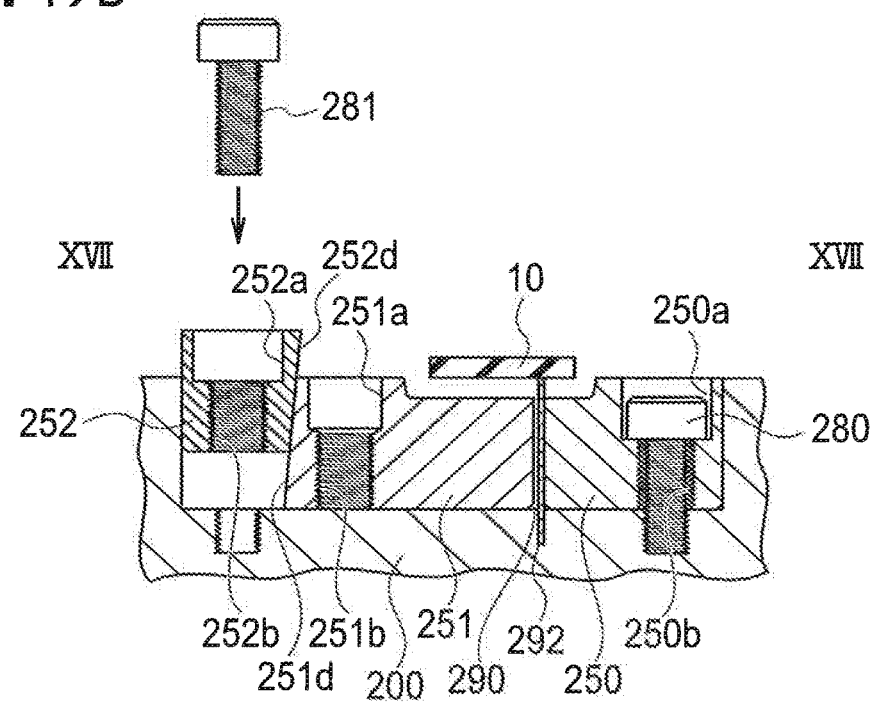
FIG. 49B is a schematic cross-sectional structure diagram taken in the line XVII-XVII of FIG. 49A.

Moreover, an inclined surface 251d as shown in FIG. 49B etc. is formed on a side opposite to the third block member 252.

The third block member 252 is a member engaged with the second block member 251, in order to move the second block member 251 to be pressed against the first block member 250 side.

A screw hole 252b into which a locking screw 281 can be inserted (refer to FIG. 49, etc.), and a receiving hole 252a for receiving a head of the locking screw 281 are formed in the third block member 252. The locking screw 281 is used for fixing the block member 252 to the lower metallic mold 200.

Moreover, an inclined surface 252d as shown in FIG. 49B etc. is formed on a side opposite to the second block member 251.

Figure 46A:
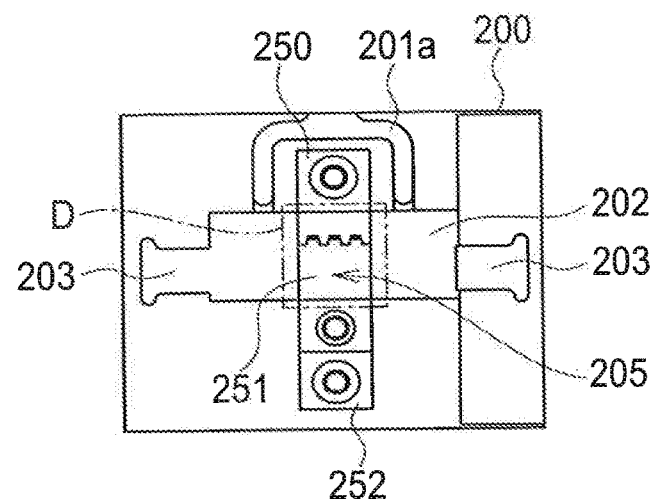
FIG. 46A is a top view diagram showing a state where the fixing mechanism of the semiconductor chip is mounted on the lower metallic mold used in the fabrication method of the power module semiconductor device according to the first embodiment.
Figure 46B:
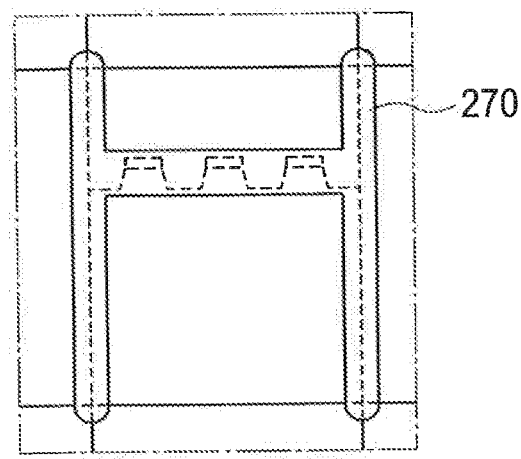
FIG. 46B is an enlarged view of the part D of FIG. 46A.

FIG. 46A is a top view diagram showing a state where the fixing mechanism 205 is mounted on the lower metallic mold, and FIG. 46B is an enlarged view of a part D of FIG. 46A.

If molding (resin sealing) is conducted in a state of the power module semiconductor device is mounted on the fixing mechanism 205, the resin is slightly protruded from a minute gap between the lower metallic mold 200 and the upper metallic mold 220, and thereby a fin 270 of resin are formed as shown in FIG. 46B. Such a fin 270 will be removed after the molding of the power module semiconductor device is completed.

Molding Process

There will be explained in detail a molding process in the fabrication method of the power module semiconductor device according to the first embodiment, with reference to FIGS. 47-54. Hereinafter, the molding process explained using FIG. 32 in detail will be explained.

The fabrication method of the power module semiconductor device according to the first embodiment includes: mounting the power module semiconductor device on a lower metallic mold, the lower metallic mold including a main unit mounting unit of the power module semiconductor device, a terminal mounting unit of a power terminal of the power module semiconductor device, and fixing mechanism configured to fix a signal terminal of the power module semiconductor device thereto; fixing the signal terminal to the fixing mechanism; engaging the lower metallic mold with an upper metallic mold; injecting a resin to a space for resin injection formed between the lower metallic mold and the upper metallic mold; removing the upper metallic mold from the lower metallic mold; and removing the resin sealed power module semiconductor device.

In this case, the step of fixing the signal terminal to the fixing mechanism includes: engaging the signal terminal with a guide groove of a first block member fixed in the housing unit of the lower metallic mold; slidably mounting a second block member in the housing unit in a state where a protruding portion is opposite to the guide groove side; and pressing the second block member against the first block member side by disposing a third block member in a state of being contacted with a downward inclined surface of the second block member, and then screwing a locking screw inserted in a screw hole of the third block member in the lower metallic mold.

The step of removing the power module semiconductor device includes: inserting a jack-up screw in a screw hole for jack-up formed in the first block member and the second block member; and clamping the jack-up screw to jack up the first block member and the second block member from the lower metallic mold side.

Figure 47A:
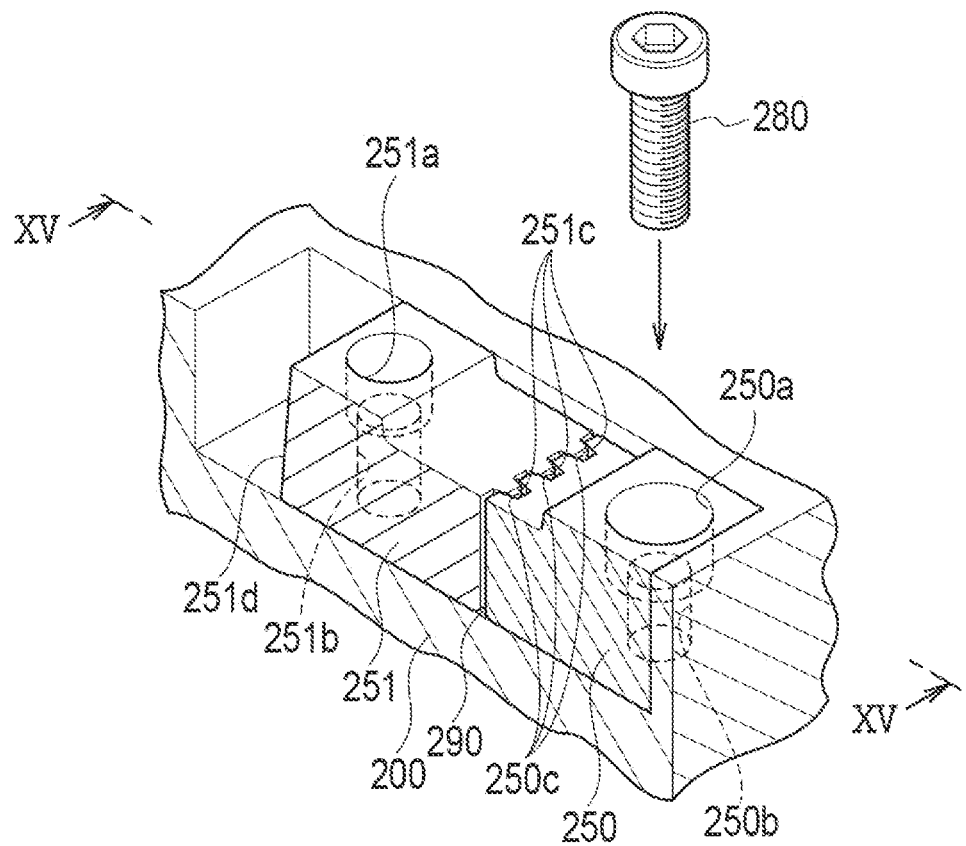
FIG. 47A is a perspective diagram showing a state of the fixing mechanism of the semiconductor chip in a first molding process of the power module semiconductor device according to the first embodiment.
Figure 47B:
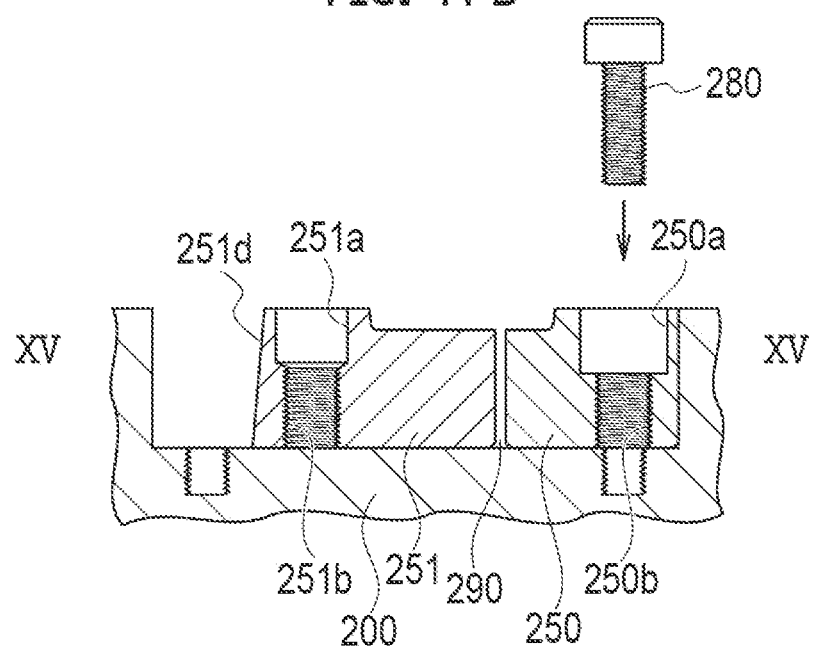
FIG. 47B is a schematic cross-sectional structure diagram taken in the line XV-XV of FIG. 47A.

Firstly, as a first molding process, as shown in FIGS. 47A and 47B, the locking screw 280 is inserted in the screw hole 250*b* of the first block member 250 composing the fixing mechanism 205, in order to be fixed to the lower metallic mold 200.

In addition, although not shown in FIG. 47 etc., the first block member 250 is actually fixed in a state of being housed in the housing unit 204 of the lower metallic mold 200.

Moreover, the second block member 251 is mounted in the housing unit 204 not shown in FIG. 47 in a state of securing a gap 290 with respect to the first block member 250.

Figure 48A:
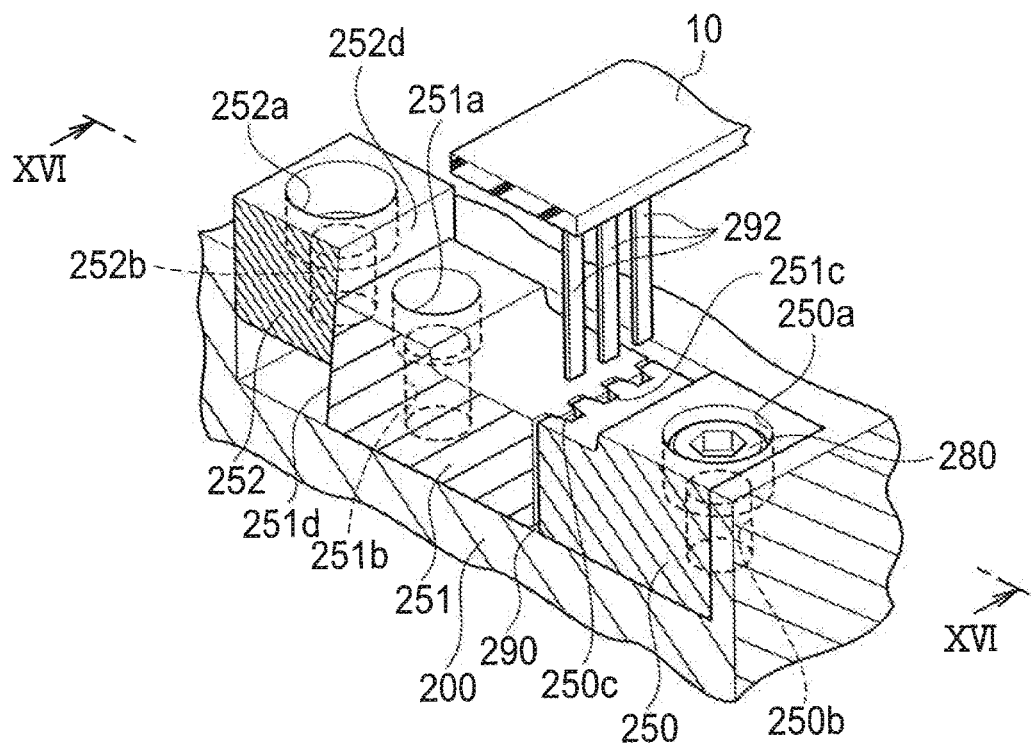
FIG. 48A is a perspective diagram showing a state of the fixing mechanism of the semiconductor chip in a second molding process of the power module semiconductor device according to the first embodiment.
Figure 48B:
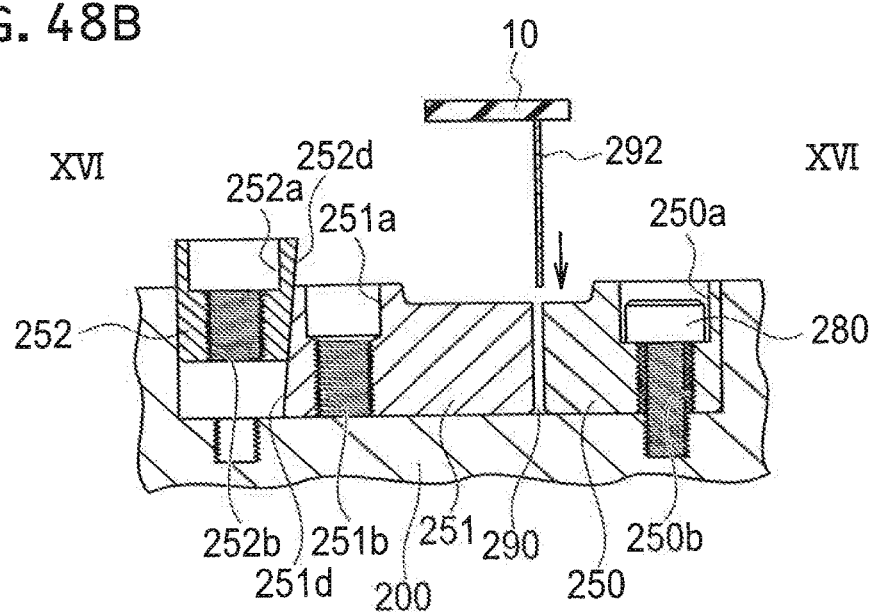
FIG. 48B is a schematic cross-sectional structure diagram taken in the line XVI-XVI of FIG. 48A.

Subsequently, as a second molding process, as shown in FIGS. 48A and 48B, the ceramic substrate 10 is mounted thereon so that signal terminals 292 can be settled in the gap 290 between the first block member 250 and the second block member 251. Although only a ceramic substrate 10 is illustrated in FIGS. 48A and 48B for the purpose of a simplification, the power module semiconductor device 2 according to the first embodiment after an electrode forming metalization process of the power terminals ST, DT and the signal terminals CS, G, SS is actually mounted thereon.

More specifically, the ceramic substrate 10 is set therein so that the signal terminals 292 can be settled in the guide grooves 250*c* of the first block member 250 shown in FIG. 43. The signal terminals 292 shown therein respectively correspond to the signal terminals CS, G, SS.

The third block member 252 is set in the housing unit 204 (not shown) along the second block member 251.

More specifically, the third block member 252 is set therein so that the inclined surface 251*d* at the side of the second block member 251 is contacted with the inclined surface 252*d* at the side of the third block member 252, as shown in FIG. 48B.

Figure 50A:
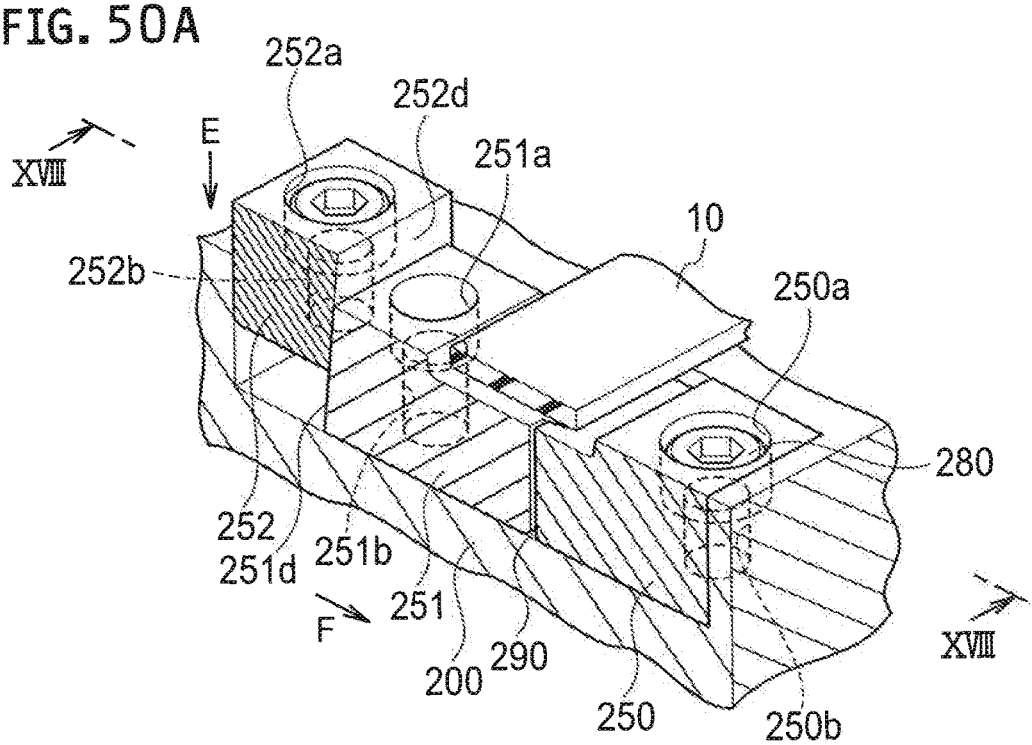
FIG. 50A is a perspective diagram showing a state of the fixing mechanism of the semiconductor chip in a fourth molding process of the power module semiconductor device according to the first embodiment.
Figure 50B:
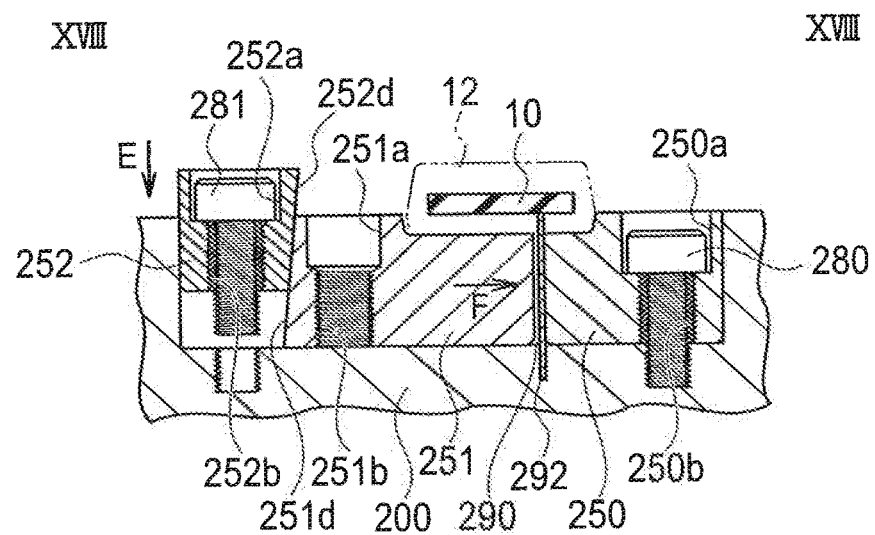
FIG. 50B is a schematic cross-sectional structure diagram taken in the line XVIII-XVIII of FIG. 50A.

Subsequently, as a third molding process as shown in FIGS. 49A and 49B, the locking screw 281 is inserted in the screw hole 252*b* of the third block member 252, and then as s fourth molding process as shown in FIGS. 50A and 50B, the locking screw 281 is clamped to the lower metallic mold 200. Although only the ceramic substrate 10 is illustrated in FIGS. 49A, 49B, 50A and 50B for the purpose of simplification, the power module semiconductor device 2 according to the first embodiment before the resin molding and after the electrode forming metalization processing of the power terminals ST, DT and the signal terminals CS, G, SS is actually mounted thereon in the same manner as that shown in FIGS. 48A and 48B.

Thus, as shown in FIGS. 50A and 50B, a force in a direction of arrow E acts on the third block member 252 itself via the receiving hole 252*a* of the head of screw. The force of the arrow direction E is converted into a suppress strength in an arrow direction F which acts on the second block member 251 due to an action between the inclined surface 252*d* at the side of the third block member 252 and the inclined surface 251*d* at the side of the second block member 251, as shown in FIGS. 50A and 50B.

The protruding portion 251*c* of the second block member 251 is pressed against the guide groove 250*c* side of the first block member 250 due to the suppress strength in the arrow direction F.

Figure 51A:
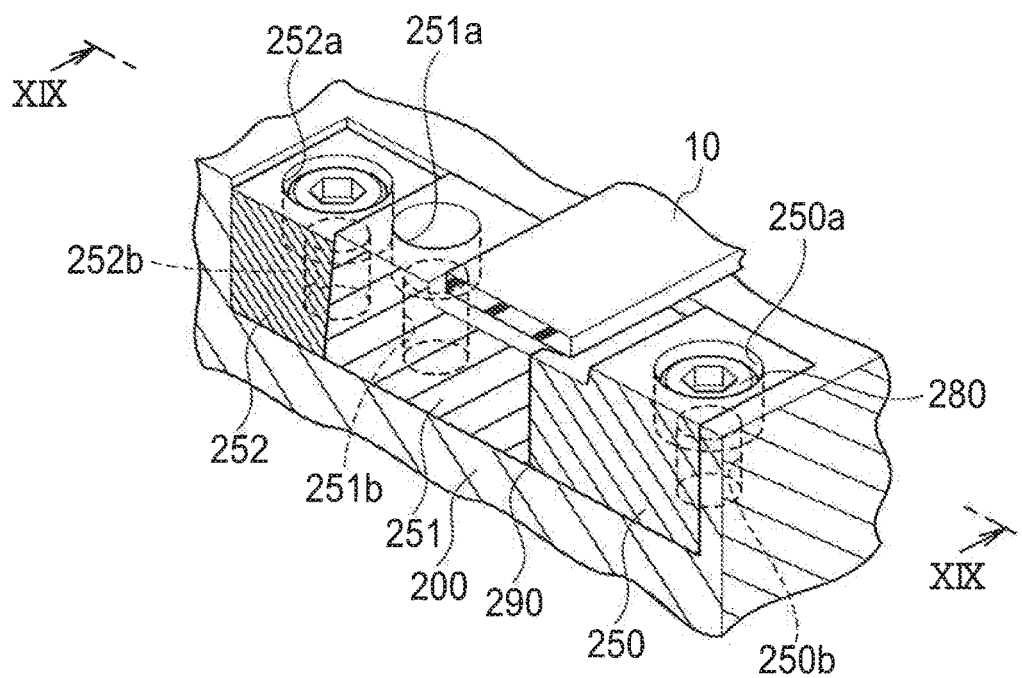
FIG. 51A is a perspective diagram showing a state of the fixing mechanism of the semiconductor chip in a fifth molding process of the power module semiconductor device according to the first embodiment.
Figure 51B:
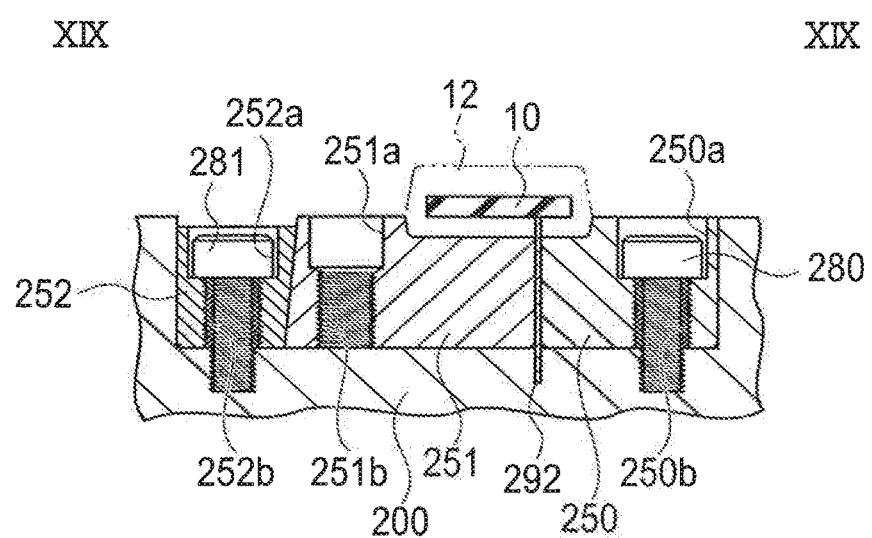
FIG. 51B is a schematic cross-sectional structure diagram taken in the line XIX-XIX of FIG. 51A.

Thus, as show in FIGS. 51A and 51B as a fifth molding process, the signal terminal 292 of the power module semiconductor device is held between the guide groove 250*c* of the first block member 250 and the protruding portion 251*c* of the second block member 251, and thereby the power module semiconductor device is fixed thereto. Although only the ceramic substrate 10 is illustrated in FIGS. 51A and 51B for the purpose of simplification, but the power module semiconductor device 2 is also actually mounted thereon.

Figure 52A:
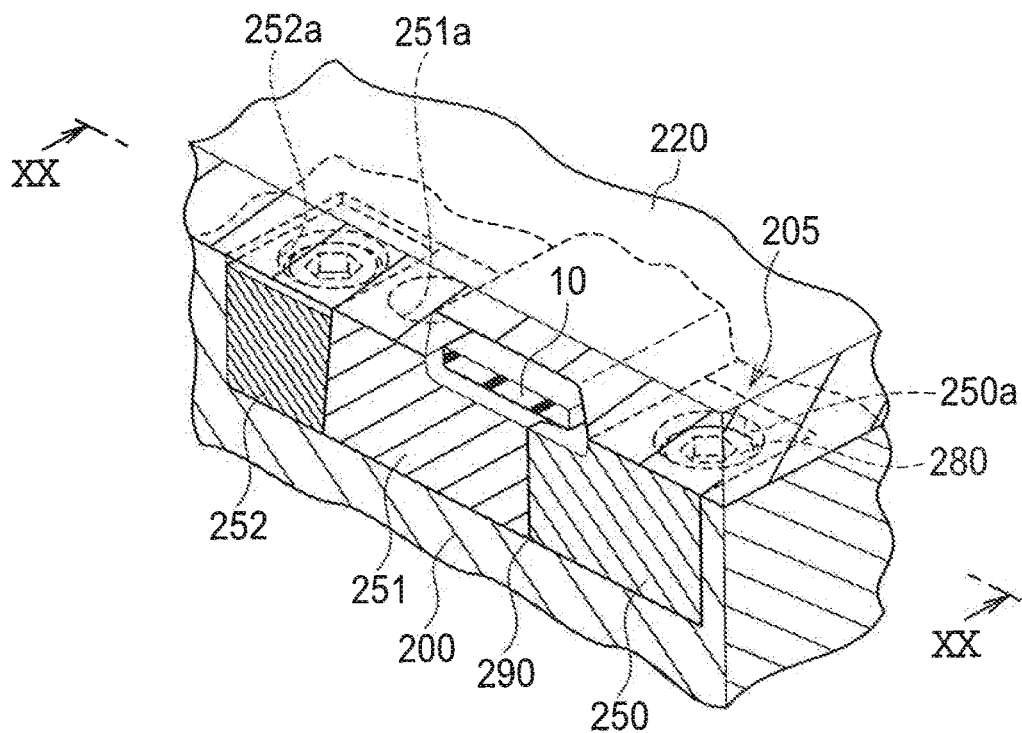
FIG. 52A is a perspective diagram showing a state of the fixing mechanism of the semiconductor chip, and the upper metallic mold, in a sixth molding process of the power module semiconductor device according to the first embodiment.
Figure 52B:
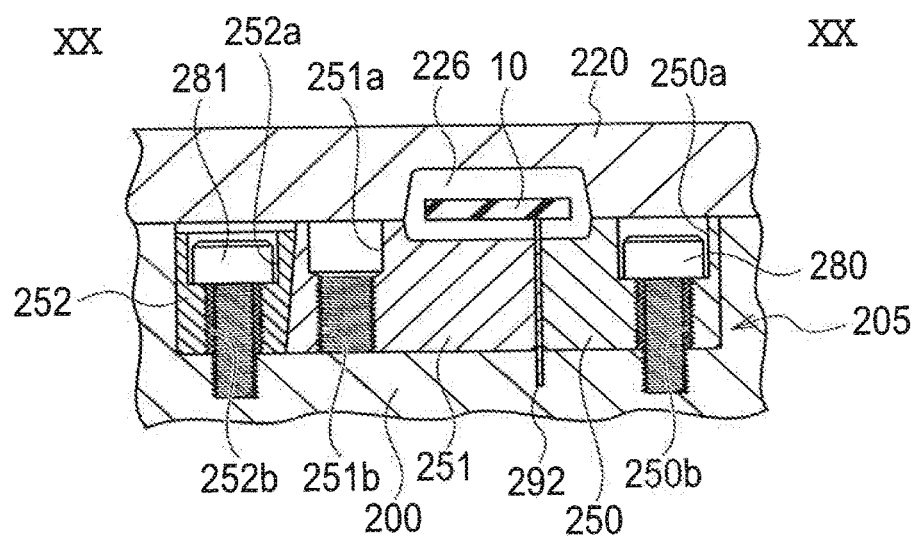
FIG. 52B is a schematic cross-sectional structure diagram taken in the line XX-XX of FIG. 52A.

Subsequently, as a sixth molding process, as shown in FIGS. 52A and 52B, the upper metallic mold 220 is superposed on the lower metallic mold 200 side including the fixing mechanism 205. Although only the ceramic substrate 10 is illustrated in FIGS. 52A and 52B for the purpose of simplification, but the power module semiconductor device 2 before the resin molding is also actually mounted thereon.

Thus, a space for the air vent 226 used for injecting the resin into the outermost layer of the power module semiconductor device 2 is formed.

Figure 53A:
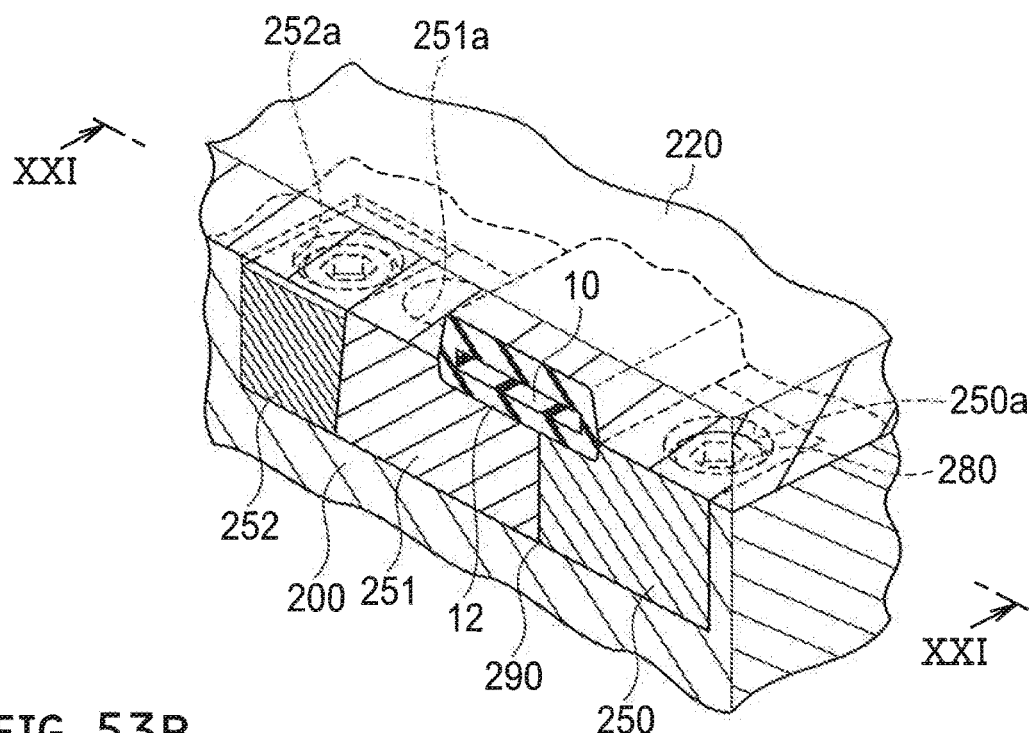
FIG. 53A is a perspective diagram showing a state where a resin is injected therein in a seventh molding process of the power module semiconductor device according to the first embodiment.
Figure 53B:
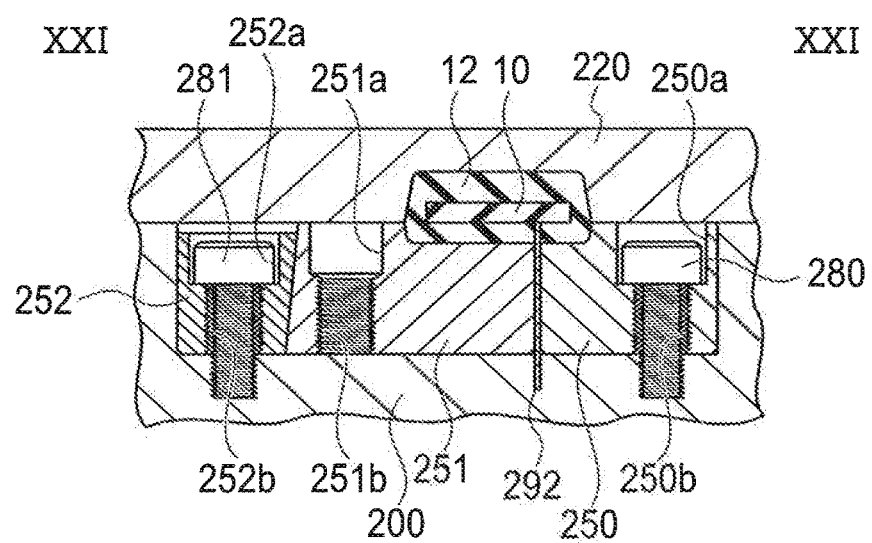
FIG. 53B is a schematic cross-sectional structure diagram taken in the line XXI-XXI of FIG. 53A.

Subsequently, as a seventh molding process, as shown in FIGS. 53A and 53B, the molding machine is driven to fill the space with the resin layer 12. Thus, the power module semiconductor device 2 according to the first embodiment is covered to be sealed with the resin layer 12.

Figure 54A:
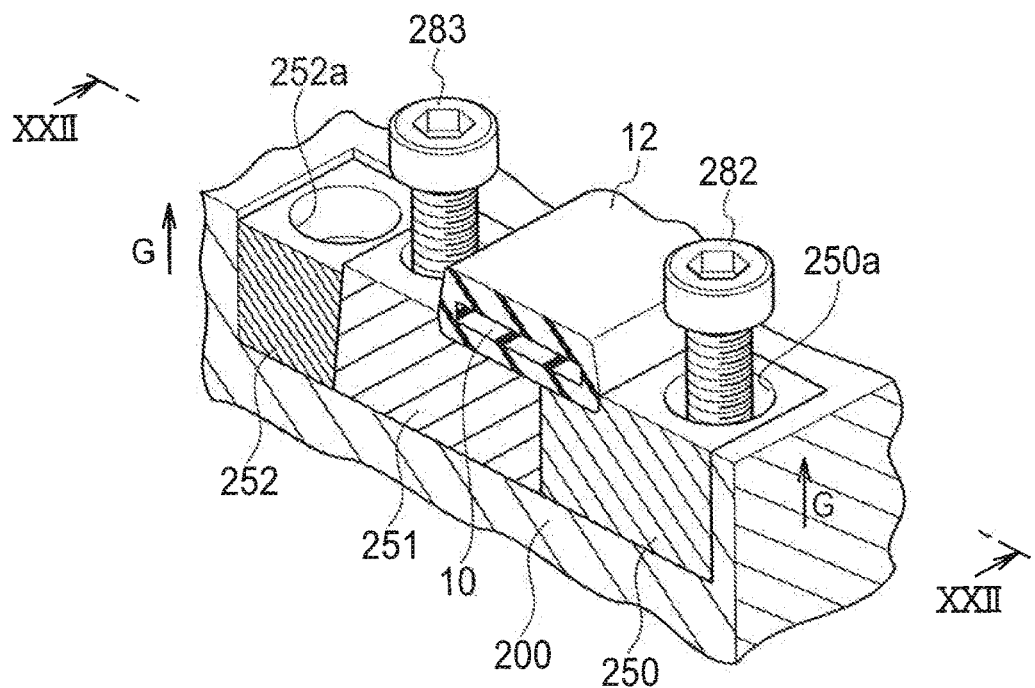
FIG. 54A is a perspective diagram showing a state where the power module semiconductor device is removed, in an eighth molding process of the power module semiconductor device according to the first embodiment.
Figure 54B:
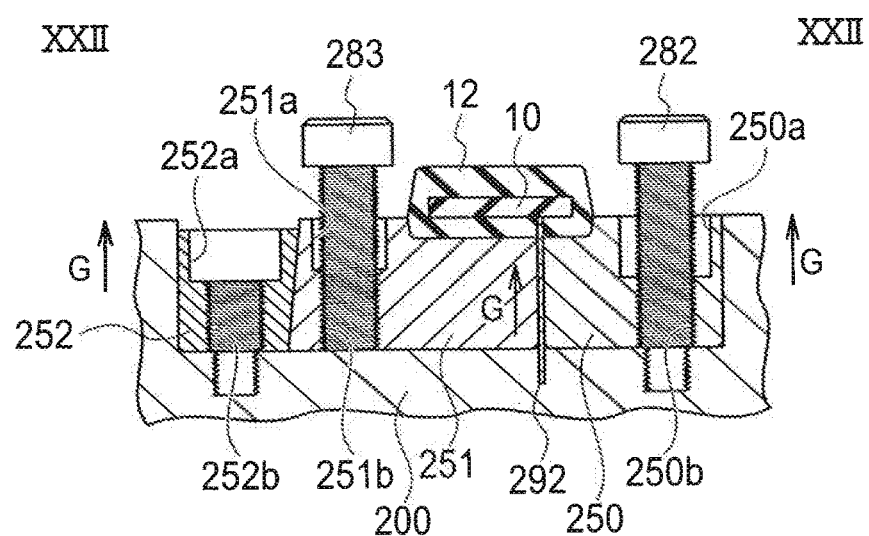
FIG. 54B is a schematic cross-sectional structure diagram taken in the line XXII-XXII of FIG. 54A.

Subsequently, as an eighth molding process, as shown in FIGS. 54A and 54B, the upper metallic mold 220 is removed therefrom, and the locking screws 280, 281 are respectively also removed from the screw hole 250*b* of the first block member 250 and the screw hole 252*b* of the third block member 252.

Subsequently, the jack-up screw 282 is screwed in the screw hole 250*b* of the first block member 250. Moreover, the jack-up screw 283 is similarly screwed in the screw hole 251b of the second block member 251.

A force in an arrow direction G is applied on the first block member 250 and the second block member 251 by clamping the jack-up screws 282, 283, and thereby the molded power module semiconductor device according to the first embodiment is removed.

Molding Process According to Another Example

There will now be explained a molding process according to another example of the power module semiconductor device 2 according to the first embodiment using a lower metallic mold 300, a separate metallic mold 310, and an upper metallic mold 305, with reference to FIGS. 55-57.

Figure 55A:
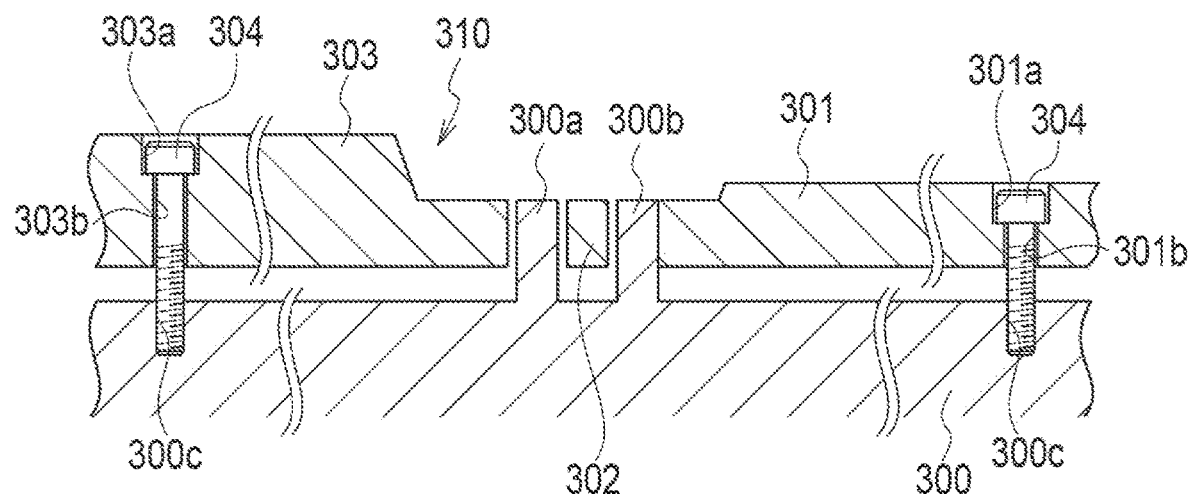
FIG. 55A is a schematic cross-sectional structure diagram showing a part of the lower metallic mold according to another example used in the fabrication method of the power module semiconductor device according to the first embodiment.

FIG. 55A is a schematic cross-sectional structure diagram showing a part of the lower metallic mold 300.

As shown in FIG. 55A, protruding portions 300a, 300b for guiding the signal terminals SS, G, CS of the power module semiconductor device 2 are formed in an approximately center of the lower metallic mold 300.

The separate metallic mold 310 composed of separate members 301-303 is fixed above the lower metallic mold 300 with the screws 304.

Trenches into which the signal terminals SS, G, CS of the power module semiconductor device 2 are inserted is formed between the protruding portions 300a, 300b and the separate members 301-303.

Figure 55B:
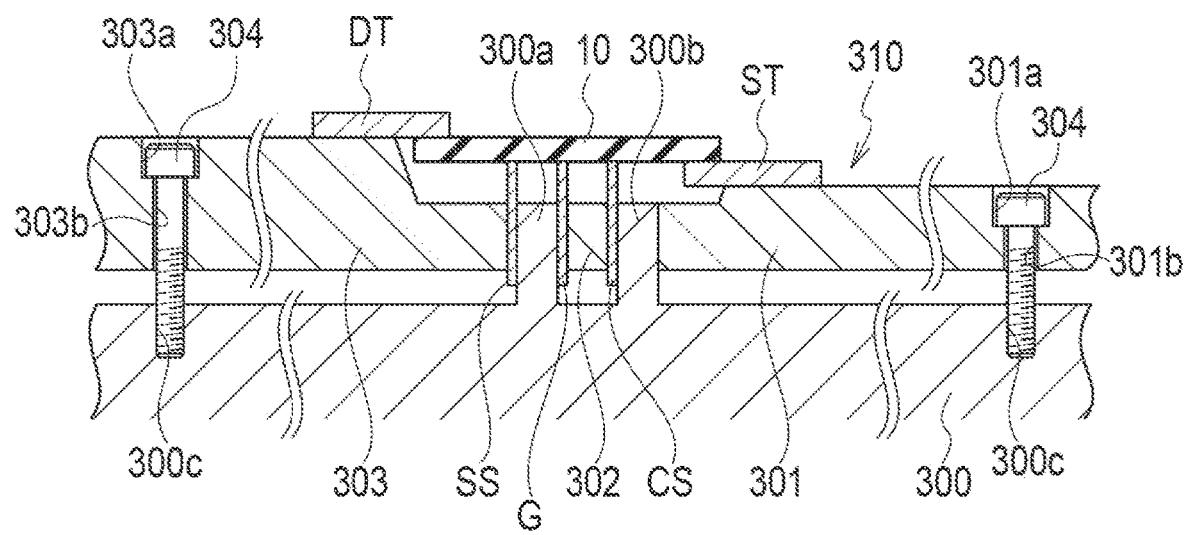
FIG. 55B is a schematic cross-sectional structure diagram showing a state where the semiconductor chip is mounted on the lower metallic mold according to the other example.

Subsequently, as shown in FIG. 55B, the signal terminals SS, G, CS of the power module semiconductor device 2 are respectively inserted to be fixed in the trenches formed between the protruding portions 300a, 300b and the separate members 301-303.

At this time, the drain terminal DT of the power module semiconductor device 2 is mounted on the separate member 303, and the source terminal ST is mounted on the separate member 301.

Figure 56A:
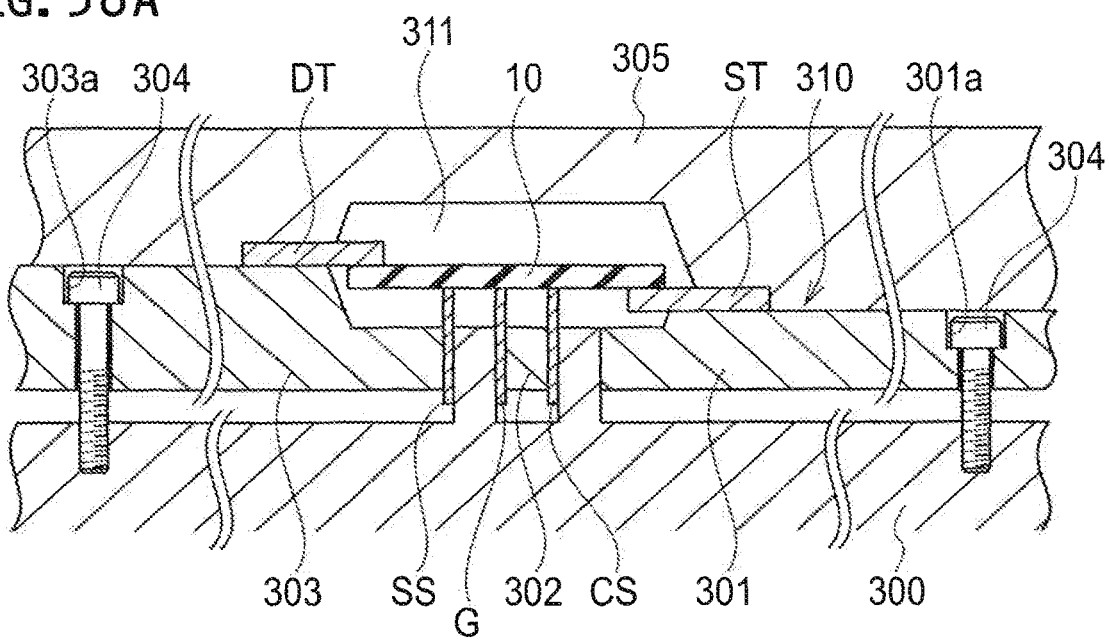
FIG. 56A is a schematic cross-sectional structure diagram showing a state where the upper metallic mold is set on the lower metallic mold according to the other example used in the fabrication method of the power module semiconductor device according to the first embodiment.

Subsequently, as shown in FIG. 56A, the upper metallic mold 305 is superposed on the separate metallic mold 310. Thus, space 311 used for injecting a resin into the outermost layer of the power module semiconductor device 2 is formed.

Figure 56B:
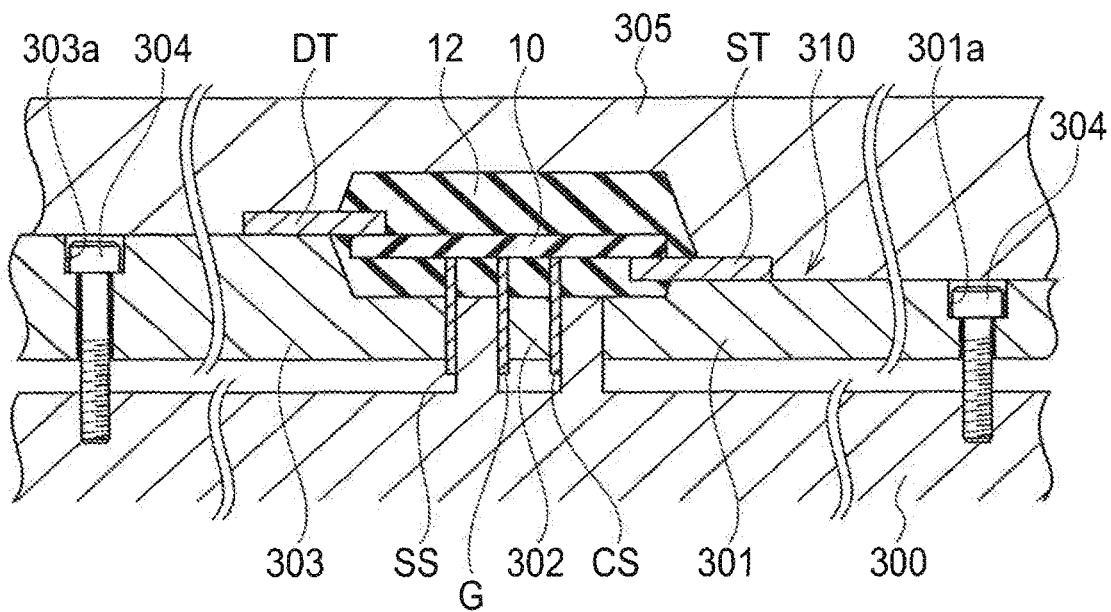
FIG. 56B is a schematic cross-sectional structure diagram showing a state where a resin is injected between the lower metallic mold and the upper metallic mold according to the other example.

Subsequently, as shown in FIG. 56B, the molding machine is driven to fill the space 311 with the resin layer 12. Thus, the power module semiconductor device 2 is covered to be sealed with the resin layer 12.

Figure 57A:
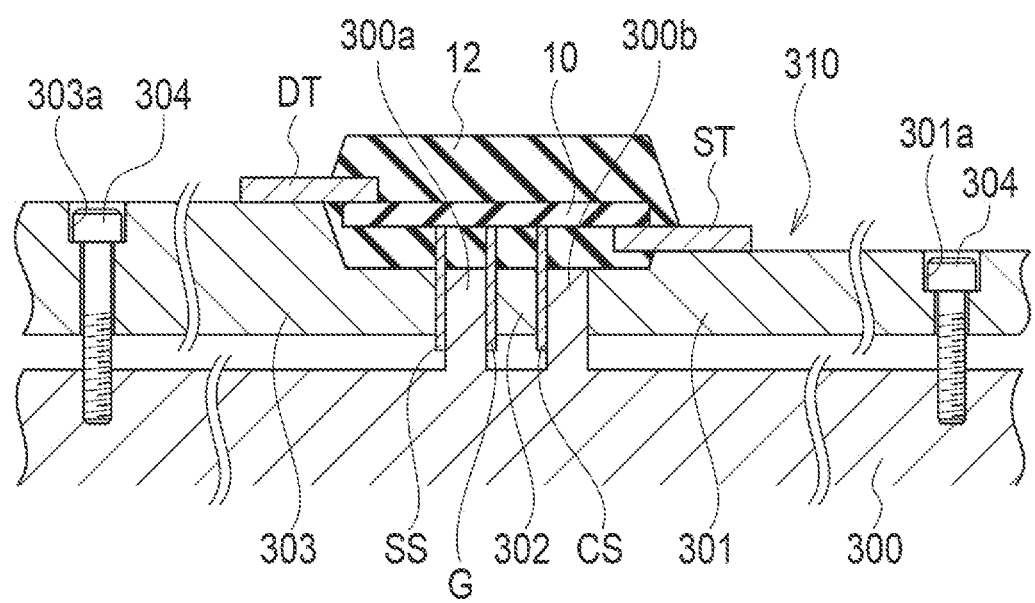
FIG. 57A is a schematic cross-sectional structure diagram showing a state where the power module semiconductor device molded into the lower metallic mold according to the other example used in the fabrication method of the power module semiconductor device according to the first embodiment is mounted.
Figure 57B:
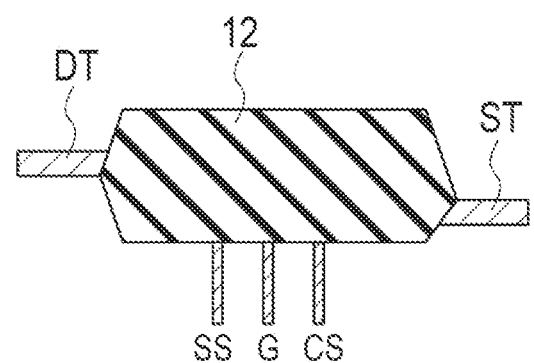
FIG. 57B is a schematic cross-sectional structure diagram showing the power module semiconductor device removed from the lower metallic mold.

Subsequently, the power module semiconductor device according to the first embodiment as shown in FIG. 57B is completed by removing the upper metallic mold 305, as shown in FIG. 57A.

According to the first embodiment, the whole inverter equipment can be efficiently composed by arranging the signal terminals in the substantially vertical direction from the mold body, and the parasitic component can also be reduced since the wirings in the module can also be output by the shortest distance.

According to the first embodiment, there can be provided a power module semiconductor device having a vertical terminal transfermold in which structure thereof is simple and the number of parts is reduced, thereby achieving space saving, since no socket is used.

Second Embodiment

FIG. 58 illustrates a schematic bird's-eye view configuration of a 1-in-1 module, which is a power module semiconductor device according to a second embodiment.

The power module semiconductor device 2 according to the second embodiment has a configuration of 1-in-1 module. More specifically, one MOSFETQ is included in one module. In the power module semiconductor device 2 according to the second embodiment, six chips (MOS transistor×6) can be mounted thereon, as an example, and a maximum of six pieces of the MOSFETs Q can be respectively connected to one another in parallel. Note that it is also possible to mount a part of six pieces of the chips for the diode DI.

A schematic circuit expression of the 1-in-1 module, which is a power module semiconductor device 2 according to the second embodiment is similarly illustrated as FIG. 1, and a detailed circuit expression is similarly illustrated as FIG. 2.

In the power module semiconductor device 2 according to the second embodiment, the power terminals ST, DT are arranged so as to be extended along in a parallel direction with a main surface of the resin layer 12 from a one side surface of the resin layer 12 in the parallel direction.

As shown in FIG. 58, the power module semiconductor device 2 according to the second embodiment includes: a drain terminal DT and a source terminal ST which are arranged on a first side of the ceramic substrate 10 covered with the resin layer 12; and signal terminals SS, G, CS, B1, B2 arranged near a side opposite to the first side in a vertical direction with respect to the ceramic substrate 10. In this case, the signal terminals SS, G, CS are respectively connected to a source sense terminal, a gate signal terminal, and a current sense terminal of the semiconductor chip Q. The signal terminals B1, B2 correspond to thermistor connecting terminals. In this case, the source terminal ST corresponds to the first power input terminal, and the drain terminal DT correspond to the second power input terminal.

Figure 59:
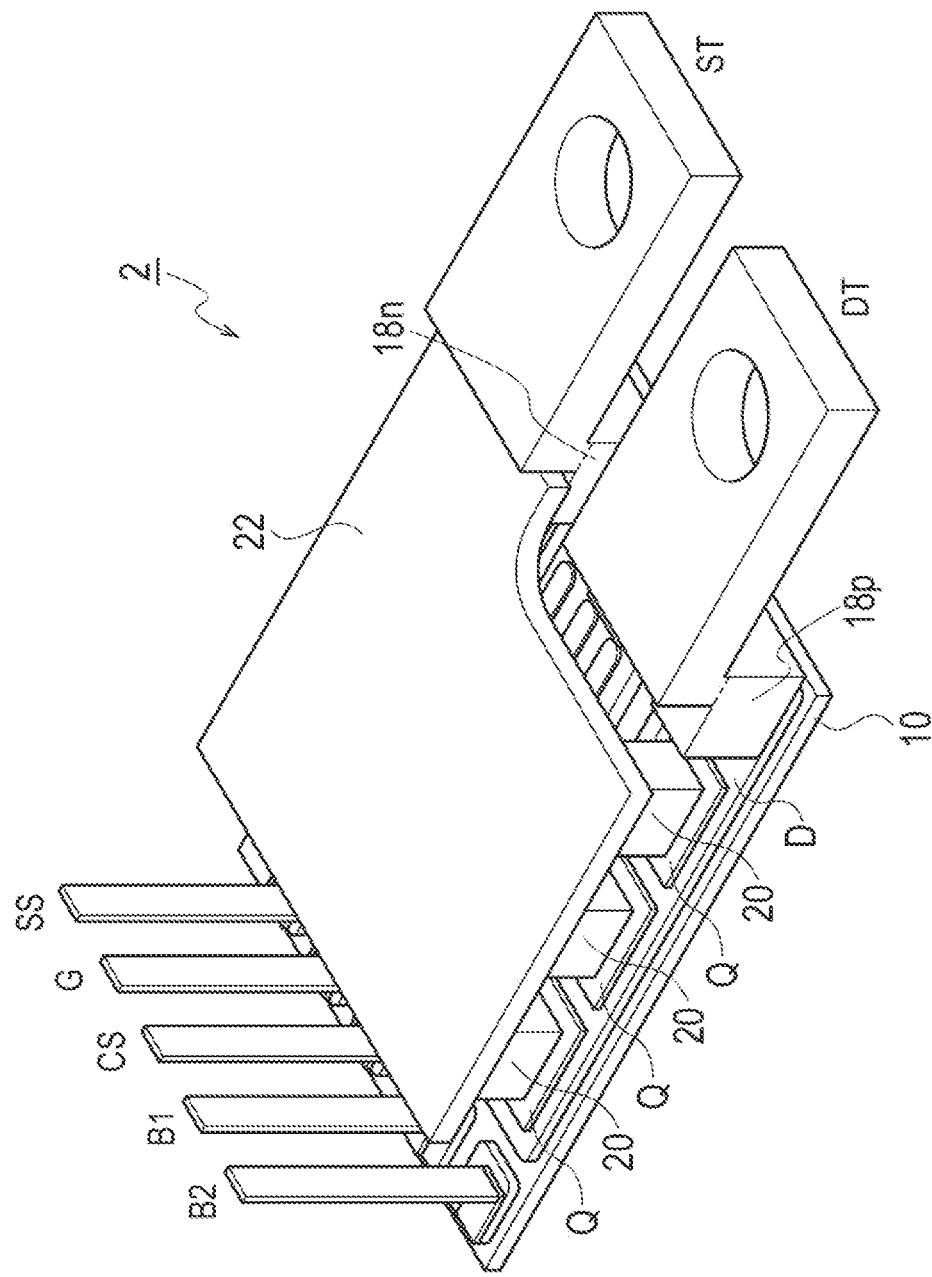
FIG. 59 is a schematic bird's-eye view configuration diagram of the 1-in-1 module before forming a resin layer thereon, which is the power module semiconductor device according to the second embodiment.

Moreover, FIG. 59 illustrates a schematic bird's-eye view configuration of the power module semiconductor device 2 before forming a resin layer 12 thereon.

Figure 60:
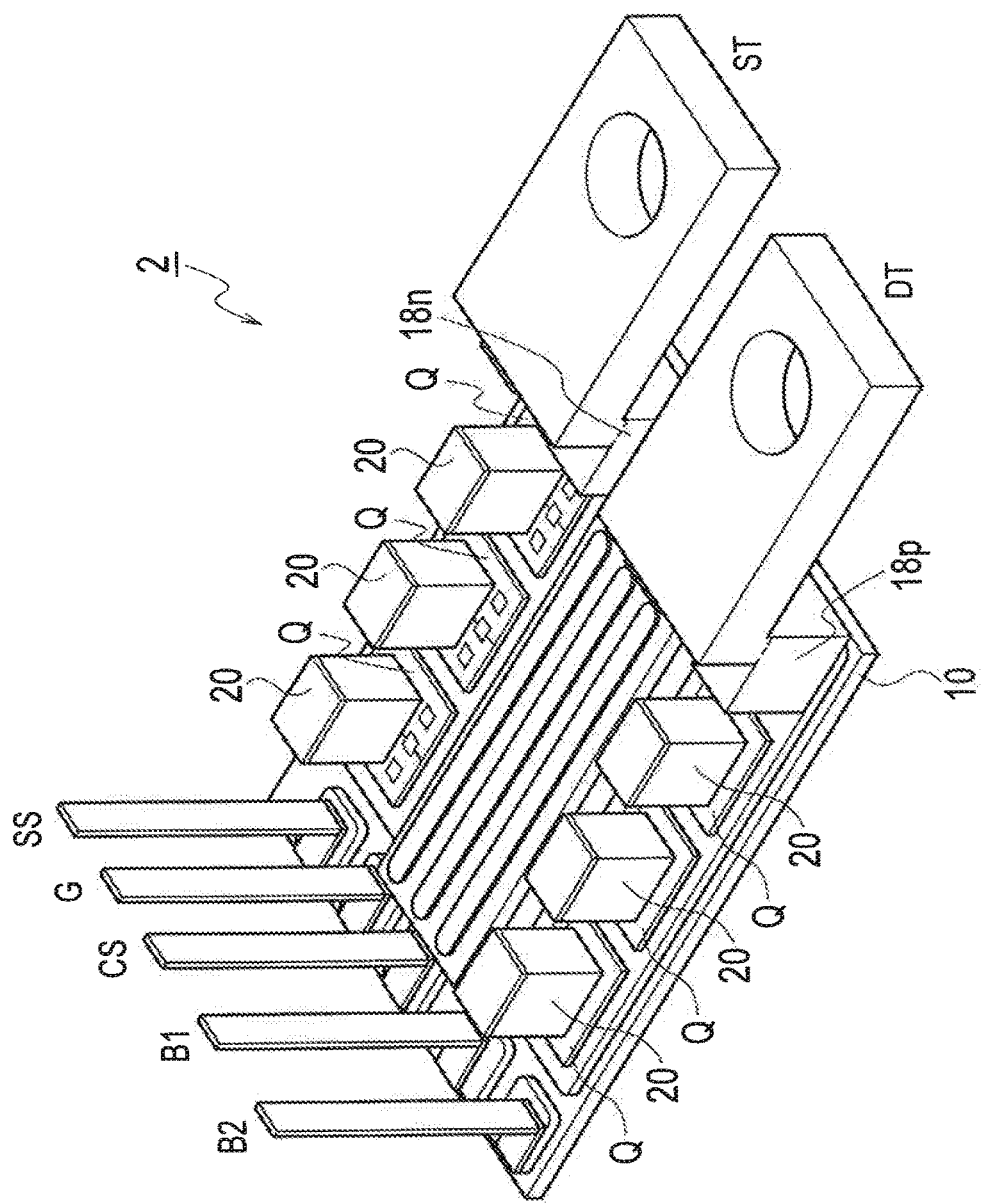
FIG. 60 is a schematic bird's-eye view configuration diagram of the 1-in-1 module before forming an upper surface plate electrode thereon, which is the power module semiconductor device according to the second embodiment.

Furthermore, FIG. 60 illustrates a schematic bird's-eye view configuration of the power module semiconductor device 2, before forming an upper surface plate electrode 22 thereon.

Figure 61:
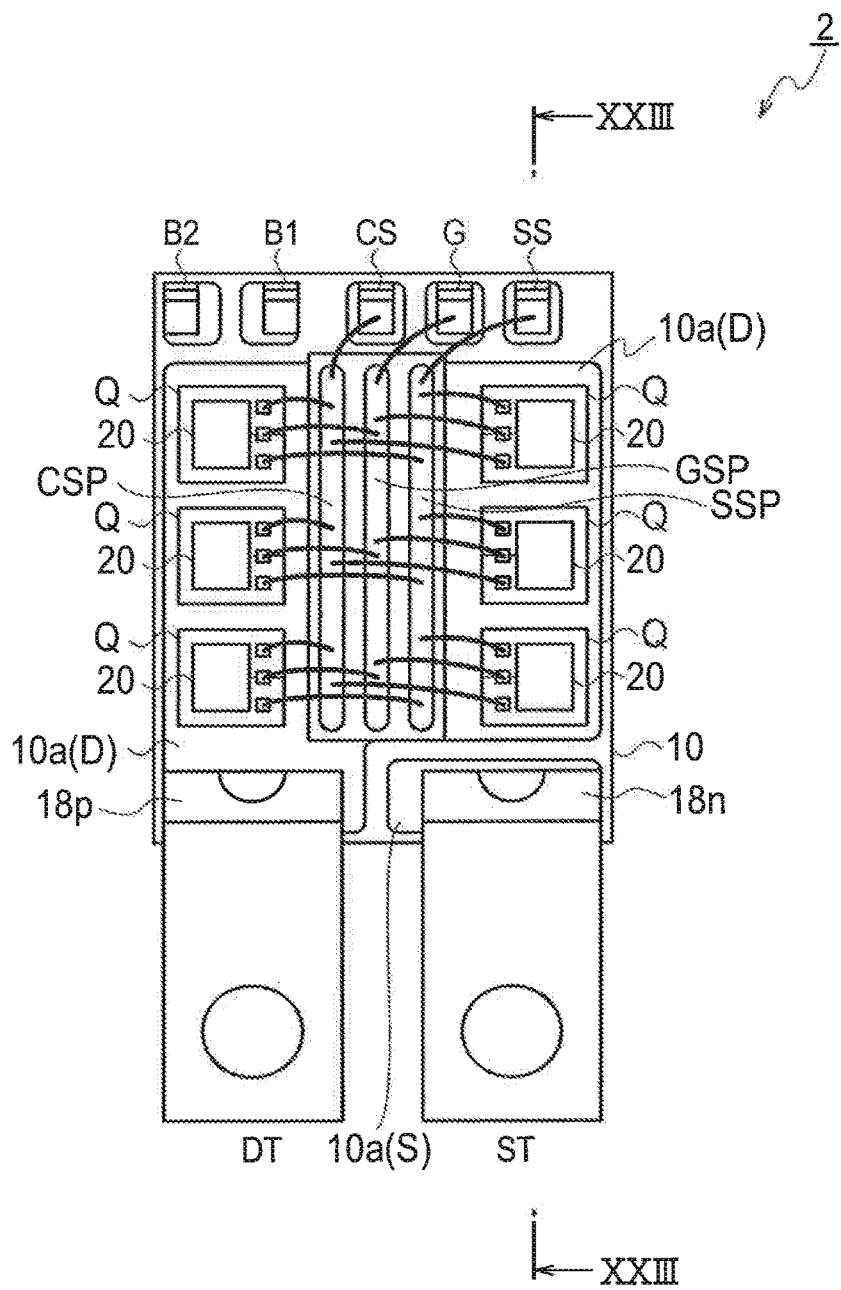
FIG. 61 is a schematic planar pattern configuration diagram showing the 1-in-1 module, which is the power module semiconductor device according to the second embodiment.
Figure 63:
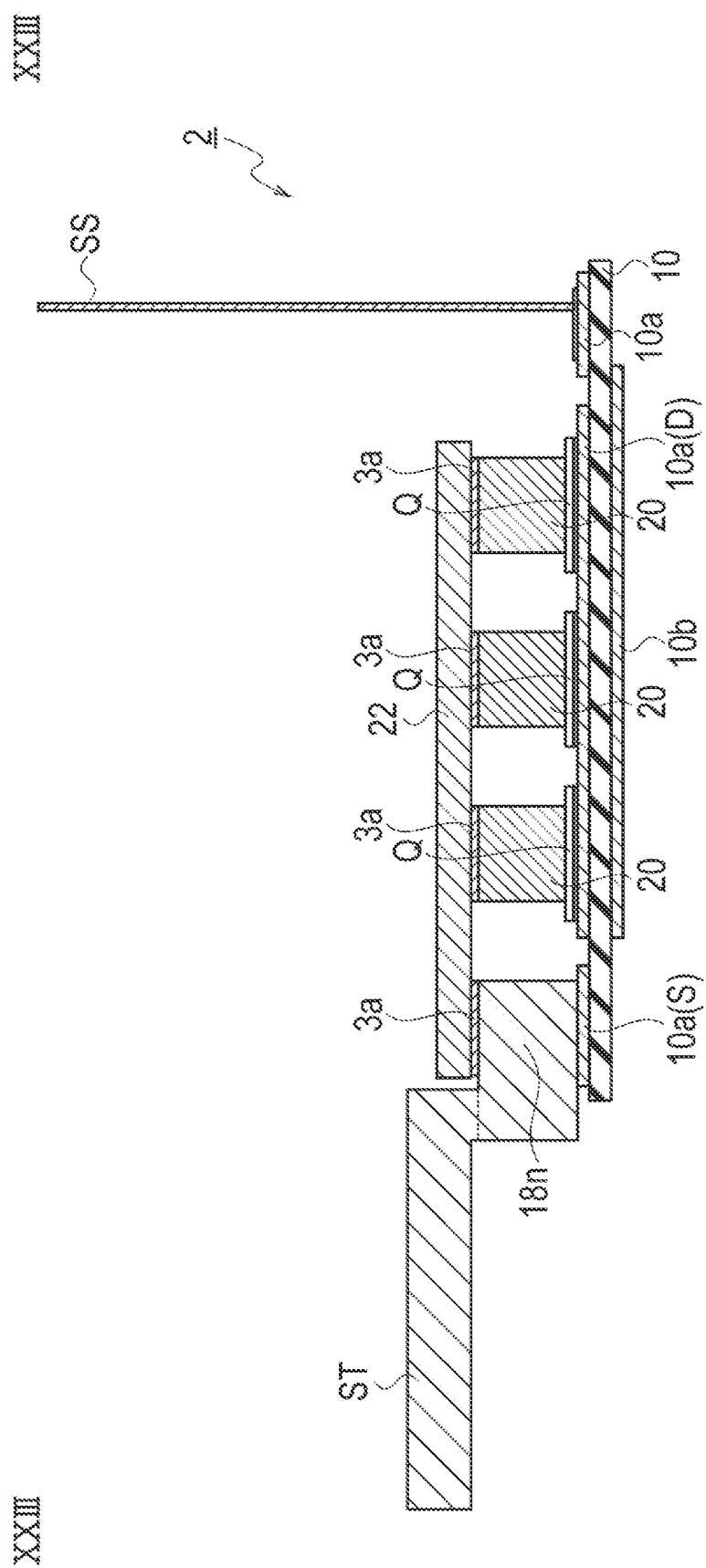
FIG. 63 is a schematic cross-sectional structure diagram taken in the line XXIII-XXIII of FIG. 61.

Moreover, FIG. 61 illustrates a schematic planar pattern configuration of the 1-in-1 module, which is the power module semiconductor device 2 according to the second embodiment. FIG. 63 illustrates a schematic cross-sectional structure taken in the line XXIII-XXIII of FIG. 61.

Figure 62:
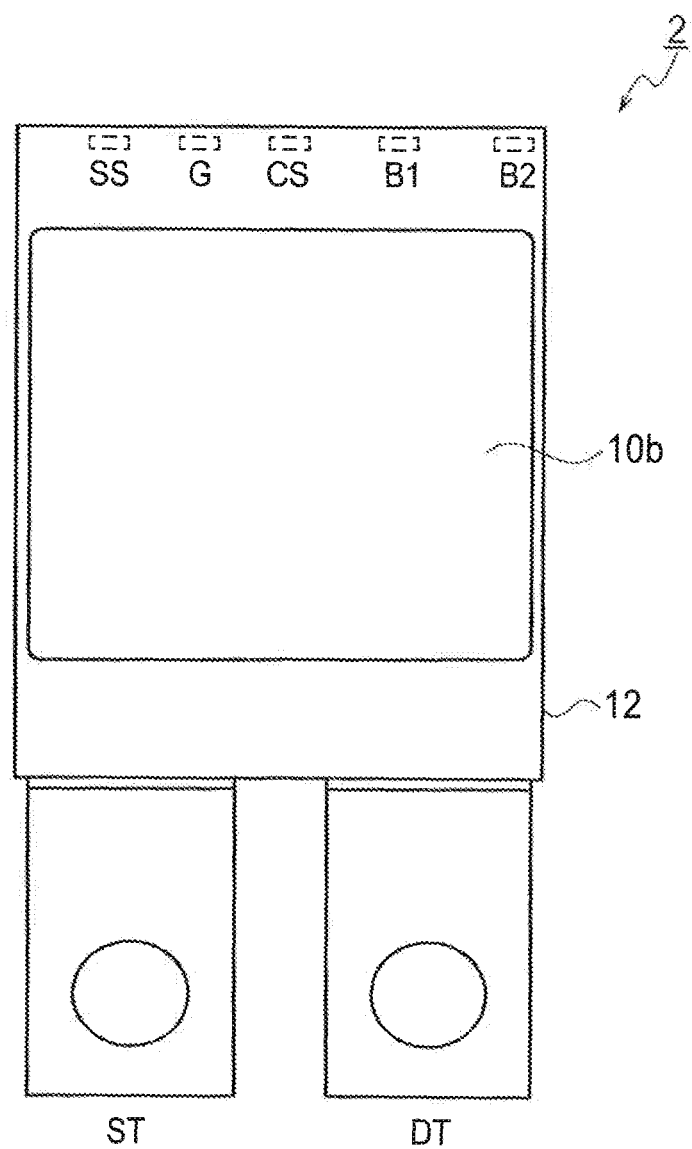
FIG. 62 is a schematic back side external configuration diagram showing the 1-in-1 module, which is the power module semiconductor device according to a second embodiment.

Moreover, FIG. 62 illustrates a schematic back side external appearance configuration of the 1-in-1 module, which is the power module semiconductor device 2 according to the second embodiment. The second copper plate layer 10b disposed on the back side surface of the ceramic substrate 10 functions as a heat spreader.

As shown in FIGS. 58-63, the power module semiconductor device 2 according to the second embodiment includes: a ceramic substrate 10; a first pattern 10a (D) of a first copper plate layer 10a disposed on the surface of the ceramic substrate 10; a semiconductor chip Q disposed on the first pattern D; a first pillar connection electrode $18_p$ disposed on the first pattern D; and a drain terminal DT connected to the first pillar connection electrode $18_p$.

Moreover, the power module semiconductor device 2 may include: a second pattern $10s$(S) of the first copper plate layer 10a; a second pillar connection electrode $18_n$ disposed on the second pattern 10a(S); and a source terminal ST connected to the second pillar connection electrode $18_n$.

Moreover, the power module semiconductor device 2 may include a pillar electrode 20 disposed on the semiconductor chip Q.

Moreover, although the illustration is omitted herein, the power module semiconductor device 2 may include a first diode DI disposed so as to be adjacent to the semiconductor chip Q on the first pattern D. Furthermore, in some cases, the diode DI may be disposed on the first pattern D in all the chips.

Moreover, the power module semiconductor device 2 may include an upper surface plate electrode 22 disposed on the pillar electrode 20.

Moreover, although the illustration is omitted herein, the power module semiconductor device 2 may include an upper surface plate electrode 22 disposed on the pillar electrode 20 and connected to the anode electrode A of the diode DI.

Also in the power module semiconductor device 2 according to the second embodiment, the semiconductor chip Q is formed of an SiC MOSFET, for example, and the diode DI is formed of an SiC SBD, for example. Moreover, a thermistor is connected to between the thermistor connecting terminals B1, B2 on the ceramic substrate 10, and is used for thermal sensing of the power module semiconductor device 2 according to the second embodiment.

Techniques, e.g. solder bonding, metallic bonding using metallic particles, solid phase diffusion bonding, and transient liquid phase (TLP) bonding, are applicable to form a bonded structure of each structural member.

In this case, the signal terminals CS, G, SS, B1, B2 are arranged so as to be extended in the vertical direction with respect to the main surface of the insulating substrate 10, as shown in FIGS. 58-60.

Moreover, the vertical direction with respect to the main surface of the insulating substrate 10 is equal to the vertical direction with respect to the main surface of the resin layer 12.

Moreover, the signal terminals CS, G, SS, B1, B2 may be linearly arranged on the main surface of the resin layer 12, as shown in FIG. 58.

Moreover, the power module semiconductor device 2 according to the second embodiment includes electrode patterns CSP, GSP, SSP arranged so as to be adjacent to the semiconductor chip Q on the insulating substrate 10. In particular, in the power module semiconductor device 2 according to the second embodiment, the electrode patterns CSP, GSP, SSP are arranged so as to be adjacent to one another and to be surrounded by the semiconductor chip Q at a center portion of the insulating substrate 10.

As shown in FIG. 61, the current sense terminal CS is connected by soldering to an electrode pattern connected by wire bonding to the current sense electrode pattern CSP, and arranged so as to be extended in the vertical direction with respect to the main surface of the insulating substrate 10.

As shown in FIG. 61, the gate signal terminal G is connected by soldering to an electrode pattern connected by wire bonding to the gate signal electrode pattern GSP, and arranged so as to be extended in the vertical direction with respect to the main surface of the insulating substrate 10.

As shown in FIGS. 61 and 63, the source sense terminal SS is connected by soldering to an electrode pattern connected by wire bonding to the source sense electrode pattern SSP, and arranged so as to be extended in the vertical direction with respect to the main surface of the insulating substrate 10.

In addition, in the power module semiconductor device 2 according to the second embodiment, the signal terminals CS, G, SS may be directly connected to the electrode patterns CSP, GSP, SSP by soldering.

Since other configurations are the same as those of the power module semiconductor device 2 according to the first embodiment, the duplicated description is omitted. Moreover, since the fabrication method of the power module semiconductor device according to the second embodiment and the metallic mold are the same as those of the power module semiconductor device 2 according to the first embodiment, the duplicated description is omitted.

According to the second embodiment, there can be provided the power module semiconductor device and the inverter equipment, in which the whole inverter equipment can be efficiently composed by arranging the signal terminals in the substantially vertical direction from the mold body, and the parasitic component can also be reduced since the wirings in the module can also be output by the shortest distance.

According to the second embodiment, there can be provided the power module semiconductor device having a vertical terminal transfermold in which structure thereof is simple and the number of parts is reduced, thereby achieving space saving of the 1-in-1 thin type SiC power module, since no socket is used.

Third Embodiment

Figure 64:
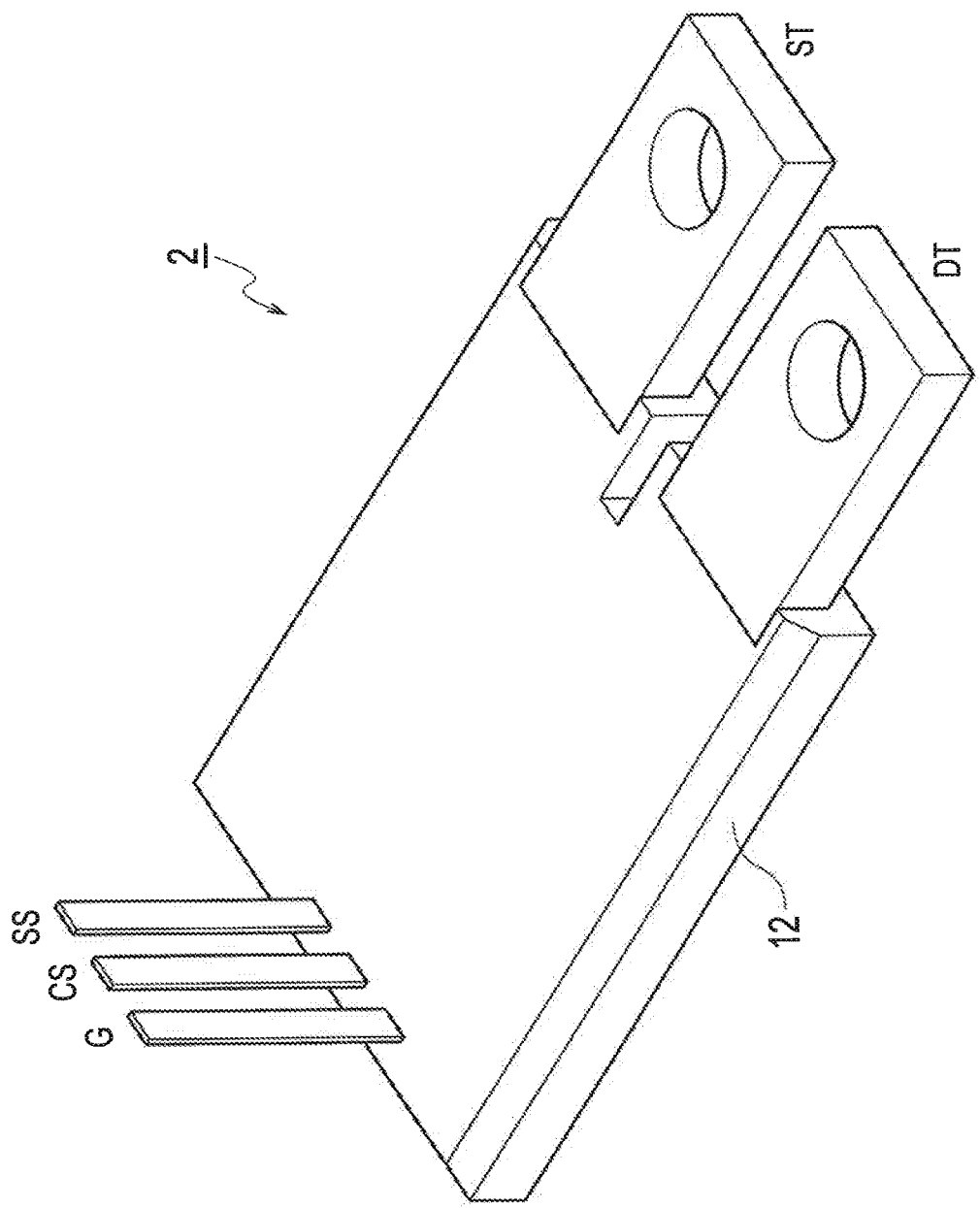
FIG. 64 is a schematic bird's-eye view configuration diagram showing a 1-in-1 module, which is a power module semiconductor device according to a third embodiment.

FIG. 64 illustrates a schematic bird's-eye view configuration of a 1-in-1 module, which is a power module semiconductor device 2 according to a third embodiment.

The power module semiconductor device 2 according to the third embodiment has a configuration of 1-in-1 module. More specifically, one MOSFET Q is included in one module. In the power module semiconductor device 2 according to the third embodiment, six chips (MOS transistor×6) can be mounted thereon, as an example, and a maximum of six pieces of the MOSFETs Q can be respectively connected to one another in parallel. Note that it is also possible to mount a part of six pieces of the chips for the diode DI.

A schematic circuit expression of the 1-in-1 module, which is a power module semiconductor device 2 according to the third embodiment is similarly illustrated as FIG. 1, and a detailed circuit expression is similarly illustrated as FIG. 2.

In the power module semiconductor device 2 according to the third embodiment, the power terminals ST, DT are arranged so as to be extended along in a parallel direction with a main surface of the resin layer 12 from a one side surface of the resin layer 12 in the parallel direction.

As shown in FIG. 64, the power module semiconductor device 2 according to the third embodiment includes: a drain terminal DT and a source terminal ST which are arranged on a first side of the ceramic substrate 10 covered with the resin layer 12; and signal terminals SS, G, CS arranged near a side opposite to the first side in a vertical direction with respect to the ceramic substrate 10. In this case, the signal terminals SS, G, CS are respectively connected to a source sense terminal, a gate signal terminal, and a current sense terminal of the semiconductor chip Q. In addition, although illustration is omitted, the power module semiconductor device 2 may further includes thermistor connecting terminals B1, B2 arranged near a side opposite to the first side in a vertical direction with respect to the ceramic substrate 10. In this case, the source terminal ST corresponds to the first power input terminal, and the drain terminal DT correspond to the second power input terminal.

Figure 65:
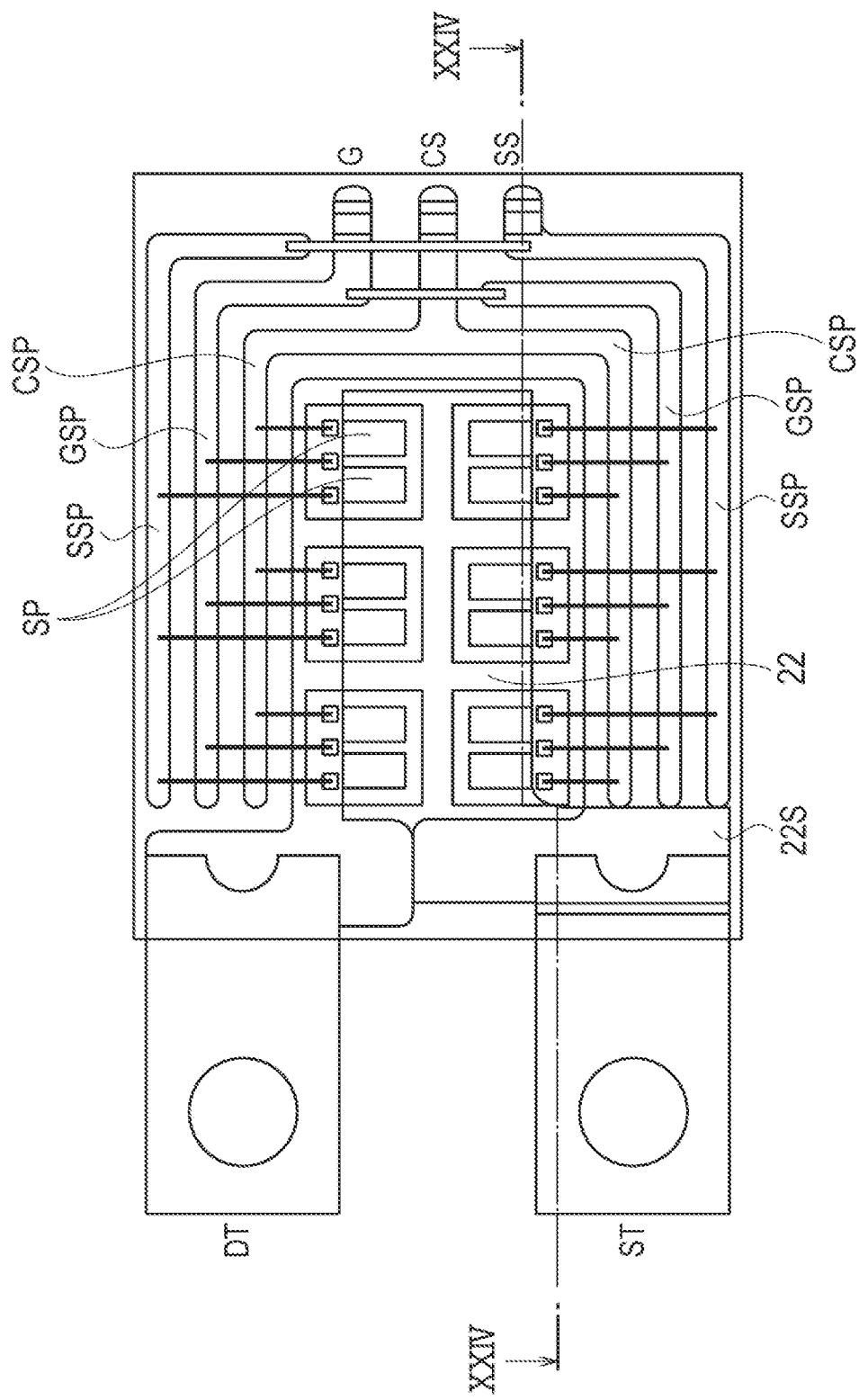
FIG. 65 is a schematic planar pattern configuration diagram showing the 1-in-1 module, which is the power module semiconductor device according to the third embodiment.
Figure 67:
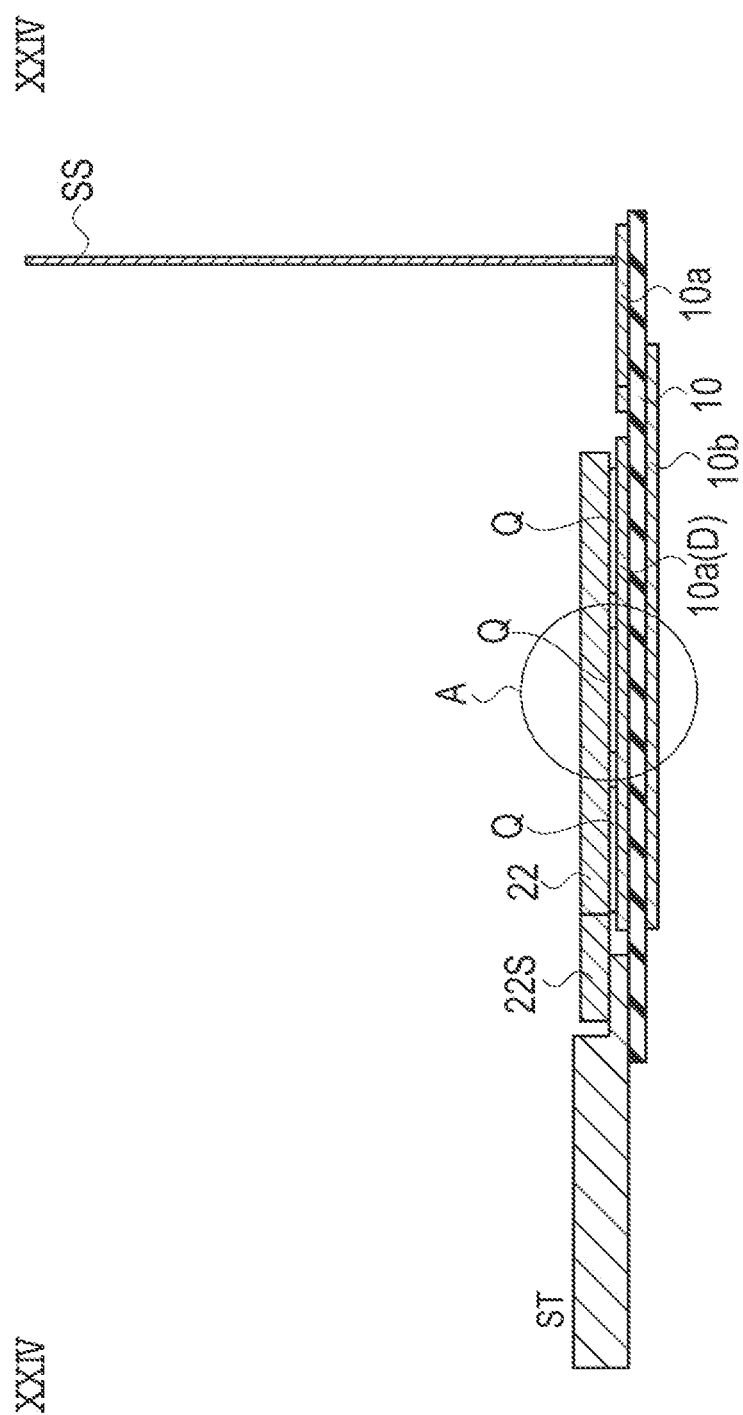
FIG. 67 is a schematic cross-sectional structure diagram taken in the line XXIV-XXIV of FIG. 65.

Moreover, FIG. 65 illustrates a schematic planar pattern configuration of the 1-in-1 module, which is the power module semiconductor device 2 according to the third embodiment. FIG. 67 illustrates a schematic cross-sectional structure taken in the line XXIV-XXIV of FIG. 65.

Figure 66:
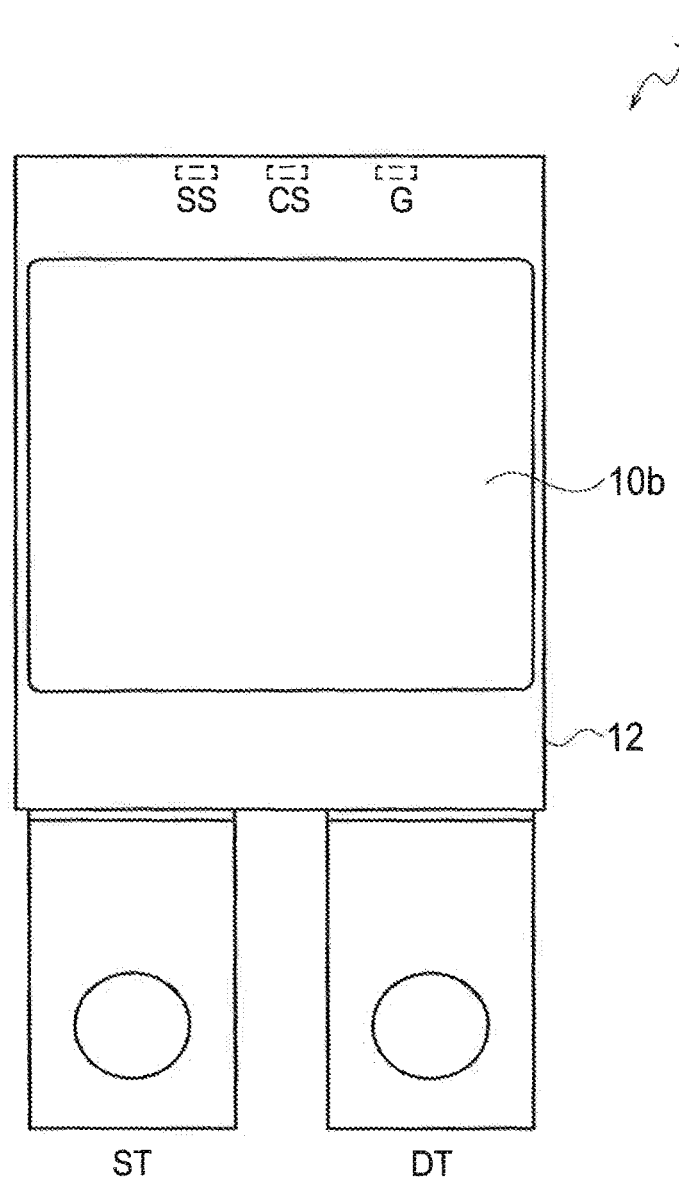
FIG. 66 is a schematic back side external configuration diagram showing the 1-in-1 module, which is the power module semiconductor device according to the third embodiment.

Moreover, FIG. 66 illustrates a schematic back side external appearance configuration of the 1-in-1 module, which is the power module semiconductor device 2 according to the third embodiment. The second copper plate layer 10b disposed on the back side surface of the ceramic substrate 10 functions as a heat spreader.

As shown in FIGS. 64-65, the power module semiconductor device 2 according to the third embodiment includes: a ceramic substrate 10; a first pattern 10a (D) of a first copper plate layer 10a disposed on the surface of the ceramic substrate 10; a semiconductor chip Q disposed on the first pattern D; a first pillar connection electrode 18$_p$ disposed on the first pattern D; and a drain terminal DT connected to the first pillar connection electrode 18$_p$.

Moreover, the power module semiconductor device 2 may include: a second pattern 10s(S) of the first copper plate layer 10a; a second pillar connection electrode 18$_n$ disposed on the second pattern 10a(S); and a source terminal ST connected to the second pillar connection electrode 18$_n$.

Moreover, although the illustration is omitted herein, the power module semiconductor device 2 may include a first diode DI disposed so as to be adjacent to the semiconductor chip Q on the first pattern D. Furthermore, in some cases, the diode DI may be disposed on the first pattern D in all the chips.

Also in the power module semiconductor device 2 according to the third embodiment, the semiconductor chip Q is formed of an SiC MOSFET, for example, and the diode DI is formed of an SiC SBD, for example.

In this case, the signal terminals CS, G, SS are arranged so as to be extended in the vertical direction with respect to the main surface of the insulating substrate 10, as shown in FIGS. 64-65.

Moreover, the vertical direction with respect to the main surface of the insulating substrate 10 is equal to the vertical direction with respect to the main surface of the resin layer 12.

Moreover, the signal terminals CS, G, SS may be linearly arranged on the main surface of the resin layer 12, as shown in FIG. 64.

Moreover, the power module semiconductor device 2 according to the third embodiment includes electrode patterns CSP, GSP, SSP arranged so as to be adjacent to the semiconductor chip Q on the insulating substrate 10. In particular, in the power module semiconductor device 2 according to the third embodiment, the electrode patterns CSP, GSP, SSP are arranged so as to be adjacent to one another and to surround six pieces of the semiconductor chips Q at a peripheral part of the insulating substrate 10.

Moreover, the power module semiconductor device 2 according to the third embodiment includes electrode patterns CSP, GSP, SSP arranged so as to be adjacent to the semiconductor chip Q on the insulating substrate 10, and the signal terminals CS, G, SS may be connected to the electrode patterns CSP, GSP, SSP with soldering.

As shown in FIG. 65, the current sense terminal CS is connected by soldering to the current sense electrode pattern CSP, and arranged so as to be extended in the vertical direction with respect to the main surface of the insulating substrate 10.

As shown in FIG. 65, the gate signal terminal G is connected by soldering to the gate signal electrode pattern GSP, and arranged so as to be extended in the vertical direction with respect to the main surface of the insulating substrate 10.

As shown in FIG. 65, the source sense terminal SS is connected by soldering to the source sense electrode pattern SSP, and arranged so as to be extended in the vertical direction with respect to the main surface of the insulating substrate 10.

Figure 68:
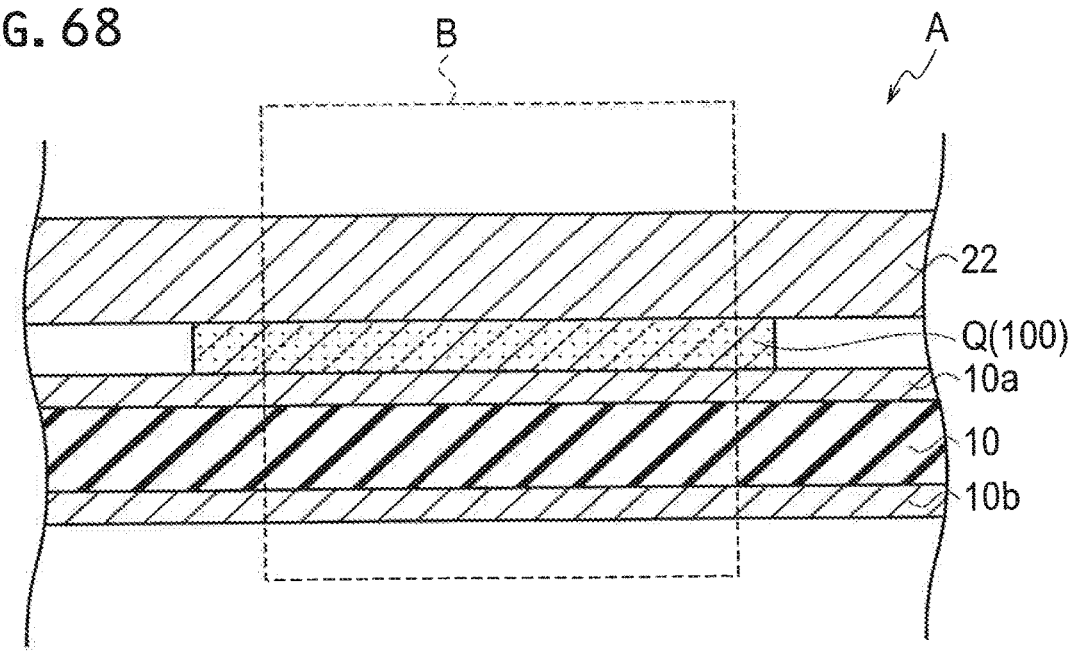
FIG. 68 is a schematic enlarged cross-sectional structure diagram of the portion A shown in FIG. 67.
Figure 69:
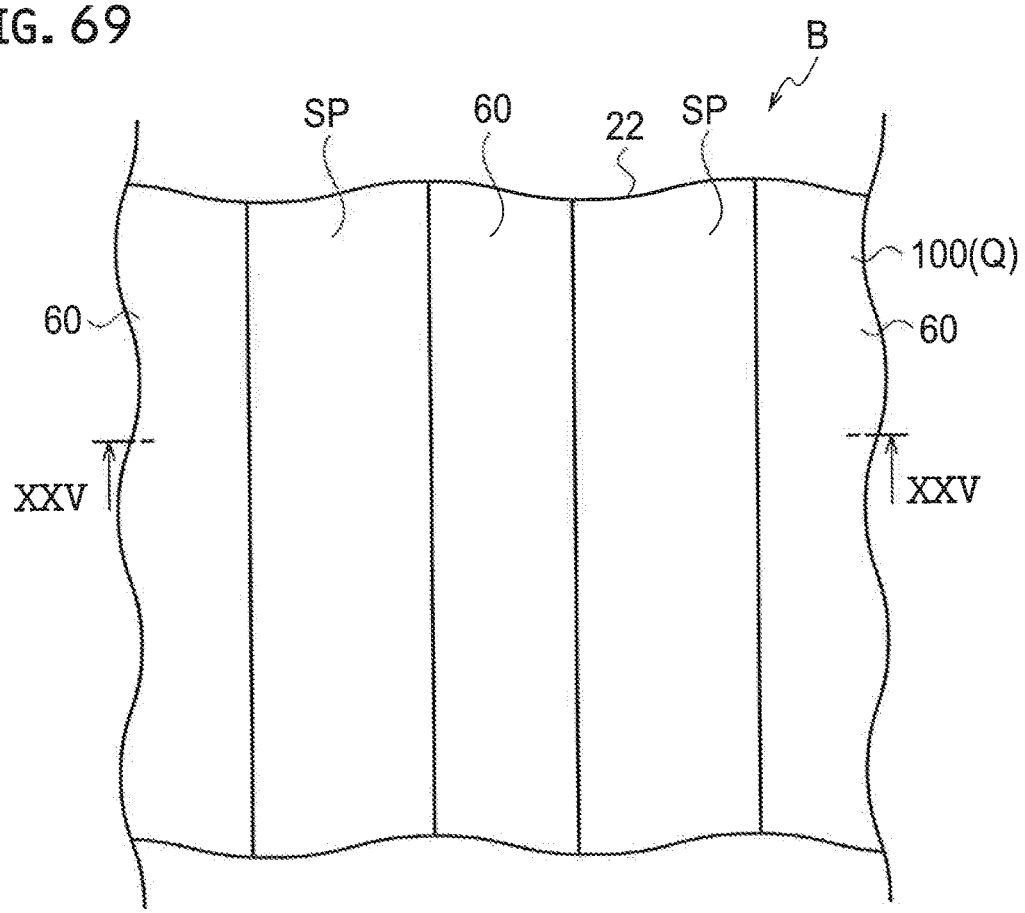
FIG. 69 is a schematic planar pattern configuration diagram of the portion B shown in FIG. 68.

An enlarged schematic cross-sectional structure of the portion A of FIG. 67 is illustrated as shown in FIG. 68. Moreover, a schematic planar pattern configuration of the portion B of FIG. 68 is illustrated as shown in FIG. 69, and a schematic cross-sectional structure taken in the line XXV-XXV of FIG. 69 is illustrated as shown in FIG. 70.

As shown in FIGS. 65-70, the power module semiconductor device 2 according to the third embodiment includes: a semiconductor chip Q (100); source pad electrodes SP, SP arranged on the semiconductor chip Q; an insulating film 60 arranged around the source pad electrodes SP, SP on the semiconductor chip Q, the insulating film 60 having a film thickness thicker than that of the source pad electrodes SP, SP; and an upper surface plate electrode 22 disposed on the insulating film 60 and the source pad electrodes SP. In this case, the semiconductor chip Q(100) may be arranged on a first pattern 10a(D) of the copper plate layer 10a disposed on the surface of the ceramic substrate 10, as shown in FIG. 67.

Figure 70:
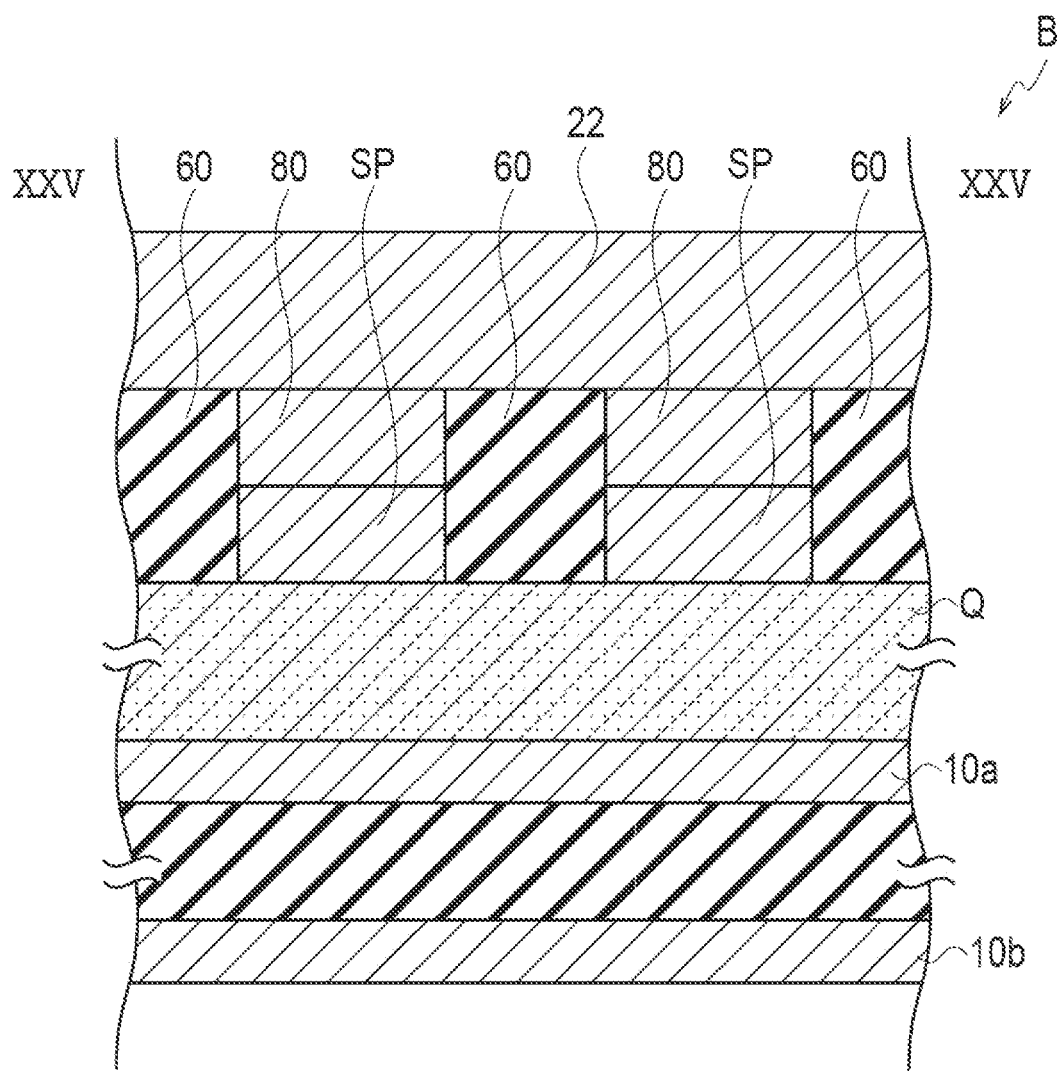
FIG. 70 is a schematic cross-sectional structure diagram taken in the line XXV-XXV of FIG. 69.

Moreover, the upper surface plate electrode 22 and the source pad electrode SP may be connected to each other via the soldering layer 80, as shown in FIG. 70.

Moreover, the insulating film 60 may be formed of a polyimide film. It is preferable that a thickness thereof is equal to or greater than 50 μm, for example, at a point that insulation can be easily secured and a height thereof can be reduced. Alternatively, the insulating film 60 may be formed of ceramics or its layer. Also in this case, it is preferable that a thickness thereof is equal to or greater than 50 μm, for example, at a point that insulation can be easily secured and a height thereof can be reduced.

As shown in FIGS. 64-70, since the power module semiconductor device 2 according to the third embodiment can be formed of a thin type SiC power module without distribution poles, there can be provided the power module semiconductor device in which physical size and weight can be reduced.

Moreover, in the power module semiconductor device according to the third embodiment, as shown in FIG. 65, three chips of semiconductor chips Q are arranged at a center portion of the ceramic substrate 10 in two rows. Moreover, two-circuit groups of signal patterns GSP, CSP, SSP are disposed in L-shaped structure on a peripheral part of the ceramic substrate 10. As shown in FIG. 65 the two-circuit groups of signal patterns GSP, CSP, SSP are connected in common to one another, and are also connected to a source sense terminal, a gate signal terminal, and a current sense terminal of the semiconductor chip Q.

A GP terminal, an SP terminal, and a CS terminal of each chip are connected with bonding wires to the groups of signal patterns GSP, CSP, SSP having L-shaped structure disposed on the peripheral part.

Furthermore, as shown in FIG. 65, the upper surface plate electrode 22, 22S is disposed so as to not cover directly above the group of bonding wires extended from the semiconductor chip Q, in planar view observed from the thickness direction of the ceramic substrate 10.

Since the group of signal patterns GSP, CSP, SSP are formed in L-shaped structure, it becomes possible to dispose wirings of the bonding wires from the tree-chips MOS transistor in a shorter distance without a cross-wiring. Furthermore, the upper surface plate electrode 22, 22S can also be disposed so as to not cover the bonding wires extended from the chips of the semiconductor chip.

Techniques, e.g. solder bonding, metallic bonding using metallic particles, solid phase diffusion bonding, and transient liquid phase (TLP) bonding, are applicable to form a bonded structure of each structural member.

Since other configurations are the same as those of the power module semiconductor device 1 according to the first embodiment, the duplicated description is omitted. Moreover, since the fabrication method of the power module semiconductor device according to the third embodiment and the metallic mold are the same as those of the first embodiment, the duplicated description is omitted.

According to the third embodiment, there can be provided the power module semiconductor device and the inverter equipment, in which the whole inverter equipment can be efficiently composed by arranging the signal terminals in the substantially vertical direction from the mold body, and the parasitic component can also be reduced since the wirings in the module can also be output by the shortest distance.

According to the third embodiment, there can be provided the power module semiconductor device having a vertical terminal transfermold in which structure thereof is simple and the number of parts is reduced, thereby achieving space saving of the 1-in-1 thin type SiC power module, since no socket is used.

Fourth Embodiment

Figure 71:
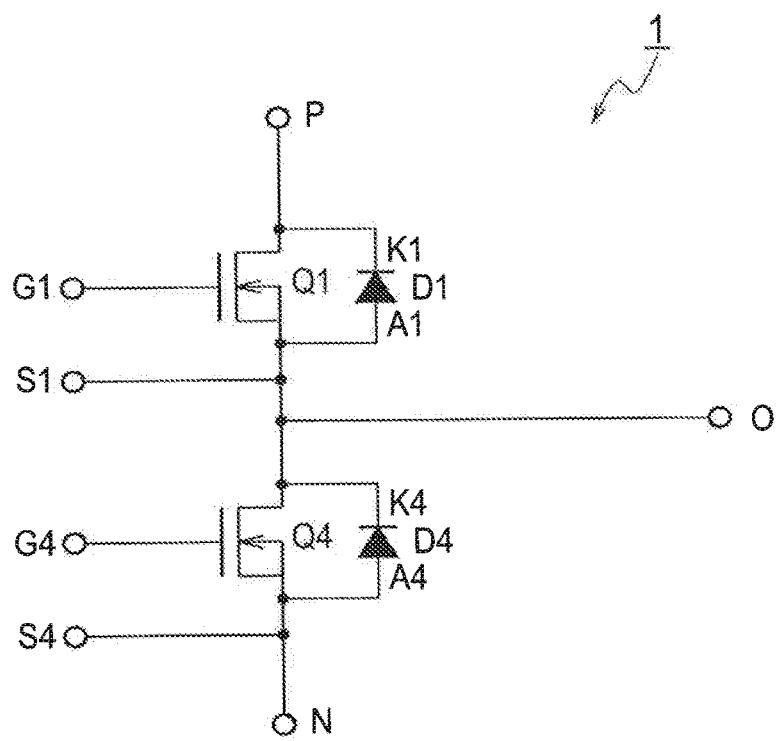
FIG. 71 is a schematic circuit representative diagram showing a two in one (2-in-1) module, which is a power module semiconductor device according to a fourth embodiment.

FIG. 71 illustrates a schematic circuit representative of the 2-in-1 module, which is the power module semiconductor device according to the fourth embodiment.

The power module semiconductor device 2 according to the fourth embodiment has a configuration of 2-in-1 module. More specifically, two MOSFETs Q1, Q4 are included in one module.

As an example, four chips (MOS transistor×3, diode×1) can be mounted in one side of the 2-in-1 module, and a maximum of three MOSFETs Q1, Q4 respectively can be connected to one another in parallel. In this case, the MOSFETs Q1, Q4 have a size of approximately 5 mm×approximately 5 mm.

Figure 72:
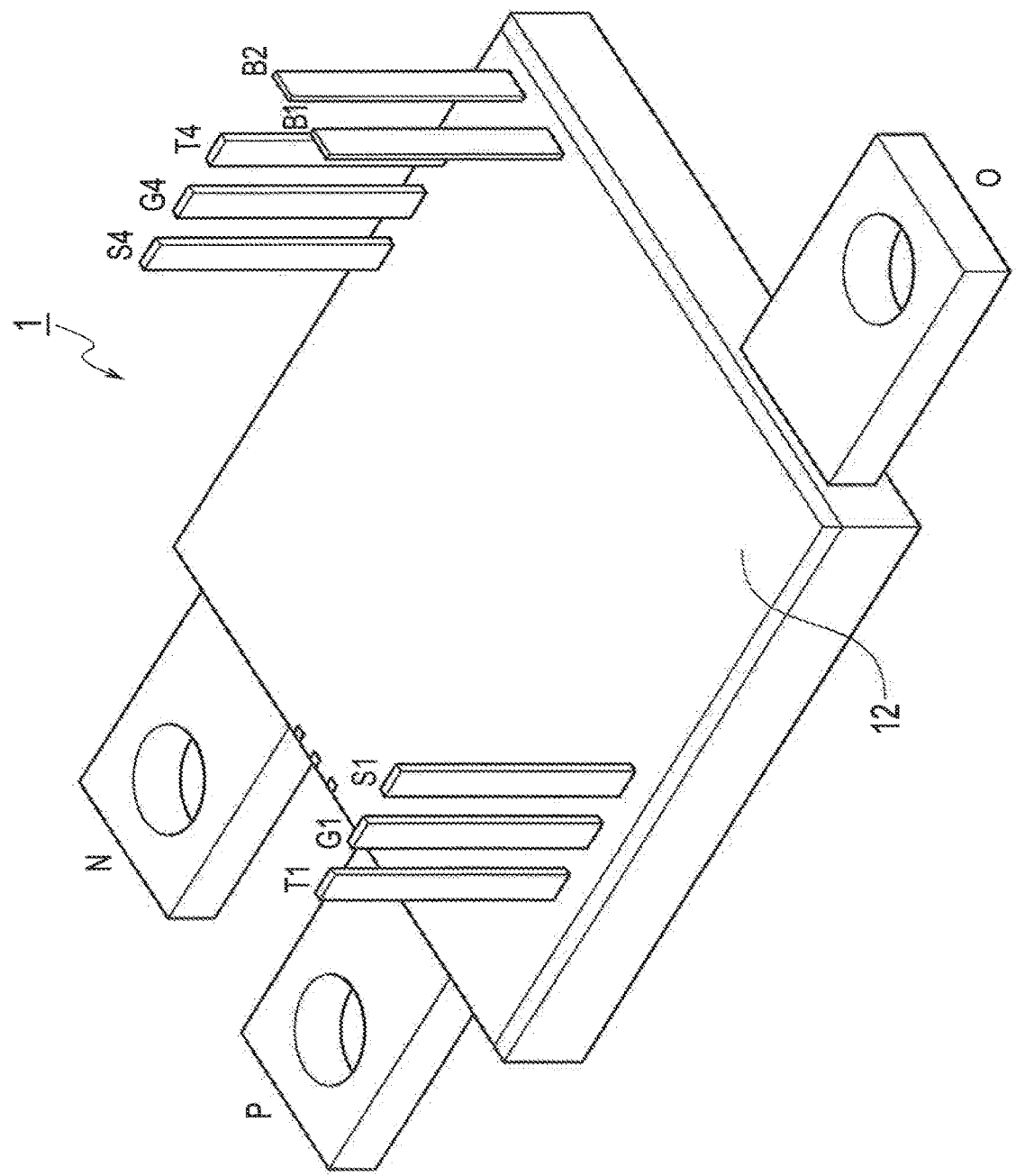
FIG. 72 is a schematic bird's-eye view configuration diagram showing the 2-in-1 module, which is the power module semiconductor device according to the fourth embodiment.

FIG. 72 illustrates a schematic bird's-eye view configuration of the 2-in-1 module, which is the power module semiconductor device 1 according to the fourth embodiment.

Figure 73:
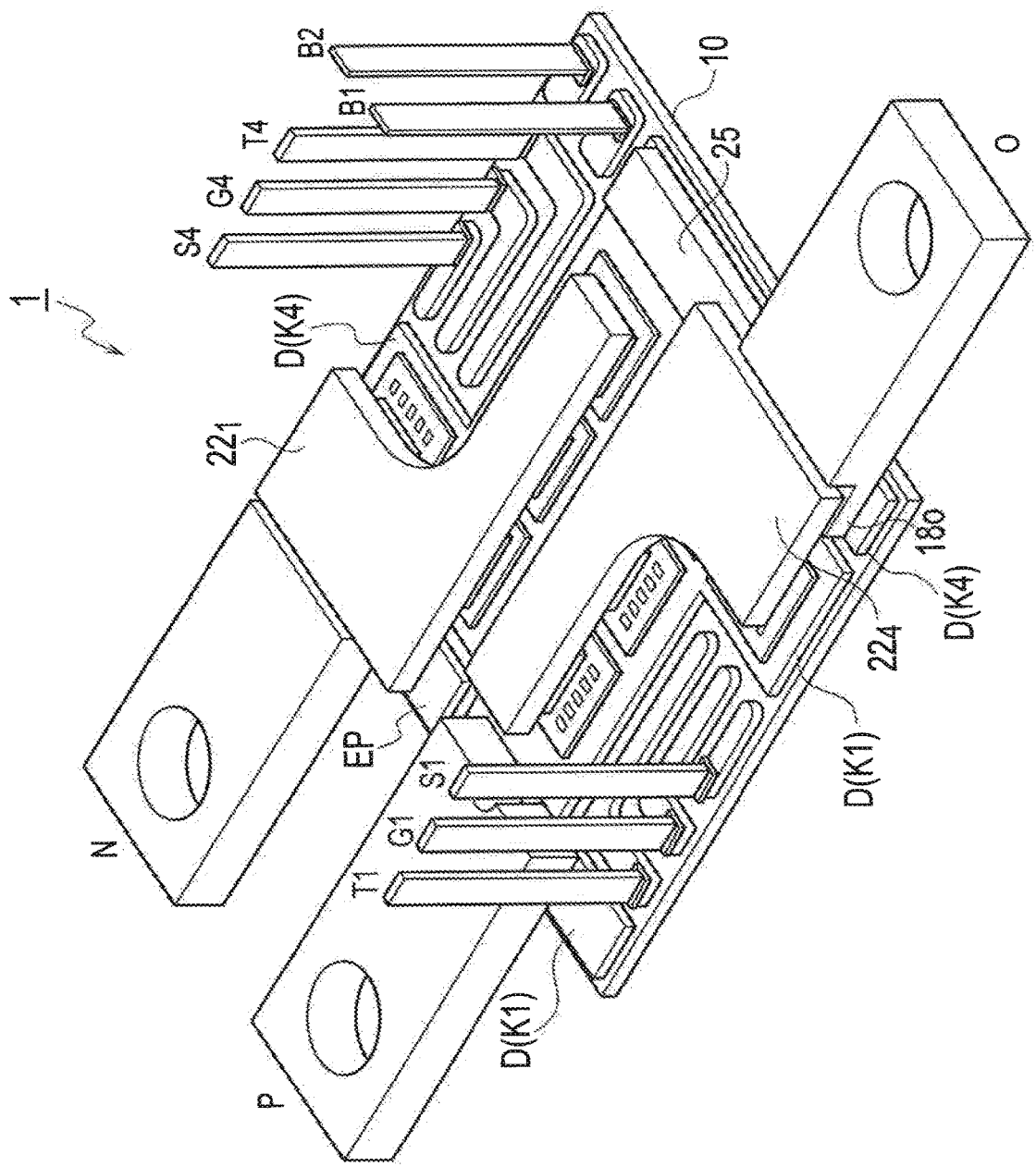
FIG. 73 is a schematic bird's-eye view configuration diagram of the 2-in-1 module before forming a resin layer thereon, which is the power module semiconductor device according to the fourth embodiment.

Moreover, FIG. 73 illustrates a schematic bird's-eye view configuration of the power module semiconductor device 2 before forming a resin layer 12 thereon.

As shown in FIGS. 72 and 73, the power module semiconductor device 1 according to the fourth embodiment includes: a positive side power input terminal P and a negative side power input terminal N disposed on a first side of a ceramic substrate 10 covered with a resin layer 12; signal terminals S1, G1, T1 arranged near a second side adjacent to the first side in a vertical direction with respect to the ceramic substrate 10; an output terminal O arranged on a third side opposite to the first side; thermistor connecting terminals B1, B2 arranged near the third side in the vertical direction with respect to the ceramic substrate 10; and signal terminals S4, G4, T4 arranged near a fourth side opposite to the second side in the vertical direction with respect to the ceramic substrate 10.

In the power module semiconductor device 1 according to the third embodiment, the power terminals P, N are arranged so as to be extended along in a parallel direction with a main surface of the resin layer 12 from a one side surface of the resin layer 12 in the parallel direction, and the output terminal O is arranged so as to be extended from other side surface of the resin layer 12 in an opposite direction to the power terminals P, N, along a parallel direction with the main surface of the resin layer 12.

The signal terminals S1, G1, T1 are respectively connected to a source sense terminal, a gate signal terminal, and a current sense terminal of the semiconductor chip Q1 shown in FIG. 71, and the signal terminals S4, G4, T4 are respectively connected to a source sense terminal, gate signal terminal, and current sense terminal of the semiconductor chip Q4 shown in FIG. 71. Moreover, the negative side power input terminal N corresponds to a first power input terminal, and the positive side power input terminal P corresponds to a second power input terminal.

Figure 74:
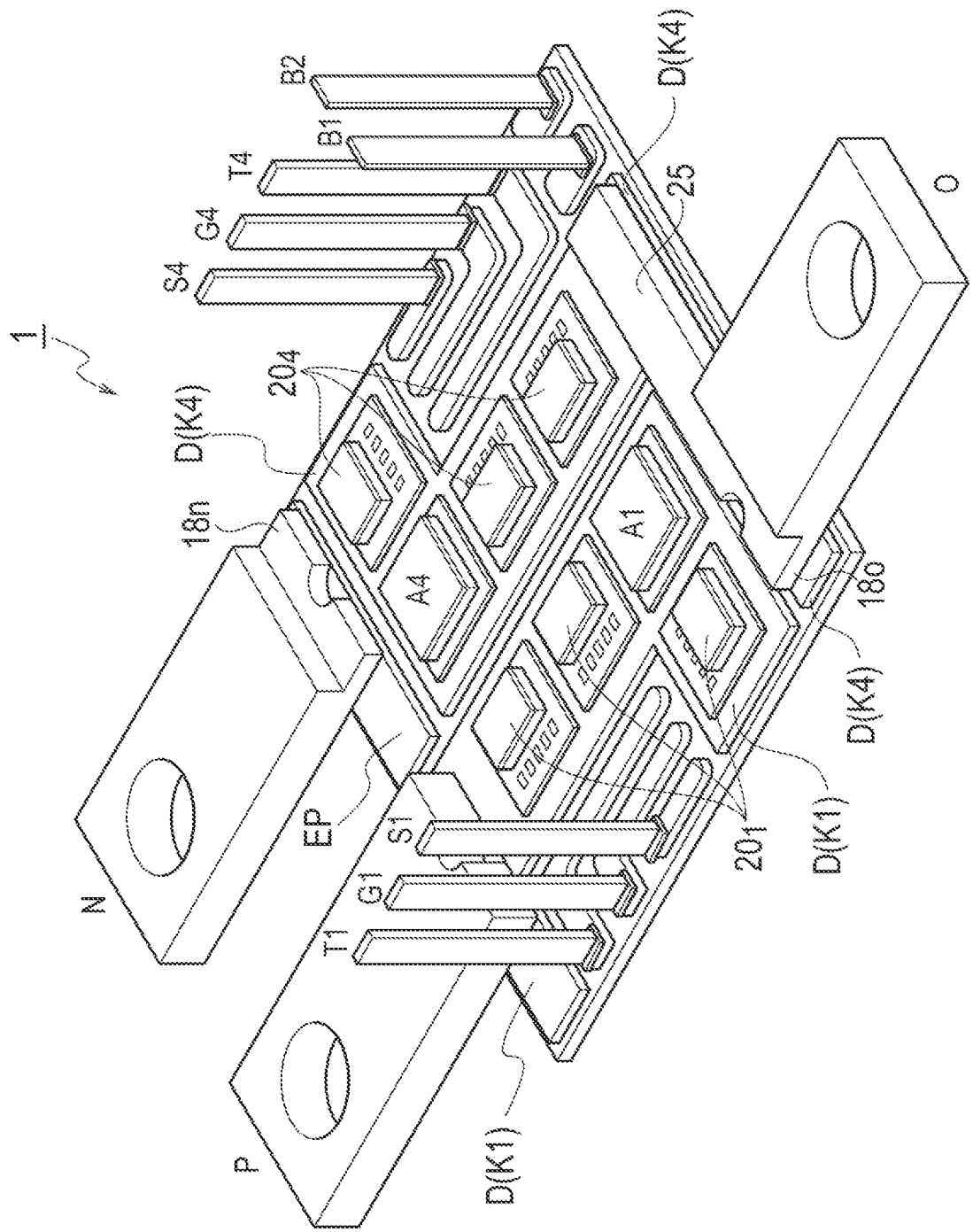
FIG. 74 is a schematic bird's-eye view configuration diagram of the 2-in-1 module before forming an upper surface plate electrode thereon, which is the power module semiconductor device according to the fourth embodiment.

Furthermore, FIG. 74A illustrates a schematic bird's-eye view configuration of the power module semiconductor device 1, before forming the upper surface plate electrodes $22_1$, $22_4$ thereon.

Figure 75:
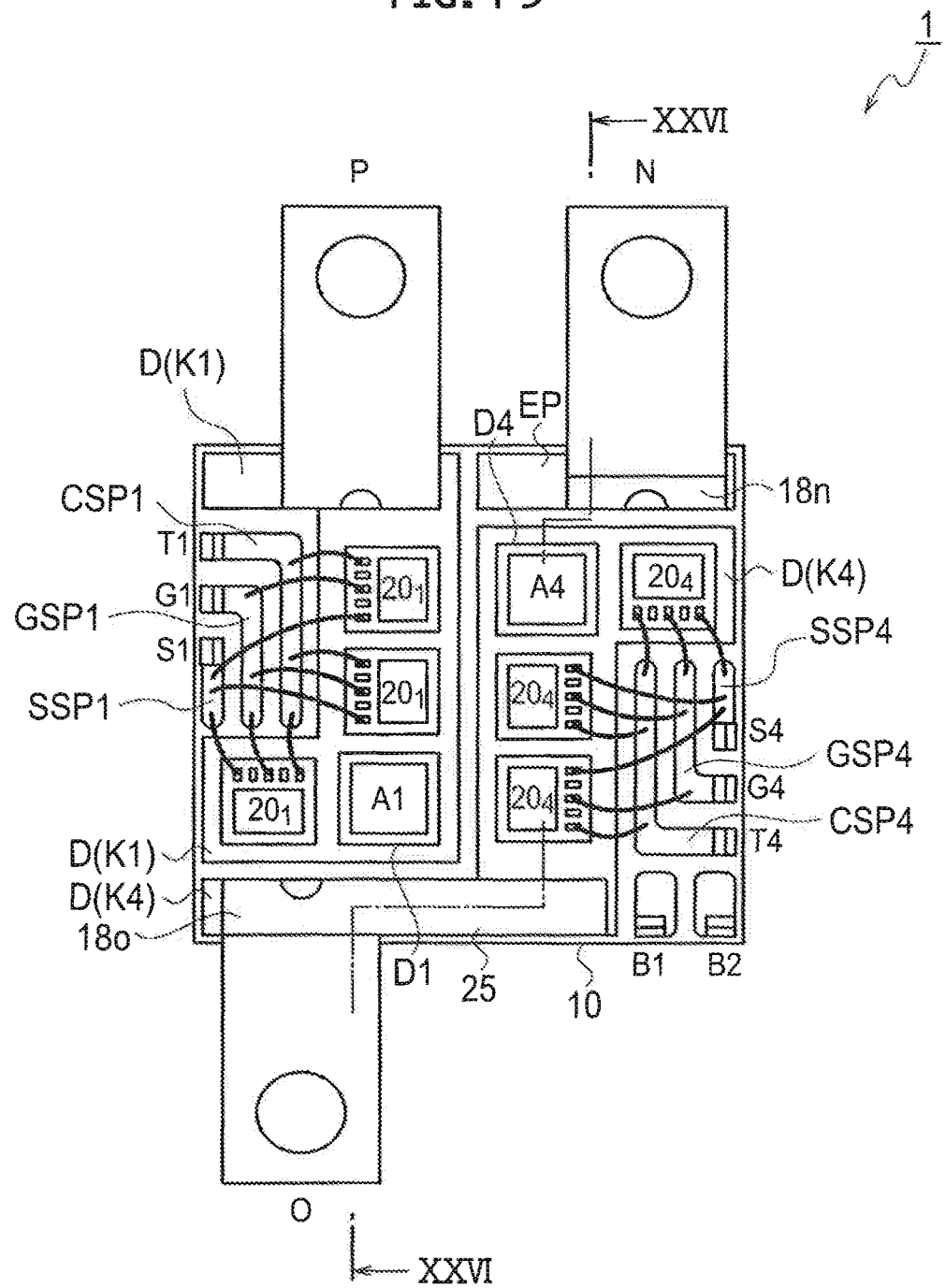
FIG. 75 is a schematic planar pattern configuration diagram showing the 2-in-1 module, which is the power module semiconductor device according to the fourth embodiment.
Figure 76:
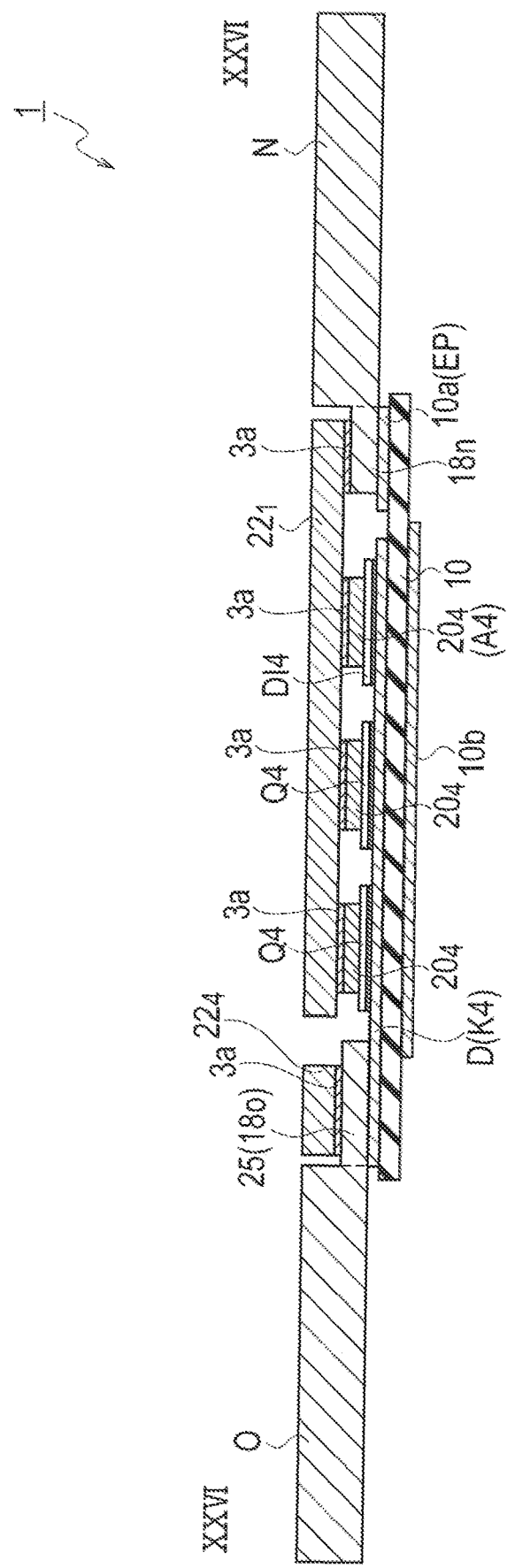
FIG. 76 is a schematic cross-sectional structure diagram taken in the line XXVI-XXVI of FIG. 75.

Moreover, FIG. 75 illustrates a schematic planar pattern configuration of a 2-in-1 module, which is the power module semiconductor device according to the fourth embodiment. FIG. 76 illustrates a schematic cross-sectional structure taken in the line XXVI-XXVI of FIG. 75.

Moreover, in the power module semiconductor device 1 according to the fourth embodiment, as shown in FIG. 75, the upper surface plate electrodes $22_1$, $22_4$ are disposed so as to not cover bonding wires extended from the chip of the semiconductor chips Q1, Q4.

In the power module semiconductor device 1 according to the fourth embodiment, since the signal terminals (G1, S1, T1) and (G4, S4, T4) are alternately arranged with respect to each other in a vertical direction with respect to the ceramic substrate near a side opposite thereto, the signal terminals (G1, S1, T1) and (G4, S4, T4) are not contacted with respect to each other even when the power modules are arranged in parallel in the case of assembling a three phase inverter circuit, thereby achieving space-saving of the power module size.

Techniques, e.g. solder bonding, metallic bonding using metallic particles, solid phase diffusion bonding, and transient liquid phase (TLP) bonding, are applicable to form a bonded structure of each structural member.

As shown in FIGS. 72-76, the power module semiconductor device 1 according to the fourth embodiment includes: a ceramic substrate 10; a first pattern D(K4) of a first copper plate layer 10a disposed on a surface of the ceramic substrate 10; a semiconductor chip Q4 disposed on the first pattern D(K4);

power terminals N, O and signal terminals S4, G4, T4, both electrically connected to the semiconductor chip Q4; and a resin layer 12 configured to cover the semiconductor chip Q4 and the insulating substrate 10. In this case, the signal terminals S4, G4, G, T4 are mutually disposed so as to be extended in a vertical direction with respect to a main surface of the insulating substrate 10.

Moreover, the power module semiconductor device 1 includes: a first pillar connection electrode $18_o$ disposed on first pattern D (K4); and an output terminal O connected to the first pillar connection electrode $18_o$.

Moreover, the power module semiconductor device 1 includes: a second pattern EP of the first copper plate layer 10a; a second pillar connection electrode $18_n$ disposed on the second pattern EP; and a negative side power input terminal N connected to the second pillar connection electrode $18_n$.

Moreover, the first pillar connection electrode $18_o$ may include a pillar extended electrode 25 disposed on the first pattern D(K4).

Moreover, the power module semiconductor device 1 may include a source pillar electrode $20_4$ disposed on the semiconductor chip Q4.

Moreover, the power module semiconductor device 1 may include a first diode D4 disposed on the first pattern D(K4) so as to be adjacent to the semiconductor chip Q4.

Moreover, the power module semiconductor device 1 may include a first upper surface plate electrode 221 disposed on the source pillar electrode 204, and connected to the anode electrode A4 of the first diode D4.

Moreover, the semiconductor chip Q1 disposed on the third pattern D(K1) of the first copper plate layer 10a, and the power terminals P and the signal terminals S1, G1, T1 electrically connected to the semiconductor chip Q1 are covered with the resin layer 12, in conjunction with the insulating substrate 10, as well as the semiconductor chip Q4. In this case, the signal terminals S1, G1, T1 are mutually disposed so as to be extended in a vertical direction with respect to a main surface of the insulating substrate 10.

Moreover, the power module semiconductor device 1 may include a second diode D1 disposed on the third pattern D(K1) so as to be adjacent to the semiconductor chip Q1.

Moreover, the power module semiconductor device 1 may include a source pillar electrode $20_1$ disposed on the semiconductor chip Q4.

Moreover, the power module semiconductor device 1 may include a second upper surface plate electrode $22_4$ disposed on the source pillar electrode $20_1$, and connected to the anode electrode A4 of the second diode D1.

In this case the vertical direction with respect to the main surface of the insulating substrate 10 is equal to the vertical direction with respect to the main surface of the resin layer 12.

Moreover, the signal terminals S1, G1, T1 and the signal terminals S4, G4, T4 may be respectively linearly disposed on the main surface of the resin layer 12, as shown in FIG. 72.

Moreover, as shown in FIG. 75, the power module semiconductor device 2 according to the fourth embodiment includes electrode patterns CSP4, GSP4, SSP4 disposed so as to be adjacent to the semiconductor chip Q on the insulating substrate 10, and the signal terminals S4, G4, T4 may be connected to the electrode patterns CSP4, GSP4, SSP4 with soldering.

Similarly, as shown in FIG. 75, the power module semiconductor device 2 according to the fourth embodiment includes electrode patterns CSP1, GSP1, SSP1 disposed so as to be adjacent to the semiconductor chip Q1 on the insulating substrate 10, and the signal terminals S1, G1, T1 may be connected to the electrode patterns CSP1, GSP1, SSP1 with soldering.

Moreover, the power module semiconductor device 1 according to the fourth embodiment may include a positive side power input terminal P connected to the third pattern D(K1).

Figure 77:
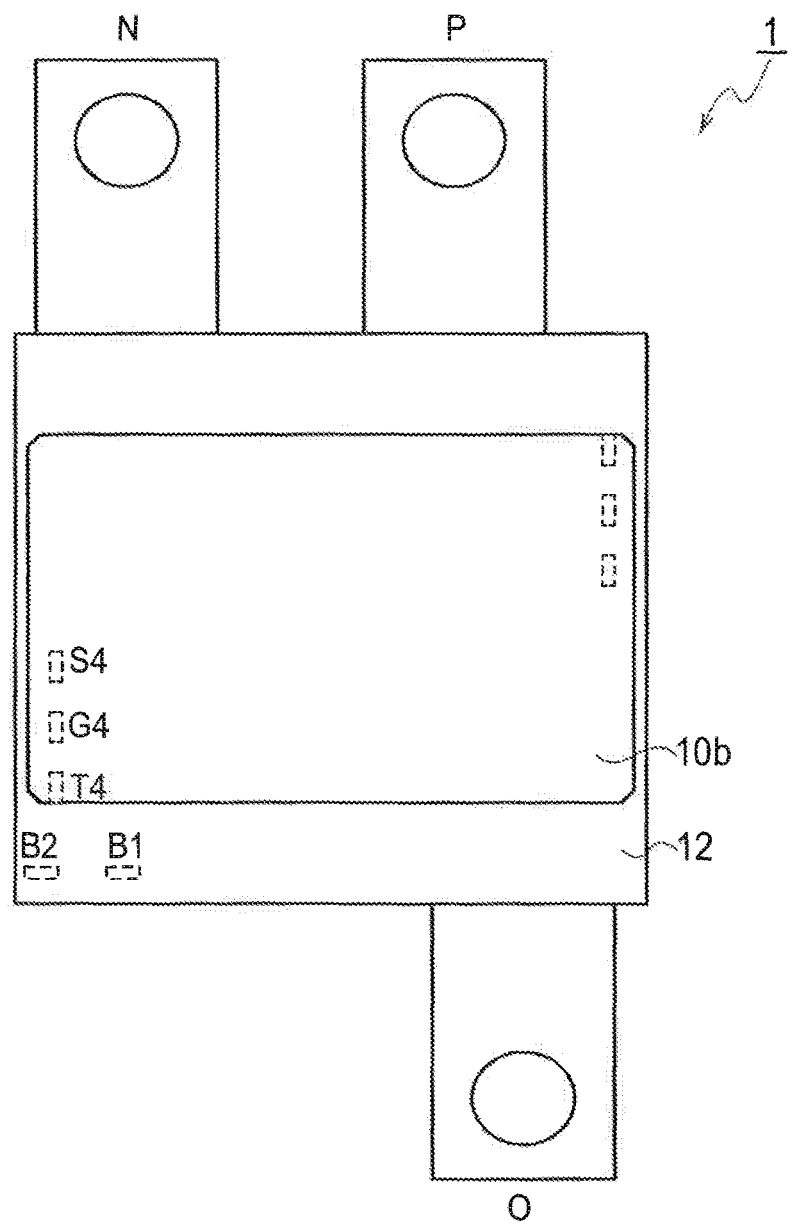
FIG. 77 is a schematic back side external configuration diagram showing the 2-in-1 module, which is the power module semiconductor device according to the fourth embodiment.

FIG. 77 illustrates a schematic back side external appearance configuration of a 2-in-1 module, which is the power module semiconductor device according to the fourth embodiment. The second copper plate layer 10b disposed on the back side surface of the ceramic substrate 10 functions as a heat spreader.

In the power module semiconductor device 1 according to the fourth embodiment, the semiconductor chips Q1, Q4 are formed of SiC MOSFET, for example, and the diodes D1, 4 are formed of SiC SBD, for example. Moreover, a thermistor is connected to between the thermistor connecting terminals B1, B2 disposed in a vertical direction with respect to the ceramic substrate 10, and is used for thermal sensing of the power module semiconductor device 1 according to the fourth embodiment.

A plurality of chips of the semiconductor chips Q1, Q4 are disposed on the surface of the ceramic substrate 10 at a position apart from one another in planar view observed from a thickness direction of the ceramic substrate 10, and are resin-molded with the resin layer 12.

Moreover, the pillar connection electrodes $18_o$, $18_n$ may be formed of electrode materials of which the value of CTE is relatively smaller, e.g. CuMo, Cu, etc.

The upper surface plate electrodes $22_1$, $22_4$ portions may be formed of electrode materials of which the value of CTE is relatively smaller, e.g. CuMo, Cu, etc.

The source pillar electrodes $20_1$, $20_4$ portions may be formed of electrode materials of which the value of CTE is relatively smaller, e.g. CuMo, Cu, etc.

Herein, a separation distance along the surface between the upper surface plate electrodes $22_1$, $22_4$ is called a creepage distance. A value of the creepage distance thereof is approximately 6 mm, for example.

Figure 78:
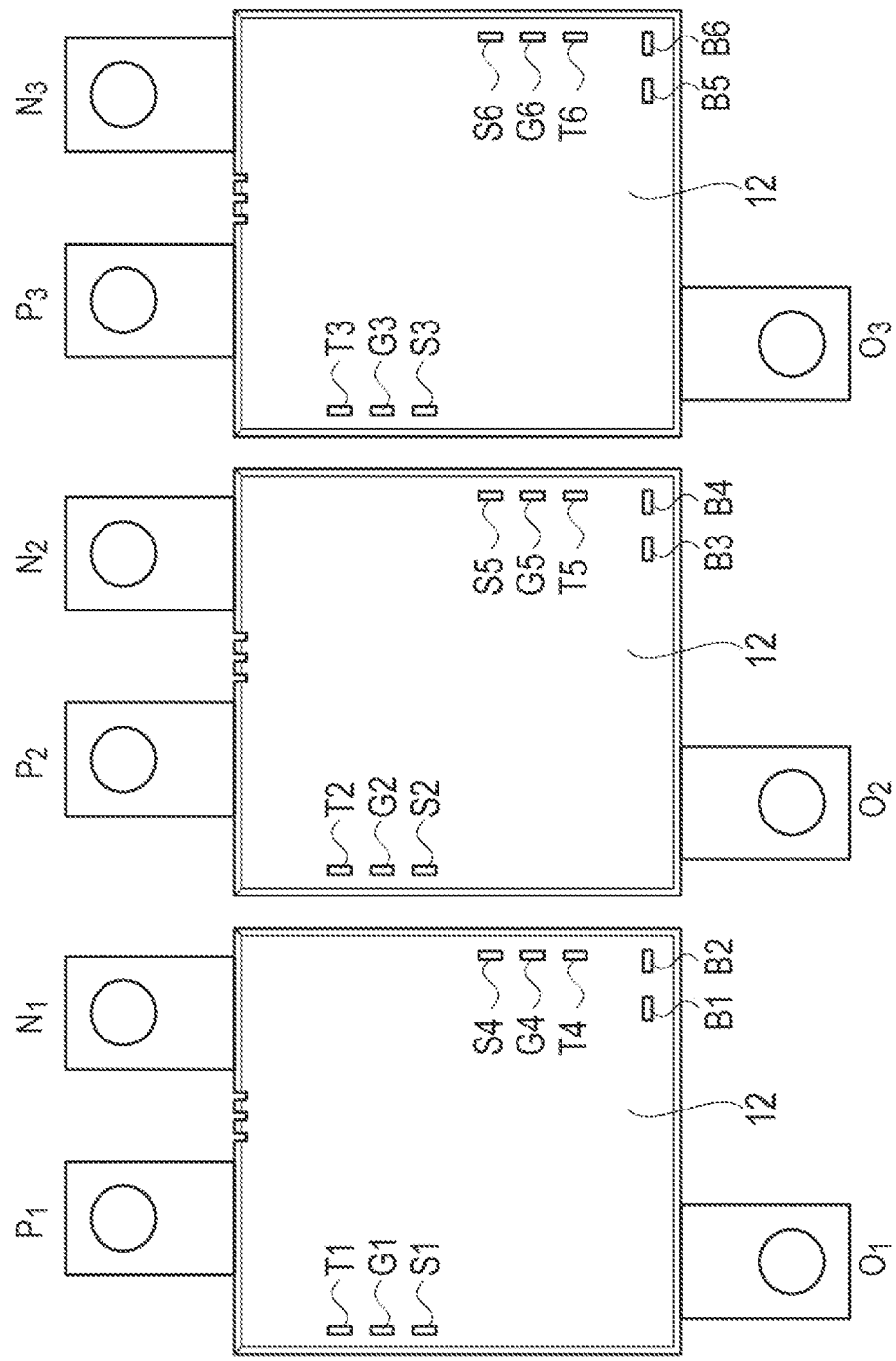
FIG. 78 is a schematic plane configuration diagram of the three pieces of the power module semiconductor devices according to the fourth embodiment disposed in parallel in order to drive a three-phase AC inverter.

FIG. 78 illustrates a schematic plane configuration of three pieces of the power module semiconductor devices according to the fourth embodiment disposed in parallel to one another in order to drive the three-phase AC inverter.

Figure 79:
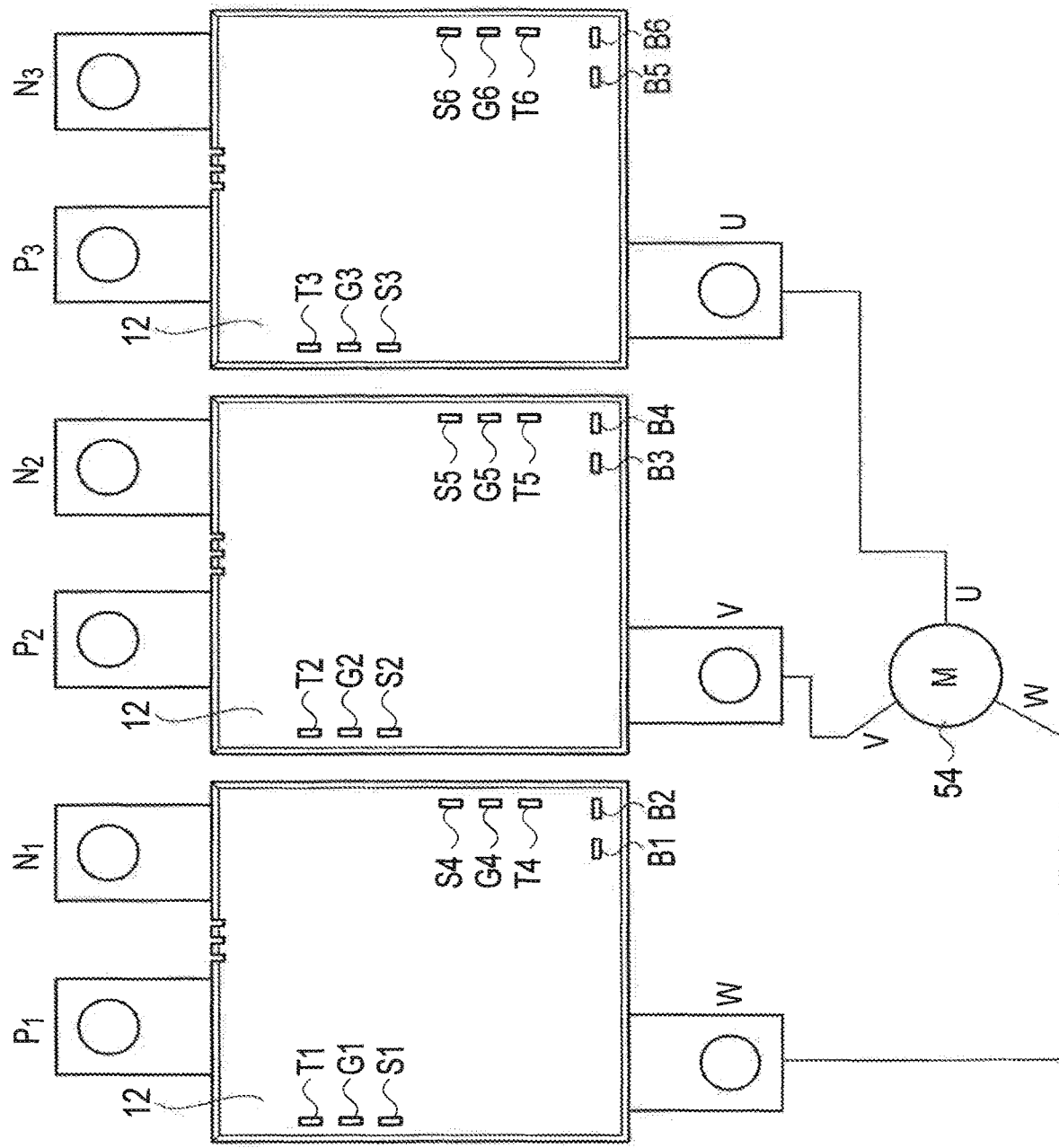
FIG. 79 is a schematic plane configuration diagram of the three pieces of the power module semiconductor devices according to the fourth embodiment disposed in parallel, which drives a three-phase AC inverter.

FIG. 79 illustrates a schematic plane configuration of three pieces of the power module semiconductor devices according to the fourth embodiment disposed in parallel to one another for driving the three-phase AC inverter.

In the power module semiconductor device 1 according to the fourth embodiment, the signal terminals (G1, S1, T1) and (G4, S4, T4) are disposed in the vertical direction with respect to the ceramic substrate, thereby reducing an occupied area in the case of disposing the power module semiconductor devices 1 in parallel to one another as shown in FIG. 78. Accordingly, reduction in size and weight of the whole device and can be achieved.

Since other configurations are the same as those of the power module semiconductor device 1 according to the first embodiment, the duplicated description is omitted. Moreover, since the fabrication method of the power module semiconductor device according to the fourth embodiment and the metallic mold are the same as those of the first embodiment, the duplicated description is omitted.

According to the fourth embodiment, there can be provided the power module semiconductor device and the inverter equipment, in which the whole inverter equipment can be efficiently composed by disposing the signal terminals in the substantially vertical direction from the mold body, and the parasitic component can also be reduced since the wirings in the module can also be output by the shortest distance.

According to the fourth embodiment, there can be provided the power module semiconductor device having a vertical terminal transfermold in which structure thereof is simple and the number of parts is reduced, thereby achieving space saving of the 1-in-1 thin type SiC power module, since no socket is used.

Although the 1-in-1 module and the 2-in-1 module have been explained, as the module semiconductor devices according to the embodiments, it can also form in a Fourin-One (4-in-1) configuration, a Six-in-One (6-in-1) configuration, etc. Furthermore, module configurations of combination with a DC-DC converter can also be realized.

In the module semiconductor devices according to the embodiments, although to mount the examples of SBD or SiC MOSFETs have been mainly explained as the semiconductor elements, it may not be limited to such examples, but may adopt other power semiconductor devices. For example, power devices of any one of Si based IGBT, GaN based HEMT or AlN based power device can be applied thereto.

In the module semiconductor devices according to the embodiments, there may be adopted a structure of mounting singular or a plurality of semiconductor elements on one metallic block. Moreover, a plurality of SBDs, MOSFETs, etc. may be mounted on one metallic block. In this case, the metallic block units may mutually form side surface bonding by using metallic bonding with metallic particles or solid phase diffusion bonding. Moreover, also input output terminals portion can be formed by using the metallic bonding with metallic particles or the solid phase diffusion bonding.

In addition, in the module semiconductor devices according to the embodiments, the whole module semiconductor devices are eventually sealed with a resin, e.g. a transfermold resin, etc.

As mentioned above, according to the embodiments, there can be provided the low series inductance inverter system with the power module semiconductor device having the straight wiring structure and the 1-in-1 TPM.

According to the embodiments, there can be provided the power module semiconductor device having a vertical terminal transfermold, thereby achieving space saving, the fabrication method of such a power module semiconductor device, and the metallic mold thereof.

Other Embodiments

While the present invention is described in accordance with the aforementioned embodiments, it should be understood that the description and drawings that configure part of this disclosure are not intended to limit the embodiments. This disclosure makes clear a variety of alternative embodiments, working examples, and operational techniques for those skilled in the art.

Such being the case, the embodiments cover a variety of embodiments, whether described or not.

INDUSTRIAL APPLICABILITY

The power module semiconductor device and the inverter system according to the embodiments is applicable to an overall power device, e.g. an SiC power semiconductor module, an intelligent power module, etc., and is applicable to wide applicable fields, in particular fields for which reduction in size and weight is required, e.g. an inverter, a converter, etc. used for in-vehicle and solar cells, industrial equipment, household equipment, etc.

What is claimed is:

1. A power module semiconductor device comprising:
an insulating substrate having a first side, a second side adjacent to the first side, a third side opposite to the first side, and a fourth side opposite to the second side;
a first pattern disposed on a front surface of the insulating substrate;
first semiconductor chips disposed on the first pattern;
a negative side power input terminal electrically connected to the first semiconductor chips, the negative side power input terminal being disposed on the first side of the insulating substrate;
a first signal terminal electrically connected to the first semiconductor chips;
a second pattern disposed on the front surface of the insulating substrate;
second semiconductor chips disposed on the second pattern;
a positive side power input terminal electrically connected to the second semiconductor chips, the positive side power input terminal being disposed on the first side of the insulating substrate;
a second signal terminal electrically connected to the second semiconductor chips;
an output terminal electrically connected to the first semiconductor chips and the second semiconductor chips, the output terminal being arranged on the third side of the insulating substrate;
a third pattern disposed on a back surface of the insulating substrate; and
a resin layer having a main surface and a side surface and covering the first semiconductor chips, the second semiconductor chips, a part of the negative side power input terminal, a part of the positive side power input terminal, a part of the output terminal and the insulating substrate, wherein
the negative side power input terminal and the positive side power input terminal are disposed so as to be extended along in a parallel direction with the main surface of the resin layer,
the output terminal is disposed so as to be extended along in the parallel direction,
the third pattern is exposed from the resin layer, and
the third pattern is smaller than the insulating substrate as viewed in a thickness direction of the insulating substrate and is disposed inside a perimeter of the insulating substrate as viewed in a direction perpendicular to the thickness direction of the insulating substrate.

2. The power module semiconductor device according to claim 1, the side surface of the resin layer has a recessed part between the negative side power input terminal and the positive side power input terminal in planar view observed from the thickness direction.

3. The power module semiconductor device according to claim 1, wherein the first signal terminal and the second signal terminal are disposed so as to be extended in a vertical direction perpendicular to the front surface of the insulating substrate.

4. The power module semiconductor device according to claim 3, further comprising:
a first signal electrode pattern disposed on the front surface of the insulating substrate, the first semiconductor chips being electrically connected to the first signal electrode pattern; and
a second signal electrode pattern disposed on the front surface of the insulating substrate, the second semiconductor chips being electrically connected to the second signal electrode pattern, wherein
the first signal terminal is connected to the first signal electrode pattern, and
the second signal terminal is connected to the second signal electrode pattern.

5. The power module semiconductor device according to claim 3, wherein the first signal terminal and the second signal terminal are disposed so as to be extended along the parallel direction and bent in the vertical direction.

6. The power module semiconductor device according to claim 3, wherein
the first semiconductor chips are electrically connected to one another in parallel,
the second semiconductor chips are electrically connected to one another in parallel, and
the first semiconductor chips and the second semiconductor chips are SiC-MOSFETs.

7. The power module semiconductor device according to claim 3, further comprising:
thermistor connecting terminals located on the insulating substrate; and
a thermistor connected between the thermistor connecting terminals,
wherein the thermistor connecting terminals are disposed so as to be extended in the vertical direction.

8. The power module semiconductor device according to claim 1, wherein
the first pattern and the first semiconductor chips are bonded by a first soldering layer, and
the second pattern and the second semiconductor chips are bonded by a second soldering layer.

9. The power module semiconductor device according to claim 1, wherein
the first pattern and the first semiconductor chips are bonded by an annealing paste material containing conductive particles, and
the second pattern and the second semiconductor chips are bonded by an annealing paste material containing conductive particles.

10. The power module semiconductor device according to claim 9, wherein the conductive particles are metallic fine particles which are silver particles, gold particles, nickel particles, or copper particles.

11. A plane configuration of power module semiconductor devices for a three-phase AC inverter, comprising:
a first power module semiconductor device;
a second power module semiconductor device; and
a third power module semiconductor device, wherein
the first power module semiconductor device, the second power module semiconductor device and the third power module semiconductor device have a same configuration according to claim 1;
the side surface of the resin layer in each of the power module semiconductor devices includes a first side surface, a second side surface, a third side surface and a fourth side surface that correspond to the first side, the second side, the third side, and the fourth side of the insulating substrate of each of the power module semiconductor devices, respectively, and
the first power module semiconductor device, the second power module semiconductor device and the third power module semiconductor device are arranged such that the second side surface of the first power module semiconductor device faces the fourth side surface of the second power module semiconductor device and the second side surface of the second power module semiconductor device faces the fourth side surface of the third power module semiconductor device.

12. The plane configuration of power module semiconductor devices for a three-phase AC inverter according to claim 11, the side surface of the resin layer has a recessed part between the negative side power input terminal and the positive side power input terminal in planar view observed from thickness direction.

13. The plane configuration of power module semiconductor devices for a three-phase AC inverter according to claim 11, wherein the first signal terminal and the second signal terminal are disposed so as to be extended in a vertical direction perpendicular to the front surface of the insulating substrate.

14. The plane configuration of power module semiconductor devices for a three-phase AC inverter according to claim 11, further comprising:
a first signal electrode pattern disposed on the front surface of the insulating substrate, the first semiconductor chips being electrically connected to the first signal electrode pattern; and
a second signal electrode pattern disposed on the front surface of the insulating substrate, the second semiconductor chips being electrically connected to the second signal electrode pattern, wherein
the first signal terminal is connected to the first signal electrode pattern, and
the second signal terminal is connected to the second signal electrode pattern.

15. The plane configuration of power module semiconductor devices for a three-phase AC inverter according to claim 11, wherein the first signal terminal and the second signal terminal are disposed so as to be extended along the parallel direction and bent in the vertical direction.

16. The plane configuration of power module semiconductor devices for a three-phase AC inverter according to claim 11, wherein
the first semiconductor chips are electrically connected to one another in parallel,
the second semiconductor chips are electrically connected to one another in parallel, and
the first semiconductor chips and the second semiconductor chips are SiC-MOSFETs.

17. The plane configuration of power module semiconductor devices for a three-phase AC inverter according to claim 11, further comprising:
thermistor connecting terminals located on the insulating substrate; and
a thermistor connected between the thermistor connecting terminals,
wherein the thermistor connecting terminals are disposed so as to be extended in the vertical direction.

18. The plane configuration of power module semiconductor devices for a three-phase AC inverter according to claim 11, wherein
the first pattern and the first semiconductor chips are bonded by a first soldering layer, and
the second pattern and the second semiconductor chips are bonded by a second soldering layer.

19. The plane configuration of power module semiconductor devices for a three-phase AC inverter according to claim 11, wherein
the first pattern and the first semiconductor chips are bonded by an annealing paste material containing conductive particles, and
the second pattern and the second semiconductor chips are bonded by an annealing paste material containing conductive particles.

20. The plane configuration of power module semiconductor devices for a three-phase AC inverter according to claim 19, wherein the conductive particles are metallic fine particles which are silver particles, gold particles, nickel particles, or copper particles.

* * * * *